USO05517155A

United States Patent [19]
Yamauchi et al.

[11] Patent Number: 5,517,155
[45] Date of Patent: May 14, 1996

[54] PHASE LOCKED LOOP HAVING DIGITALLY CONTROLLED OSCILLATOR AND PULSE SIGNAL GENERATOR

[75] Inventors: Shigenori Yamauchi, Kariya; Takamoto Watanabe, Nagoya, both of Japan

[73] Assignee: Nippondenso Co., Ltd., Kariya, Japan

[21] Appl. No.: 389,228

[22] Filed: Feb. 15, 1995

[30] Foreign Application Priority Data

Feb. 16, 1994 [JP] Japan .................................. 6-019466
Sep. 21, 1994 [JP] Japan .................................. 6-226798

[51] Int. Cl.$^6$ ......................... H03L 7/085; H03L 7/099; H03L 7/18
[52] U.S. Cl. ............................. 331/1 A; 331/25; 331/57; 327/107; 327/159
[58] Field of Search .................... 331/1 A, 57, 14, 331/16, 17, 18, 25; 327/105, 142, 159, 107

[56] References Cited

U.S. PATENT DOCUMENTS 5,331,294  7/1994  Watanabe et al. .................... 331/57

FOREIGN PATENT DOCUMENTS 4113719  4/1992  Japan .

OTHER PUBLICATIONS

*Integrated Circuits and Devices* 1991 #98–108 vol. 91 No. 216, Sep. 20, 1991 "6.25% Pull–In Range Fully Integrated Digital PLL For ISDN Primary Rate Interface"; Kondo, H. et al; pp. 39–45.

*Primary Examiner*—David Mis
*Attorney, Agent, or Firm*—Cushman, Darby & Cushman

[57] ABSTRACT

A digitally-controlled phase-locked loop oscillating circuit includes a signal period detector which detects the period of an input signal. A control data generator generates control data based on this period. The control data is used to drive a variable frequency oscillator which generates an output pulse synchronized with the input pulse. This output pulse is generated by alternately driving a digitally-controlled oscillator with either the most significant bits of the control data, or an increment of the most significant bits of the control data responsive to the least significant bits of the control data. A period divider divides the period of the output pulse and applies it to a phase comparator, which compares its phase with that of the input signal. The control data generator generates the control data responsive to the phase comparison result.

11 Claims, 24 Drawing Sheets

FIG. 4 PRIOR ART
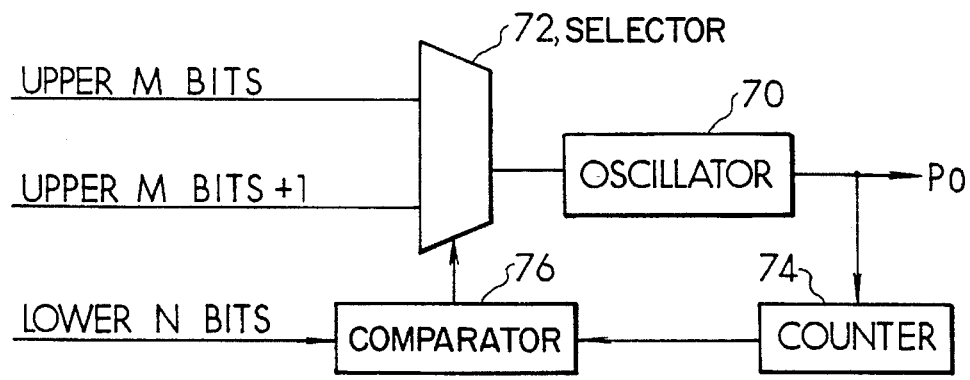
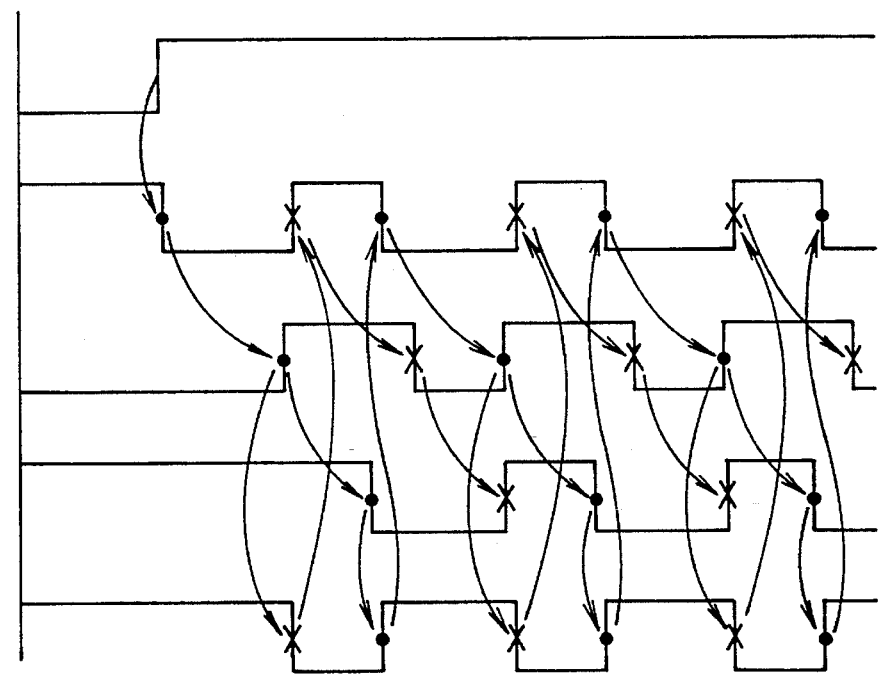
FIG. 8A PA
FIG. 8B P01
FIG. 8C P18
FIG. 8D P31
FIG. 8E P32

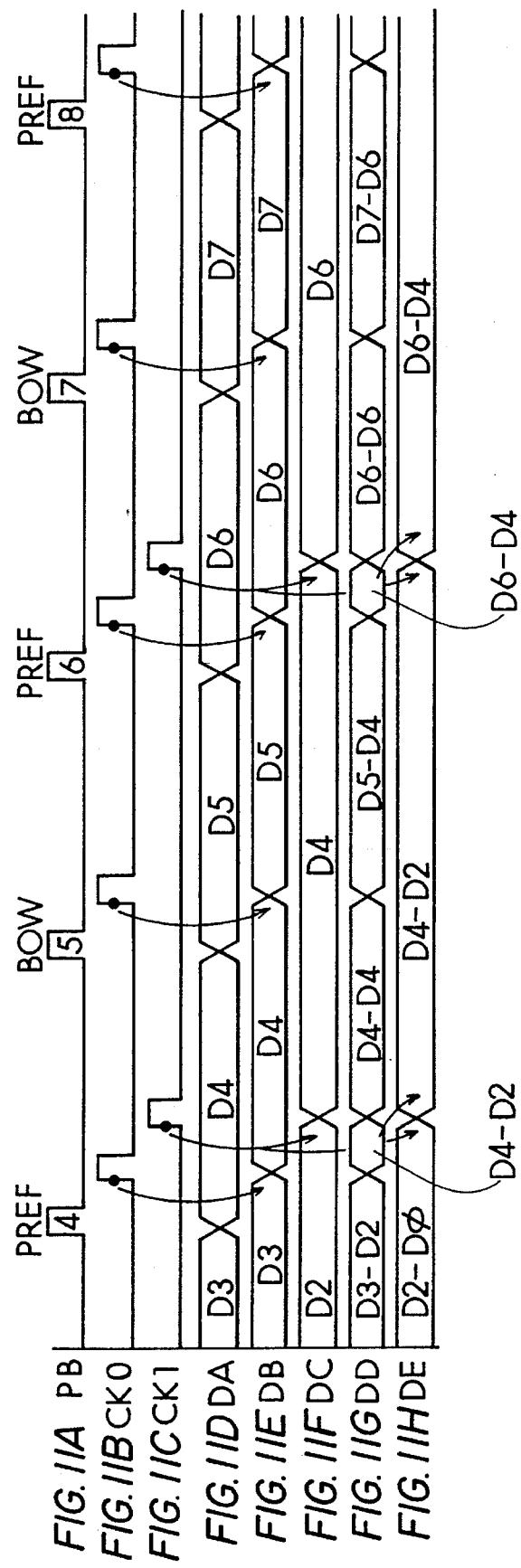

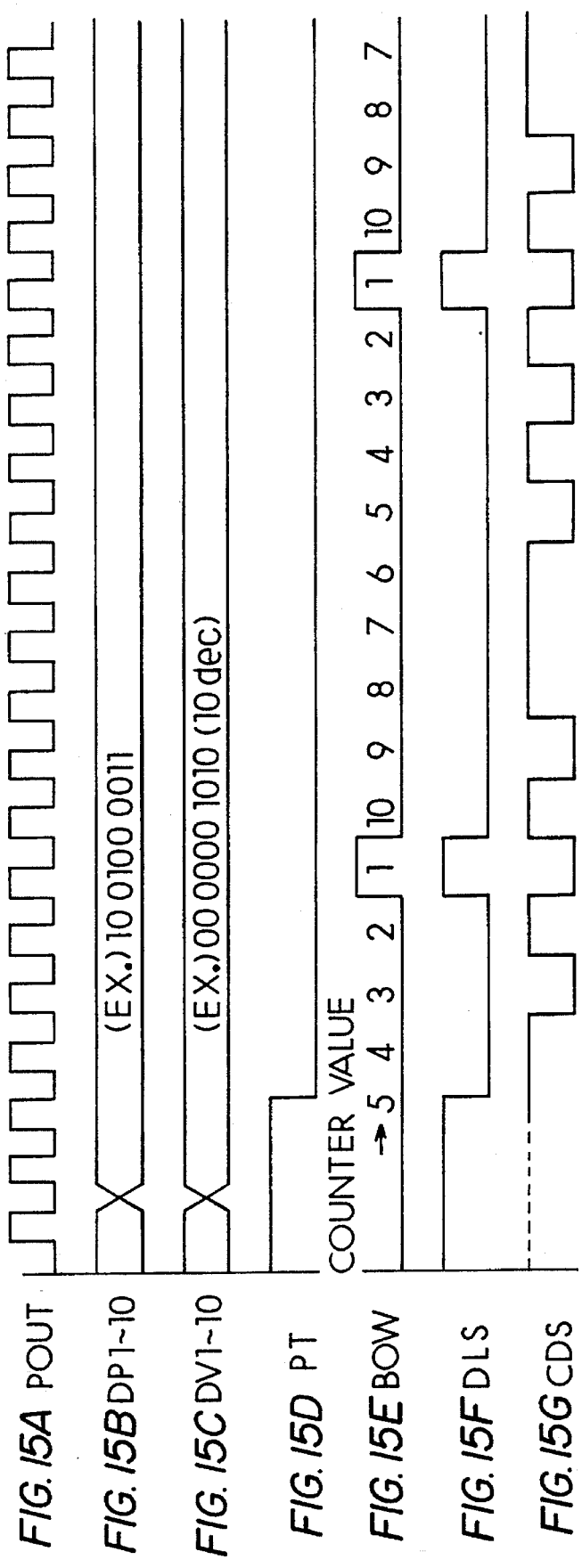

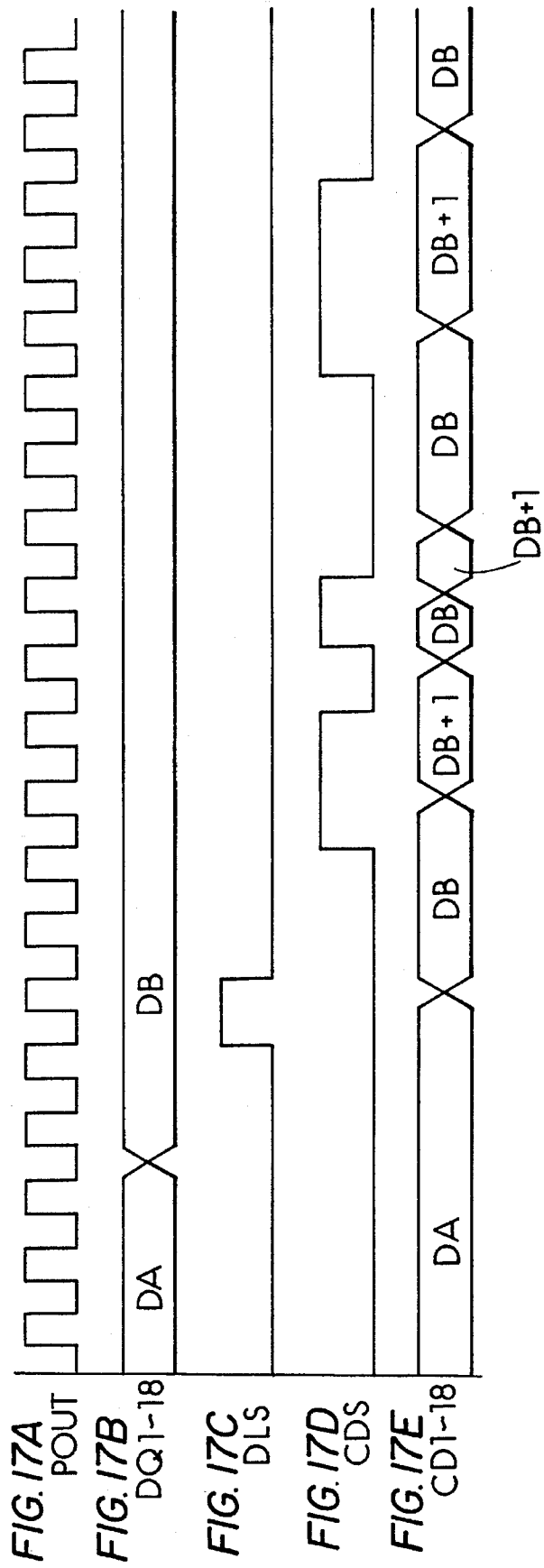

PHASE LOCKED LOOP HAVING DIGITALLY CONTROLLED OSCILLATOR AND PULSE SIGNAL GENERATOR

CROSS REFERENCE TO RELATED APPLICATION

This application is based upon and claims priorities from the Japanese patent applications No. 6-19466 filed Feb. 16, 1994 and No. 6-226798 filed Sep. 21, 1994, the contents of which are incorporated herein by reference.

BACKGROUND OF THE INVENTION

1. Field of the Invention

The present invention relates to a digital control method PLL (Phase Locked Loop) for generating an output signal in phase synchronization with an externally inputted reference signal and pulse generating apparatus suitable for use in the implementation of this PLL method.

2. Description of the Related Art

Conventional, well known PLL apparatus employing digital control are, for example, equipped with an oscillating circuit whereby a reference clock is counted and a pulse signal is outputted when this count value reaches a value corresponding to that for externally inputted binary digital data. An oscillating signal which is phase synchronized with the reference signal is then outputted from this oscillating circuit.

With this kind of PLL apparatus, the period for the reference signal is coded so that phase synchronization can be achieved between the output signal from the oscillating circuit and the reference signal. The oscillating signal can then be generated at the same period as the reference signal directly after activation of the oscillating circuit by storing this value in the oscillating circuit. After this, the phase difference between the output signal and the reference signal is detected and the digital data inputted to the oscillating circuit is controlled so that this phase difference becomes a predetermined value (for example, zero).

In another kind of PLL apparatus which is also well known, the oscillating signal from the oscillating circuit has a period divided by 1/n by a period divider so that an oscillating signal which has a period which is 1/n of the reference signal period Ti may be outputted from the oscillator. The phase difference between this period-divided signal and the reference signal is then detected by a phase comparator and the binary digital data inputted to the oscillating circuit is then generated so that this phase difference becomes zero.

However, with PLL apparatus in which a reference signal from an oscillating circuit is period divided to generate a signal, if there is an error with regards to the period To of the oscillating signal from the oscillating circuit, this error is made n-times larger by the period divider. It is therefore necessary to keep the error for the period To of the oscillating signal down to at least less than To/n, so that the stage is not reached where phase comparisons cannot be carried out due to the phase differences being too large. In order to achieve this, it is necessary for the time resolution Td for the circuit to be less than To/n.

In order to increase the time resolution of the circuit, i.e. keep the errors in the reference signal low, the frequency of the reference clock inputted to the oscillating circuit has to be raised or it is necessary to employ high-speed digital circuits in the internal circuitry. However, the structure of the oscillating circuit becomes more complicated as the time resolution Td is raised and the equipment also becomes more expensive.

Also, in the prior art it has only been possible to input reference clocks of about a few hundred MHz at most into the oscillating circuit due to the fact that fixed oscillators have been used to generate the reference clocks inputted to the oscillating circuits. This means that it has only been possible to set up time resolutions which have been of about a few nanoseconds at the most as the time resolution Td for the oscillating circuits, with the raising of this time resolution proving to be a limiting factor. This means that controllable output frequency for this kind of conventional digital type PLL apparatus is restricted to a maximum of about 10 MHz.

However, with this kind of PLL apparatus, even if the time resolution Td for the oscillating circuit is larger than To/n, it is still necessary to synchronize the oscillating signal with the reference signal. In order to achieve this, as shown in FIG. 4, a selector 72 which selects one of either the upper M-bit data exclusive of the lower N-bit data of binary digital data generated in response to the phase difference between an oscillating signal and a reference signal or data which expresses the value for the upper M-bit data with "1" added on and inputs this data to an oscillating circuit 70, a counter 74 which counts the oscillating signal outputted from the oscillating circuit 70 and a comparator 76 which compares the count value for the counter 74 and the lower N-bits of the binary digital data and then outputs a select signal to the selector 72 in response to this result are set up. In this way, the average period Toa of the oscillating signal within one period of the reference signal is made to be 1/n of the period Ti of the reference signal. In this way, the phase of the period divided signal and the reference signal are made to coincide (Japanese Patent Laid-open Publication Hei. 4-13719).

For example, in the case where the period which is the period Ti for the reference signal by 1/n, i.e., the period Ti/n is divided by the time resolution Td of the oscillating circuit 70 to become the value Ti/(n×Td), hereinafter denoted as Ti/(n. Td), so that this is then expressed in binary as [1100.101], the upper four bits which fall before the radix point [1100] and this value with one added on [1101] are inputted to the selector 72. The lower three bits which fall after the radix point [101] are then inputted to the comparator 76. In this way, as shown in FIG. 5(b), the data [1101] is inputted to the oscillating circuit for five times until the lower three bits of the count value for the oscillating signal outputted from the counter 74 reaches [101]. The data [1100] is then inputted to the oscillating circuit 70 for three times from the lower three-bit count value reaching [101] until it returns to [000]. In this way, the average value for the eight oscillating signal periods outputted from the oscillating circuit 70 within one period of the reference signal is made to be [1100.101]. Errors in the period divided signal period divided down from the oscillating signal are therefore reduced and the phases of the period divided signal and the reference signal are made to coincide.

However, in the case where the selector 72 is changed over by the counter 74 and the comparator 76, as shown in FIG. 5(b), the portion for the initial number of times corresponding to the lower N-bits of the binary digital data is longer than the period Ti of the reference signal multiplied by 1/n i.e. longer than Ti/n. After this, the oscillating signal is outputted at a period which is shorter than the period Ti/n. This means that there are a large number of errors at the times other than when the periods for n oscillating signals coincide with one period of the reference signal.

Accordingly, for example, this kind of PLL apparatus is used in digital communications to generate a clock signal multiplied from an externally inputted low frequency clock signal. If this clock signal is the used as a timing signal for latching communications data, it will not be possible to latch the communications data correctly.

However, rather than changing over the selector by making the counter value from the counter 74 consecutively larger or smaller than a value expressing the lower N-bits of the binary digital data, as shown in FIG. 5(a), the percentage of the time for which the selector 72 is changed over to a particular position within one period of the reference signal can be made to correspond to the lower N-bit data so that the selector 72 is frequently changed over.

Also, if a pulse generating apparatus capable of generating a pulse signal for changing over the selector 72 at a frequency corresponding to the lower N-bits of the binary digital data is used in place of the comparator 76, as shown in FIG. 5(a), the periods for the oscillating signal outputted within one period of the reference signal can be made to approach an ideal characteristic.

This kind of variable pulse generating apparatus where the pulse signal generating frequency corresponds to binary digital data is disclosed in the kind of changeover control area put forward in the prior art in papers by Mitsubishi Electric Co., Ltd., whereby an apparatus generates a signal in a pattern which corresponds to binary digital data in synchronization with an externally inputted clock signal.

However, with this pulse generating apparatus for the prior art, various circuits for use in pulse signal generation pattern control such as memory for storing pulse signal generation patterns corresponding to externally inputted binary digital data, read out circuitry for storing pulse signal generation patterns corresponding to binary digital data read out from this memory in read-out registers, etc. and pulse generating circuitry for generating pulse signals corresponding to the pattern data stored in registers, etc. in synchronization with externally inputted clock signals are required. Also, the number of items of pattern data and the capacity required to store one item of pattern data increases as the number of bits of binary digital data increase.

The pulse generating apparatus for the prior art such as the changeover control area disclosed in Japanese Patent Laid-Open Publication Hei. 4-113719 is appropriate when generating pulse signals with patterns corresponding to binary digital data of about three bits. However, if the number of bits in the binary digital data is large, the structure of the apparatus becomes complicated, the amount of memory for storing the generation patterns becomes large and the apparatus becomes inappropriate in practical terms.

SUMMARY OF THE INVENTION

It is an object of the present invention to resolve the above-described problems, rather than using a conventional kind of pulse generating apparatus.

It is another object of the present invention to provide a digitally controlled PLL apparatus capable of generating a high frequency output signal while the period of the output signal is being controlled with high precision.

It is a further object of the present invention to provide a pulse generating apparatus and oscillating apparatus suitable to be used in constructing the PLL apparatus.

With the pulse generator structured according to the present invention, the value for each bit of the binary digital data is inputted to one of each of the input terminals for N selectors which make up a selector row.

Also, a signal for the data value "0" is inputted to the other input terminal of the selector within the N selectors which receives the LSB of the binary digital data. The output signal from the selectors which receive the data value which is one bit lower in order is then inputted to the other input terminal of the (N-1) selectors excluding the aforementioned selector.

The select signal generator then outputs select signals periodically to each of the selectors within the N selectors which receive the upper bit data signals so that the selection period is shorter for data bits of a higher order.

As a result of this, in the pulse generator, the upper bit data value is selected with high efficiency by the selector row and this is then outputted as the pulse signal. The pulse signal generating frequency will therefore be increased for bits within the data value within the N-bit binary digital data which are set to 1 which are high order bits, i.e., values within the binary digital data which express large values. A pulse signal is then outputted at a frequency which corresponds to the binary digital data.

Also, the pulse generator is constructed from N selectors which correspond to the number of bits in the binary digital data and a select signal generator for outputting select signals to each of the selectors. However, the output period for the select signal for each of the selectors is made shorter by the select signal generator for the selectors which receive the higher order bits of data. In this way, it is no longer necessary to preset a generating pattern for the pulse signal corresponding to the binary digital data in the way that was necessary in the prior art and the structure of the apparatus can therefore be simplified accordingly.

As the pulse generating apparatus is therefore simple in structure, increases in the number of bits of binary digital data can be accommodated for simply by increasing the number of selectors which make up the selector row and the number of output bits for the select signal generator which outputs the select signals to each of the selectors. This means that there is no longer the increase in the complexity of the structure of the apparatus which occurs in the prior art when the number of bits in the binary digital data is increased and that the process of increasing the number of bits in the binary digital data is now simplified.

Also, the select signal generator is structured so that the output period for the select signal for the selectors which receive higher order bit data values is shorter. In this way, for example, a controller for controlling the output period of the select signal going to each of the selectors can be employed which uses the output signal from a signal generator such as an oscillator or a random number generator etc. This can, however, be achieved by using a structure where the output from the select signal generator is counted.

Namely, with the apparatus which counts the selector signal output, an N-bit counter corresponding to the N selectors which make up the selector row is used. The output terminals for the counter for the MSB down to the LSB are then connected sequentially to the select signal input terminal for the selector which receives the data value for the LSB down to the select signal input terminal for the selector which receives the data value for the MSB of data. In this way, the count values for the lower order bits which frequently change value due to the count operation of the counter are outputted to the selectors which receive the data values for the upper bits as select signals and the counter therefore functions as a select signal generator. In this way, the operation can be carried out in a more simplified manner as there is only one N-bit counter as the select signal generator.

Also, in the case where the counter is used in this way, a select signal which is inverted once for each count operation of the counter is outputted from the output terminal for the LSB of the counter. A select signal which inverts once for every two operations of the counter is then outputted from the output terminal for the second lower order bit and a select signal which inverts once for every four operations of the counter is then outputted from the output terminal for the third lower order bit. Therefore, when the data value of the bit received by each selector is "1" pulse signals are outputted from the selector row to correspond to these bits at a frequency from the MSB of one over two to the power of X, where X equals 1, 2, 3, . . . . In this way, according to the present invention, the pulse signal generation frequency coincides accurately with the value for each bit of data in the binary digital data.

Next, in the case of the frequency variable oscillator apparatus, a constant adder generates binary digital data, which is the value which expresses the upper M-bit binary digital data with the lower N-bits removed of the externally inputted L-bit binary digital data with "1" added. The data selector then selects one of either this binary digital data or the upper M-bit binary digital data within the L-bit binary digital data for outputting to the oscillator. The oscillator then outputs an oscillating signal with a period corresponding either to the value expressed by the upper M-bit binary digital data of the externally inputted L-bit binary digital data or this binary digital data with the value "1" added.

On the other hand, the lower N-bits of the externally inputted L-bit binary digital data are inputted to each of the selectors which make up the selector row within the pulse generating apparatus. Also, the pulse generating apparatus is equipped with a counter which acts as the select signal generator for outputting select signals to each of the selectors. However, the oscillating signal outputted from the oscillator is inputted to the counter as a count clock signal. It follows that a pulse signal is therefore outputted from the pulse generating apparatus in synchronization with the oscillating signal outputted from the oscillating circuit at a frequency corresponding to the lower N bits of the L-bit binary digital data. The pulse signal outputted from the pulse generating apparatus is then inputted to the data selector as a select signal.

Also, with the frequency variable oscillating apparatus, rather than having the counter 54 and the comparator 56 used in the oscillating apparatus for the prior art shown in FIG. 4, the above pulse generating apparatus is set up. The changing over of the selector 52 is then carried out frequently at a frequency corresponding to the lower N-bits of the L-bit binary digital data.

As a result of this, according to the frequency variable oscillating apparatus of the present invention, the time resolution of the oscillator is large and even in cases where the oscillating signal cannot be outputted at a period corresponding to the L-bit binary data, the average value for the period of the oscillating signal can be made to correspond to a period expressing the L-bit binary digital data and an oscillating signal can be generated which has a characteristic which is extremely close to the ideal characteristic.

Also, with the pulse apparatus, the changeover frequency of the data selection circuit can be made to correspond accurately to the lower N-bit data of the L-bit binary digital data. The structure of the frequency variable oscillating apparatus is simplified as a result of the structure of the pulse generating apparatus being more straightforward.

Next, a PLL apparatus is equipped with the frequency variable oscillating apparatus. A phase comparator then detects the phase difference between a period divided signal which is the oscillating signal outputted from the frequency variable oscillating apparatus divided into 1/n and the reference signal. The control data generator then generates L-bit binary digital data for making the phase difference detected by the phase comparator zero and outputs this data to the frequency variable oscillating apparatus. The result of this is that an oscillating signal is outputted from the frequency variable oscillating apparatus in synchronization with the reference signal and at a frequency which is n-times that of the reference signal.

Also, regarding the PLL apparatus, the counter within the pulse generating apparatus which makes up the frequency variable oscillating apparatus generates a borrow signal when the count value becomes zero. There is also a downcounter which can be preset with data expressing the multiplier n for the reference signal using the borrow signal and an externally inputted preset signal. The borrow signal outputted from this downcounter is then inputted to the phase comparator as the period divided signal.

Therefore, the apparatus structure can be simplified when compared with conventional PLL apparatus as it is no longer necessary to set up a discrete period divider to divide the period of the oscillating signal into 1/n in the way that was necessary for the PLL apparatus in the prior art. This is to say that, in the conventional PLL apparatus where an oscillating signal which has the frequency of the reference signal multiplied by n+, the oscillating signal outputted from the frequency variable oscillating apparatus has its period divided into 1/n times by a period divider, with the period divided signal and the reference signal then being inputted to a phase comparator. However, with the above PLL apparatus, as a borrow signal which is the oscillating signal with its period divided into 1/n parts is outputted from the downcounter of the pulse generating apparatus set up at the frequency variable oscillating apparatus. As mentioned above, a discrete period divider for dividing the period of the oscillating signal into 1/n is therefore not required and the structure of the apparatus can be simplified accordingly.

Also, the PLL apparatus uses the above frequency variable oscillating apparatus. This means that even if the time resolution for the oscillating circuit within the frequency variable oscillating apparatus is greater than the resolution achievable with 1/n times the period of the reference signal, the oscillating signal is in synchronization with the reference signal. Also, the average period of the oscillating signal during one period of the reference signal coincides with the period which is 1/n times that of the reference signal.

Also, errors for the period of the oscillating signal during one period of the reference signal do not cause large shifts from the ideal characteristic for 1/n times the period of the reference signal. For example, even if the PLL apparatus is used as clock generating apparatus for generating clock signals for latching communications data in the field of digital communications, large shifts do not occur in the communications data latch timing and the communications data can be accurately latched.

On the other hand, the PLL apparatus is equipped with a multi-phase clock generating source for generating a number of clock signals having a prescribed phase difference as a time reference. Then, a digitally controlled oscillator generates an oscillating signal of an oscillating frequency corresponding to externally inputted frequency control data in units of the time for the phase difference between the multi-phase clock signals outputted from the multi-phase clock generating source. This signal is then externally outputted as the output signal for after the PLL operation.

Also, a pulse phase difference coder codes the period of the reference signal and the phase difference between the reference signal and the output signal taking the time for the phase difference between the multi-phase clocks outputted from the multi-phase clock generating source as units. The data controller then generates frequency control data for phase synchronizing the reference signal and the output signal based on the period data for the coded reference signal and the data for the phase difference between the reference signal and the output signal and outputs this data to the digitally controlled oscillator.

Then, at the time of activation of the apparatus, the activation time controller has the period of the reference signal coded at the pulse phase difference coder via the operations of the pulse phase difference coder and then presets this coded period data to the digitally controlled oscillator. The oscillating operation of the digitally controlled oscillating circuit then starts at a time predetermined by the reference signal.

In the PLL apparatus, an oscillating signal which is phase synchronized with the reference signal is generated at the digitally controlled oscillator directly after activation. Phase synchronization between the reference signal and the output signal is then rapidly achieved after this as a result of this operation.

Namely, at the PLL apparatus, the pulse phase difference coder circuit codes the period of the reference signal directly after activation in units of the time for the phase difference between the multi-phase clocks. The digitally controlled oscillator then generates an oscillating signal at a frequency corresponding to the coded period data in units of the time corresponding to the phase difference between the multi-phase clocks used in the coding of the period data. As a result of this, the period of the oscillating signal outputted from the digitally controlled oscillator (i.e., the output signal from the aforementioned apparatus) coincides completely with the reference signal. On the other hand, the phase difference between the output signal directly after activation and the reference signal is decided by the timing of the start of the operation of the digitally controlled oscillator. However, the activation time controller starts the oscillating operation of the digitally controlled oscillator at a time predetermined by the reference signal. The phase difference between the output signal and the reference signal is also accurately set up by the operation of the activation time controller. Therefore, according to this PLL apparatus, an output signal can be generated which is phase synchronized with the reference signal directly after activation. Then, after activation, the data controller generates frequency control data which is phase synchronized with the reference signal and the output signal based on the reference signal period data and the data for the phase difference between the reference signal and the output signal and outputs this data to the digitally controlled oscillator. As a result of this, even if the phase difference between the output signal and the reference signal goes out by more than the desired value, this phase error can be rapidly compensated for and phase synchronization between the output signal and the reference signal can be quickly accomplished after activation of the apparatus.

Also, with this PLL apparatus, the pulse phase difference coder and the digitally controlled oscillator both operate on units of the time for the phase difference between the multi-phase clocks outputted from the multi-phase clock generating source. The time resolution for the period data for the reference signal obtained at the pulse phase difference coder and the data for the phase difference between the reference signal and the output signal, and the time resolution for the oscillating signal (i.e., the output signal from the aforementioned apparatus) generated at the digitally controlled oscillator therefore coincide completely. This time resolution is also extremely small when compared with that for the prior art digital method PLL apparatus. The period of the output signal for the aforementioned PLL apparatus can therefore be controlled extremely accurately and the upper limit for the output signal frequency can be made high.

In the prior art, an oscillating signal (clock signal) from a fixed oscillator was used in the digital control of the oscillating frequency of the oscillating apparatus and as the clock signal for coding the period of the reference signal and the phase difference between the reference signal and the output signal. This then served as an upper limit to the time resolution as this time resolution was decided by the oscillating frequency of the fixed oscillator. However, with the aforementioned PLL apparatus for this invention, the time resolution is decided by the time corresponding to the phase difference between the number of clock signals outputted from the multi-phase clock generating source and this time resolution can therefore easily be made high. The effect of this is that the period of the output signal can be controlled in a highly accurate manner and the frequency of the variable output signal can be made higher.

As for the multi-phase clock generating source, for example, a number of fixed oscillators (crystal oscillators) having the same oscillating frequency may be prepared. By then controlling the oscillation start timing for each of the oscillators, various clock signals with prescribed phase differences may be generated at each of the oscillators. Alternatively, a number of delay circuits may be prepared which delay and output an oscillating signal outputted from a single fixed oscillator (crystal oscillator, etc.). By then setting up the delay time for each of the respective delay circuits, clock signals having predetermined phase differences may be outputted from each of the delay circuits. However, a delay circuit where a large number of delay elements are successively linked together may be used and the output from each delay element may then be taken as a clock signal. As a further alternative, a pulse period dividing circuit where the delay element is comprised of inverting circuits linked together in a ring shape may be used. The outputs from each of the inverting circuits in this pulse period dividing circuit may then be taken as the clock signals so as to provide the clock signals in a more straightforward manner.

Next, in the PLL apparatus, a divisor is set up at the PLL apparatus and this divisor is then used to divide the frequency control data outputted by the data control means by externally inputted divider data, with the result then being inputted to the digitally controlled oscillator. A signal which is the output signal period divided by the divider data is then inputted to the pulse phase difference coder.

As a result of this, an output signal of a higher frequency can be outputted by dividing the reference signal when a comparison is made with the PLL apparatus disclosed in claim 5. Also, the frequency of the output signal is controlled by the digitally controlled oscillator to be in units of the time corresponding to the phase difference between the multi-phase clocks outputted from the multi-phase clock generating source. The errors in the phase difference between the output signal occurring as a result of frequency multiplication and the reference signal can therefore be made extremely small when compared with the apparatus in the prior art and the frequency precision of the output signal can be increased.

With the PLL apparatus, the frequency variable oscillating apparatus is used as the digitally controlled oscillator which comprises the PLL apparatus. The data from within the division results from the divisor means which expresses the value which is above the radix point is then inputted to the constant adder for the frequency variable oscillating apparatus and the data selector. The data expressing the value below the decimal point is then inputted respectively to each of the selectors in the selector row within the pulse generating apparatus which makes up the frequency variable oscillating apparatus.

The effect of this is that when the frequency control data is divided by the divider data at the divisor, in the case where the frequency control data is not clearly divided by the divider data, i.e. in cases where it is necessary to generate the output signal coming from the digitally controlled oscillator at frequencies which cannot be controlled to be units corresponding to the time for the phase difference between the multi-phase clock signals, "1" is added to the value for the divided result for above the radix point as a result of the operation of the pulse generating apparatus at a frequency corresponding to the value for the divided result which falls below (after) the radix point. Then, either the data which expresses the value for above the radix point or data which is this data with one added on is inputted as frequency control data to the oscillating circuit.

Therefore, according to the PLL apparatus, even in the case where an oscillating signal which is a frequency multiplied version of the reference signal cannot be generated to be outputted from the digitally controlled oscillator at a time resolution which takes as units the time for the phase difference between the multiphase clocks outputted from the multi-phase clock generating source, the average value for the period of the oscillating signal (i.e., the output signal) outputted from the digitally controlled oscillator can be made to correspond to the frequency multiplied frequency for the reference signal. Therefore, according to this PLL apparatus, errors in the phase between the output signal occurring as a result of the frequency multiplying of the reference signal and the reference signal can be completely resolved.

Also, the period of the output signal can be varied depending on whether or not the value "1" has been added to the frequency control data. However, as the extent of this variation can only be the time for the phase difference between the multi-phase clocks, this variation is extremely small. This period variation is also only generated at a frequency corresponding to the value for the division result which falls after the radix point.

Therefore, according to the PLL apparatus, more precise control of the output signal to be of the ideal characteristic can be achieved than where an output signal is generated by frequency multiplying a reference signal. This apparatus could therefore be used as a reference clock generating source in various communications apparatus without any problem.

Next, in the PLL apparatus, the multi-phase clock generating source is constructed from a number of delay elements linked together to form a delay circuit, with the clock signals then being outputted from prescribed connection points for the delay elements. A delay signal which is the input signal delayed only by a delay time decided by the number of delay elements which are linked together is then outputted. These delayed signals are then taken from prescribed connection points for the delay elements as clock signals. In this way, clock signals having prescribed phase differences can be sequentially outputted.

With the pulse phase difference coder for the aforementioned PLL apparatus, the digital data generator detects the delay signal most recently outputted from the delay circuit while the reference signal or output signal is being inputted and generates digital data which expresses the link position of the delay element which outputted the delay signal within the delay circuit. An arithmetic unit then calculates the deviation between the digital data generated the previous time by the digital data generating means and the most recent digital data. This calculation result is then outputted as digital data expressing the period of the reference signal or the phase difference between the reference signal and the output signal.

In the PLL apparatus, the pulse phase difference coder codes the output position of the delay signal occurring at the delay circuit while the reference signal or the output signal is being inputted. Period data for the period of the reference signal, coded period data for the phase difference between the reference signal and the output signal or phase difference data can then be generated by calculating the deviation between the current coded value and the previous coded value.

Therefore, at the pulse phase difference coder, if only the reference signal is inputted, the period of the reference signal can be coded as digital data taking the time for the phase difference between the multi-phase clocks outputted from the delay circuit as the time resolution. If the reference signal and the output signal are inputted, the phase difference for each of these signals can be coded as digital data taking the time for the phase difference between the multi-phase clocks outputted from the delay circuit as the time resolution.

Also, if the frequency control data outputted from the data controller is inputted at the digitally controlled oscillator for the PLL apparatus, the input data updater outputs prescribed input data to the signal selector. In doing so, the signal selector selects the delay signal outputted from the delay element for the link position corresponding to the inputted data from the delay signals sequentially outputted from the delay circuit. Once the signal selector selects the delay signal, the pulse signal outputter outputs a pulse signal which is to become the output signal to be outputted from the aforementioned PLL. Also, once this kind of signal selector selects a delay signal outputted from the delay circuit, the input data updater updates the input data being outputted to the signal selector by adding the frequency control data to it.

This has the effect that the signal selector selects the delay signal outputted from the delay circuit again after a period of time corresponding to the frequency control data has passed. The pulse signal outputter then generates the pulse signal again when the signal selector selects this delay signal.

That is to say, at the aforementioned PLL apparatus, the digitally controlled oscillator is of a construction which is such that the digitally controlled oscillator updates the input data used by the signal selector for selecting the delay signal while the signal selector is selecting the delay signal by adding the frequency control data to this input data. In this way, the pulse signal output period (i.e., oscillating frequency) is controlled so that the time for the phase difference between the multiphase clock signals outputted from the delay circuit is taken as the time resolution.

This has the effect that, according to this PLL apparatus, in the same way as for the PLL apparatus disclosed before, the time resolution for the digitally controlled oscillator and the pulse phase difference coder coincides with the time for the phase difference between the clock signals outputted from the delay circuit taken as the multi-phase clock generating source. The precision with which the output signal can be controlled is therefore increased.

Also, the multi-phase clock generating source is constructed from a delay circuit comprised of delay circuits linked together. By then, for example, taking clock signals from the link positions for all of the delay elements, the phase difference time (i.e., the time resolution) for each clock becomes the delay time of the delay elements. By then using gate elements such as the inverters and buffers etc. used in the prior art digital circuits as the delay elements, a time resolution of a few hundred picoseconds can be set up by the time for the phase difference between the multi-phase clocks. This means that even if the output signal is made high, its period can still be controlled with a high degree of accuracy.

Further, as delay elements linked together to form a delay circuit are used as the multi-phase clock generating source for this PLL apparatus, the structure of the multi-phase clock generating source can be simplified when compared with the cases where a number of fixed oscillators are used or a number of delay circuits with differing delay times are used to generate the multi-phase clock.

In the case where the delay circuits are simply linked together in order to make up the delay circuit, if the reference signal for delaying is inputted to the initial delay element, in going from the initial stage to the second stage, and from the second stage to the third stage, the reference signal for delaying is sequentially delayed as it is transported. By then taking a clock signal from the connection point for each delay element, clock signals are obtained which have phase differences equivalent to the delay time for each delay element.

However, at the pulse phase difference coder, the period of the reference signal, and the phase difference between the reference signal and the output signal is coded and a signal is outputted periodically from the digitally controlled oscillator. In order to do this, it is necessary to have clock signals of prescribed phase differences successively generated. Also, it is necessary to have a large amount of delay elements in order to take delay signals from each of the delay elements as clock signals and output these sequentially.

Therefore, when delay elements which are simply linked together to form a delay circuit are used, it is preferable to input an oscillating signal outputted from a fixed oscillator to the delay element. In this way, the output from each of the delay elements which make up the delay circuit will invert for every half-cycle of the oscillating signal from the fixed oscillator. The phase difference for a signal outputted from two delay elements linked together will then become the delay time for one delay element so that multi-phase clocks having prescribed phase differences can then be generated with comparatively few delay elements.

On the other hand, with the PLL apparatus, the delay circuit is a pulse rotating circuit which has a number of inverters linked together in a ring shape which then sequentially invert a pulse signal as this pulse signal is rotated around the pulse rotating circuit. Therefore, in the aforementioned PLL apparatus, if the pulse signal is made to rotate within the pulse rotating circuit both when the PLL apparatus is activated and when the pulse rotating circuit is made to operate, this pulse signal is periodically inverted at the connection point for each of the inverting circuits. Clock signals can then be obtained which have a phase shift equal to the time it takes an inverting circuit to invert. A delay circuit having a simplified construction is therefore possible.

Therefore, in the PLL apparatus, the delay circuit is made up from a pulse rotating circuit which is a number of inverting circuits linked together to form a ring-shape. The number of times that the pulse signal rotates within the pulse rotating circuit is therefore counted by a first counter at the pulse phase difference coder. This count value is then taken as the upper bit data of the digital data generated at the digital data generating means and outputted to the arithmetic unit.

Namely, in this PLL apparatus, the period of the reference signal and the phase difference between the reference signal and the output signal is coded and the number of times the pulse signal revolves around the pulse rotating circuit is counted. This value is then taken as the upper bit data for the digital data generated by the digital data generator and inputted to the arithmetic means. In this way, even if the period of the reference signal and the phase difference between the reference signal and the output signal is longer than the time it takes for the pulse signal to go around the pulse rotating circuit once, this phase difference can be coded in an un-problematic manner.

Also, in the PLL apparatus, a second counter counts the number of times the pulse signal rotates around the pulse rotating circuit at the digitally controlled oscillator. A detection signal indicating that this count value has reached the value for the upper bit data of the input data is then outputted. An input data updater then updates the input data outputted to the signal selector based on the lower bit data of the frequency control data. When this update value then reaches the value of the upper bit, one is added to the number for the number of rotations counted by the second counter. The pulse signal outputter then outputs the detection signal from the second count means and outputs a pulse signal when a delay signal is selected at the selection means. The count controller then restarts the count operation taking the count value from the second counter as an initial value when a detection signal is outputted from the second counter.

With this PLL apparatus, the multi-phase clock generating source is constructed from a pulse rotater and a second counter and count controller are set up within the digitally controlled oscillator. In this way, the output period (in other words, the frequency of the output signal) of the pulse signal can be controlled from the number of rotations of the pulse signal within the pulse rotater and the output position of the delay signal from the pulse rotater.

According to the PLL apparatus, as a result of using a pulse rotating circuit as the delay circuit, multi-phase clocks of a prescribed phase difference can be successively generated while constructing the pulse rotater with relatively few delay elements (i.e., inverting elements). Also, the number of times the pulse signal goes around the pulse rotater is counted at the pulse phase difference coder and the digitally controlled oscillator. The period of the reference signal and the phase difference between the reference signal and the output signal can therefore be coded taking the time (i.e., the time taken for an inverting element to perform an inverting operation) for the phase difference between the pulse signals outputted from the pulse rotater as multi-phase clocks as a unit and the period (i.e., the oscillating frequency) of the output signal outputted from the PLL apparatus can be controlled. The apparatus can therefore be constructed in a simpler manner while maintaining a precisely controlled output signal and can therefore be made to be more compact.

With the PLL apparatus, the data controller which makes up the PLL apparatus generates frequency control data for simply ensuring that the phase difference between the reference signal obtained at the pulse phase difference coder and the output signal is controlled to be half of the period of the reference signal.

This is because in the PLL apparatus, the pulse phase coder detects that the link position of the delay element within the delay circuit which has outputted the most recent delay signal has been coded from the reference signal and the input timing of the reference signal and output signal by the digital data generator. The phase difference between the reference signal and the output signal is then calculated from the deviation between the digital data which expresses the input timing of this coded reference signal and the digital data which expresses the input timing of the output signal. If the reference signal and the output signal are therefore inputted simultaneously, it is not possible to detect this phase difference and operation errors therefore occur.

In the case where the phase difference between the reference signal and the output signal is controlled to be zero, the phases of the reference signal and the output signal will therefore completely coincide as a result of the PLL operation. As it is then not possible for the pulse phase difference coder to detect a phase difference of zero, control cannot be achieved in a desirable manner. For this reason, the PLL apparatus controls the phase difference between the output signal and the reference signal to be ½ (i.e., $\pi$ radians) of the period of the reference signal.

BRIEF DESCRIPTION OF THE DRAWINGS

FIG. 4 is a block diagram showing an outline of the structure of a pulse generating apparatus for the prior art;

FIG. 8 is a timing diagram showing the operation of the ring oscillator in FIG. 7;

FIG. 11 is a timing diagram showing the operation of the pulse phase difference coder circuit in FIG. 9;

FIG. 15 is a timing diagram showing the operation of the data distributor circuit in FIG. 14;

FIG. 17 is a timing diagram showing the operation of the data latch circuit in FIG. 16;

DETAILED DESCRIPTION OF THE PREFERRED EMBODIMENTS (First Embodiment)

The following is a description, with reference to the diagrams, of the embodiments for the present invention.

Figure 2:
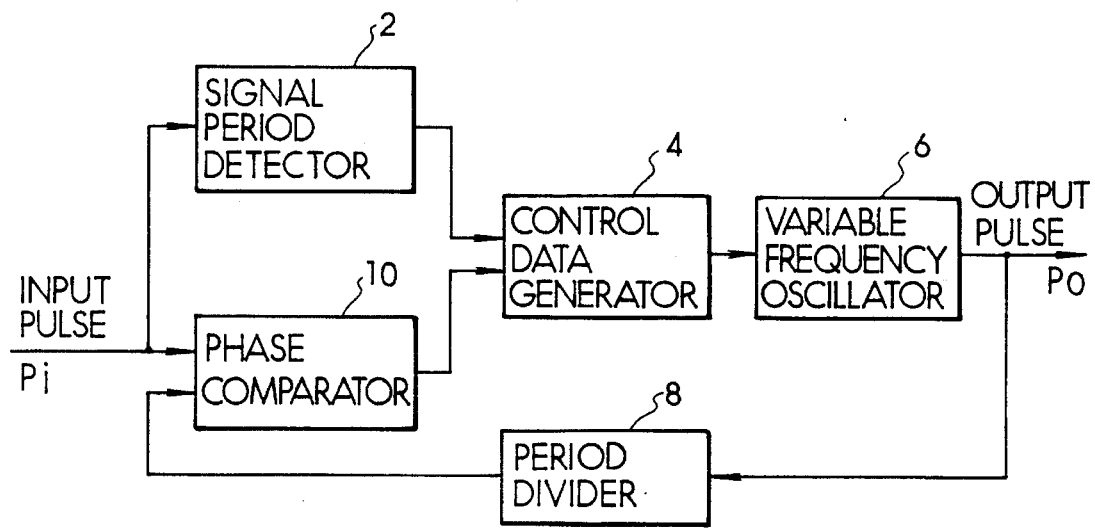
FIG. 2 is a block diagram showing the overall structure of the PLL apparatus in the first embodiment.

As becomes clear from FIG. 2, a PLL apparatus in this embodiment includes a signal period detector circuit 2, a control data generator circuit 4, a variable frequency oscillator apparatus 6, a period divider circuit 8 and a phase comparator circuit 10. The signal period detector circuit 2 detects the period of an input pulse Pi inputted externally at a prescribed period as a reference signal. The control data generator 4 generates control data (L bit binary digital data) for generating an output pulse Po at a period which is 1/n of the period for the input pulse Pi, based on the period of the input pulse Pi detected by the signal period detector circuit 2 and a phase difference inputted from the phase comparator circuit 10 to be described later. The variable frequency generator 6 generates an output pulse Po at a period corresponding to the control data outputted from the control data generator circuit 4. The period divider circuit 8 generates a period divided signal which is the output pulse Po from the variable frequency oscillator divided into 1/n. The phase comparator circuit 10 detects the phase difference between the period divided signal outputted from the period divider circuit 8 and the input pulse Pi and outputs this detection result (phase difference) to the control data generator circuit 4.

Figure 1:
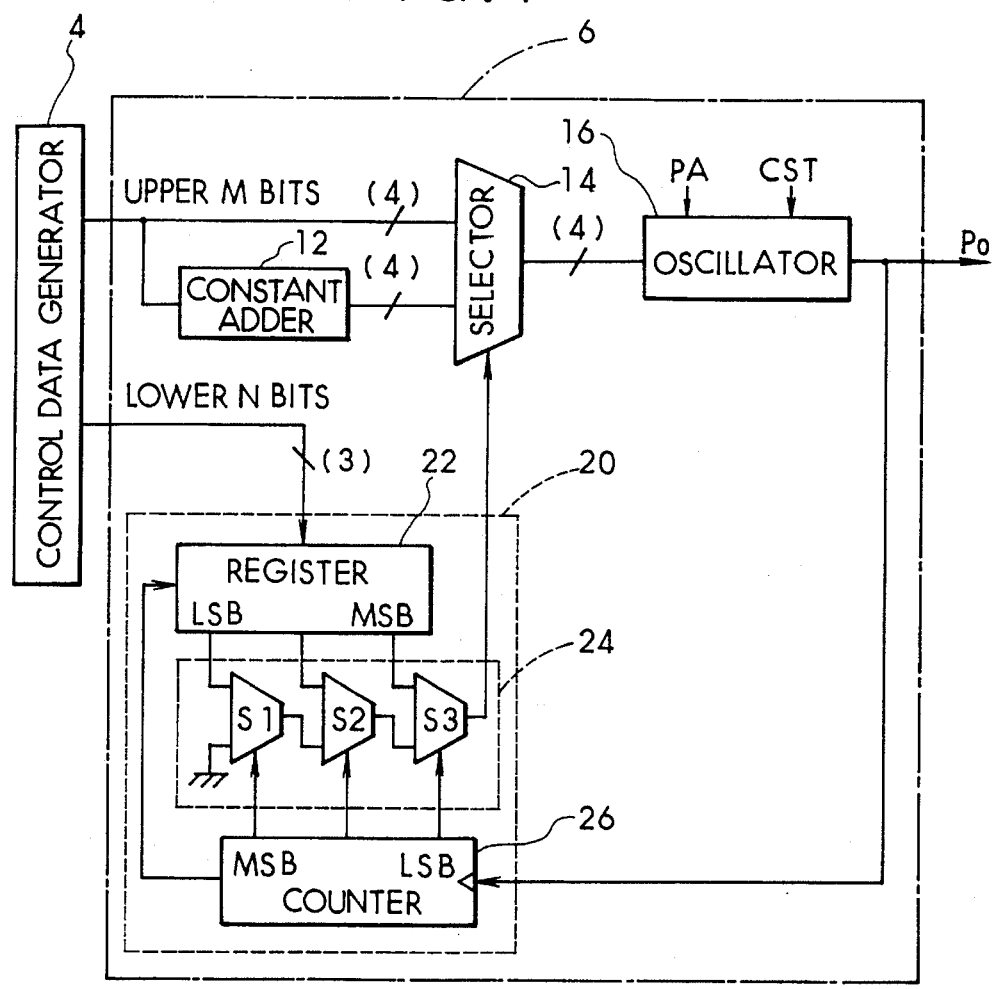
FIG. 1 is a block diagram showing the structure of a frequency variable oscillating apparatus set up at a PLL apparatus for the first embodiment.

The variable frequency oscillator apparatus 6, as shown in FIG. 1, is constructed from a constant adder 12, a selector 14, an oscillator circuit 16 and a pulse generator apparatus 20. The constant adder 12 receives the upper M bits (in this embodiment this is four bits) of binary digital data (hereinafter referred to as the upper M bit data) of the L bits (in this embodiment this is seven bits) of binary digital data outputted from the control data generator circuit 4 and then outputs binary digital data (hereinafter referred to as add data) which is a value describing the upper M bit data to which the constant 1 has been added. The selector 14 acts as the aforementioned data selection circuit which selects one of the upper M bit data outputted from the control data generator circuit 4 and the add data outputted from the constant adder 12. The oscillator circuit 16 generates an oscillating signal (namely, the output pulse Po) at a period corresponding to the M bit binary digital data (hereinafter referred to as the selection data) outputted from the selector 14. The pulse generator apparatus 20 receives the lower N bit (in this embodiment, this is three bits) binary digital data (hereinafter referred to as the lower N bit data) of the L bit binary digital data outputted from the control data generator circuit 4 and then outputs a selection signal to the selector 14 in synchronization with the output pulse Po at a frequency which corresponds with the lower N bit data.

When a select signal is being outputted from the pulse generator apparatus 20 (i.e., when the output from the pulse generator apparatus 20 is high), the selector 14 selects the adder data from the constant adder 12. When there is no select signal being outputted from the pulse generator apparatus 20 (i.e., when the output from the pulse generator is low), selection is such that the upper M bit data is inputted directly from the control data generator circuit 4.

The oscillator circuit 16 carries out a count operation using externally inputted signals PA and CST described later.

The M bit binary digital data outputted from the selector 14 is inputted to the oscillator circuit 16 and this binary digital data is then preset and a downcounting operation is performed to output externally the output pulse Po.

This is to say that the oscillator circuit 16 presets the data outputted from the selector 14. Downcounting is then carried out taking this data as a reference clock. The output pulse Po is then generated periodically with the time period being decided by the period for the data value and the reference clock outputted from the selector 14 at the time when the count value has become zero.

The pulse generator apparatus 20 is constructed from an N bit (in this embodiment, 3 bit) register 22 which latches the lower N bit data inputted from the control data generator circuit 4, a selector row 24 made up of N selectors (in this embodiment, 3) corresponding to the lower N bit data latched at the register 22 and an N bit counter (in this embodiment, 3 bit) 26 taken as the selection signal generating means for outputting a select signal to each of the selectors S1 to S3 in the selector row 24.

Each of the selectors S1 to S3 which make up the selector row 24 has two input terminals. One of the signals inputted at each input terminal is then selected in response to the select signal outputted from the counter 26.

In this way, the data value for the least significant bit (LSB) of the lower N bit data latched at the register 22 is inputted to one of the input terminals of the selector S1, the data value for the intermediate bit of the lower N bit data latched at the register 22 is inputted to one of the input terminals of the selector S2 and the data value for the most significant bit (MSB) of the lower N bit data latched at the register 22 is inputted to one of the input terminals of the selector S3.

The input terminal of the selector S1 other than the input terminal to which the data value for the least significant bit of the lower N bit data is inputted is grounded to have a data value which gives a level of zero. The other input terminals of the selectors S2 and S3 take the output signals from selectors which receive data values for a bit of an order which is one bit lower than the order of the bit that selector itself receives at its other input terminal as input. i.e., the selectors S2 and S3 take the output signals from the selectors S1 and S2 as input, without modification. The output signal from the selector S3 which receives the data value for the most significant bit of the lower N bit data is then taken as the select signal and outputted to the selector 14.

On the other hand, the output terminal from the three output terminals for the counter 26 which outputs the most significant bit of the count data is connected to the select signal input terminal of the selector S1 which receives the data value for the least significant bit of the data for the lower N bit data. Also, the output terminal from the three output terminals for the counter 26 which outputs the intermediate bit (MSB) of the count data is connected to the select signal input terminal of the selector S2 which receives the data value for the intermediate bit of the data for the lower N bit data. In addition, the output terminal from the three output terminals for the counter 26 which outputs the least significant bit (LSB) of the count data is connected to the select signal input terminal of the selector S3 which receives the data value for the most significant bit of the data for the lower N bit data.

The register 22 takes the reset signal outputted from the counter 26 as input just as the count value for the counter changes from [111] to [000]. The register 22 then latches the lower N bit data inputted from the control data generator circuit 4 by using this input signal.

Each of the selectors S1 to S3 which make up the selector row 24 select the data values inputted from the register 22 when signals which express the value 1 (i.e. high level signals) are being outputted from the output terminals for the counter 26 which are connected to the select signal input terminals. The data values inputted to the other input terminals are then selected when signals which express the value zero (i.e., low level signals) are being outputted from the output terminals for the counter 26 which are connected to the select signal input terminals.

In the PLL apparatus for the embodiment having the kind of structure described above, the control data generator circuit 4 calculates the period Ti/n for the output pulse to be generated at the variable frequency oscillator apparatus 6 by dividing the period of the input pulse Pi detected by the signal period detector circuit 2 by a divisor n set up beforehand. Binary digital data which represents this period Ti/n is then outputted at the variable frequency oscillator apparatus 6. An output pulse Po is then outputted from the variable frequency oscillator apparatus 6 at a period which corresponds to this period Ti/n.

This output pulse Po is then divided into 1/n items at the period divider circuit 8, as shown in the diagrams. One of the n divided items for the output pulse Po are then inputted to the phase comparator circuit 10 as the phase divided signal.

The phase difference between these period divided signals outputted from this period divider circuit 8 and the input pulse Pi is then detected at the phase comparator circuit 10 and this detection result is outputted to the control data generator circuit 4. The binary digital data outputted to the variable frequency oscillator apparatus 6 is then compensated at the control data generator circuit 4 in response to the phase difference between the period divided signal from the phase comparator circuit 10 and the input pulse Pi.

The effect of this is that the periods for the n output pulses Po outputted from the variable frequency oscillator apparatus 6 coincide with the period for the input pulse Pi. Therefore, the PLL apparatus outputs the output pulse Po synchronous with the input pulse Pi and resulting from dividing the input pulse Pi by n.

The control data generator circuit 4 generates L bit (7 bit) binary data for controlling the oscillation period (i.e., the generation period of the output pulse Po) of the variable frequency oscillator apparatus 6. However, with respect to the variable frequency oscillator apparatus 6, the upper M bits (4 bits) of the L bits are used as control data for the oscillator circuit 16 which actually generates the output pulse Po. The remaining lower N bits (3 bits) are then inputted to the pulse generator apparatus 20.

In this embodiment, even if the output pulse Po cannot be generated at a period 1/n of the input pulse Pi from the oscillator circuit 16 as a result of the time resolution of the oscillator circuit 16, which is decided by the period of the reference clock, being low, n output pulses Po can be accurately outputted for every one period of the input pulse. The upper M bits of the binary digital data generated by the control data generator circuit 4 then correspond to the time resolution for the oscillator circuit 16 and the lower N bits are taken as the time resolution compensation data for inputting to the pulse generator apparatus 20.

The lower N bit data received by the pulse generator apparatus 20 is inputted to each of the selectors S1 to S3 which make up the selector row 24 via the register 22. Also, the data values from the register 22 side are then selected at a period which is shorter than that for which the select signal input terminals for each of the selectors S1 to S3 receive the data values for the upper bits. As the counter 26 provides the count value for each bit as input, when the bits received by each of the selectors S1 to S3 are all "1", a pulse signal is outputted from the selector row 24 at a frequency corresponding to these bits of [one over two to the power of X ($\frac{1}{2}^x$), where X=1, 2, 3] going from the side of the MSB.

It follows that if, for example, the lower N bit binary digital data is [101], the MSB and LSB are both 1. A pulse signal is therefore outputted from the selector row 24 (broadly speaking, the pulse generator apparatus 20) at a rate of one time for every two times and one time for every eight times that the output pulse Po is outputted. A select signal is therefore inputted at the selector 14 a total of five times for every eight times that the output pulse Po is outputted.

On the other hand, when the select signal is being inputted to the selector 14 which receives the pulse signal outputted from the pulse generator apparatus 20 as the select signal, the add data which is outputted from the constant adder 12 which adds "1" to the upper M bit data is selected. If a select signal is not being inputted, the upper M bit data inputted from the control data generator circuit 4 is selected and outputted to the oscillator circuit 16.

It follows that, for example, when the binary digital data inputted from the control data generator circuit 4 is [1100101], the data [1101], which is the upper M bit data [1100] to which "1" has been added, is inputted at the oscillator circuit 16 one every two times and once every eight times that the output pulse Po is outputted. At times other than this, the upper M bit data [1100] is taken as input without modification and the output pulse Po is generated at the oscillator circuit 16 at a period corresponding to the inputted data.

Therefore, as a result of the variable frequency oscillator apparatus 6 for this embodiment, even if an oscillating signal cannot be outputted at a period corresponding to the binary digital data inputted from the control data generator circuit 4, the time resolution for the oscillator circuit 16 is large. The average value for the oscillating signal period can therefore be made to correspond to the binary digital data.

Figure 5A:
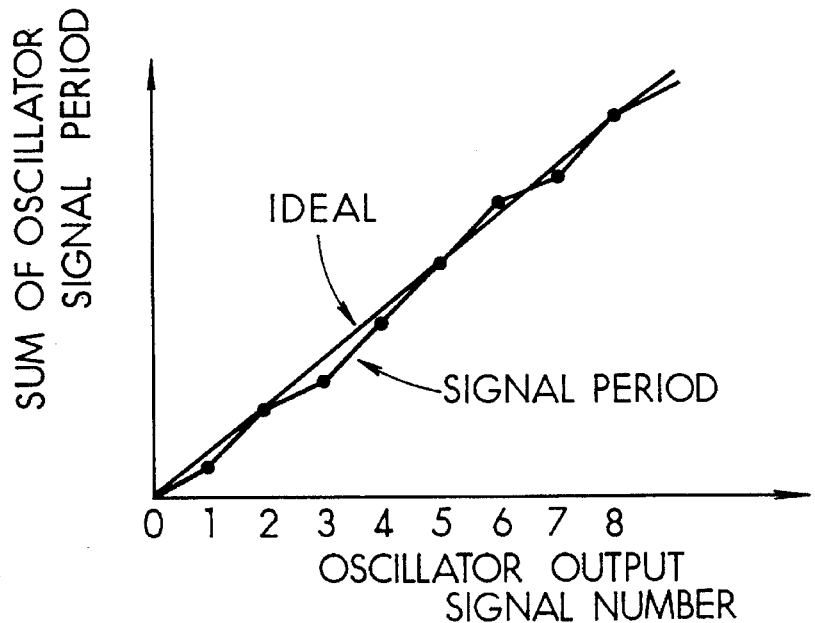
FIGS. 5(*a*) and 5(*b*) are descriptive views showing the shift from the ideal characteristic for the oscillating signal from an oscillating circuit.
Figure 5B:
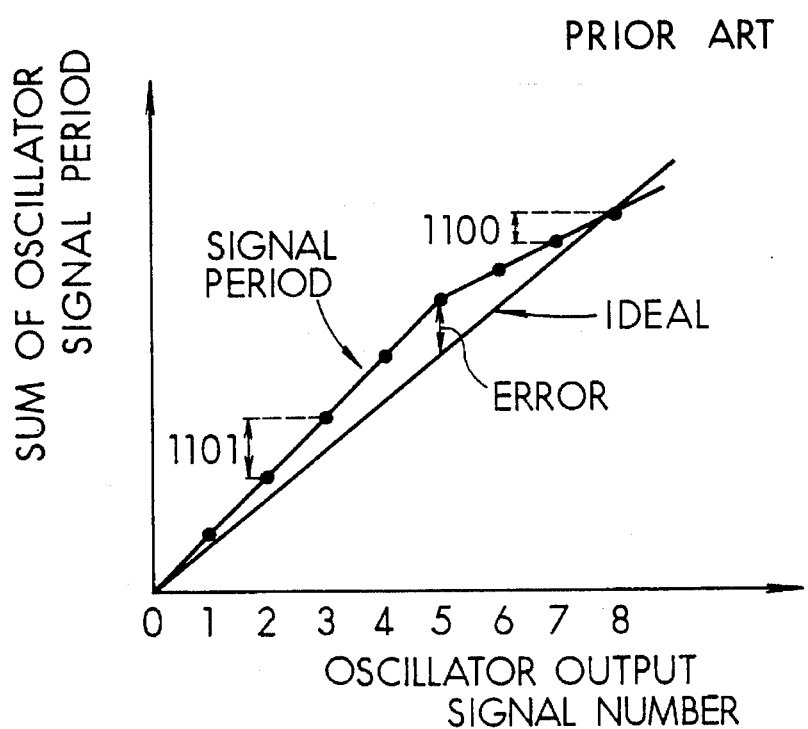

By frequently changing the oscillating period of the oscillator circuit 16 by using the pulse generator apparatus 20, as shown in FIG. 5(a), the output characteristic for the output pulse Po approaches the ideal characteristic corresponding to the binary digital data. Also, as can be seen from FIG. 5(b), large temporary deviations from the ideal characteristic can be prevented in the output characteristic for the output pulse Po.

Therefore, according to the PLL apparatus in this embodiment, an output pulse Po which is the input pulse Pi divided n times can be accurately outputted in synchronization with the input pulse Pi even if the time resolution for the oscillator circuit 16 is comparatively large. For example, if the PLL apparatus in this embodiment is used as a clock apparatus for generating a clock signal for latching communications data for digital communications, the latch timing for the communications data will not deviate to any great extent, so that communications data may then be accurately latched.

The pulse generator apparatus 20 is constructed from a register 22 for latching binary digital data (lower N bit data), a selector row 24 made up from N selectors S1 to S3 corresponding to the number of data bits and a counter 26 for outputting selector signals to each of the selectors S1 to S3 in the selector row 24. It is no longer necessary to set up the memory for pre-storing pulse signal generation patterns, corresponding to binary digital data or the control circuit for generating pulse signals in response to the generation patterns etc. which were necessary in the prior art. Execution is therefore simplified, so that the overall structure of the PLL apparatus can also be simplified.

In this embodiment, a register 22 for latching the externally inputted binary digital data (lower N bit data) has been included at the pulse generator apparatus 20. However, this register 22 does not always have to be included and it would also be possible to input each bit of binary digital data directly to each of the selectors which make up the selector row 24.

Also, this embodiment is of a structure such that the output pulse Po is divided into 1/n items using the period divider circuit 8, with this then being taken as the period divided signal. The phase difference between the period for the n output pulses Po and the period for the input pulse Pi is then detected by inputting this period divided signal into the phase comparator circuit 10. However, rather than having the period divider circuit 8, it would also be possible to have a downcounter as the counter 26 for generating a select signal at the pulse generator apparatus 20 to also have this operating as a period dividing circuit.

(Second Embodiment)

The following is a description of a second embodiment of the present invention, where a PLL apparatus generates an output pulse Po from a multiplied input pulse without using a period divider circuit 8.

Figure 3:
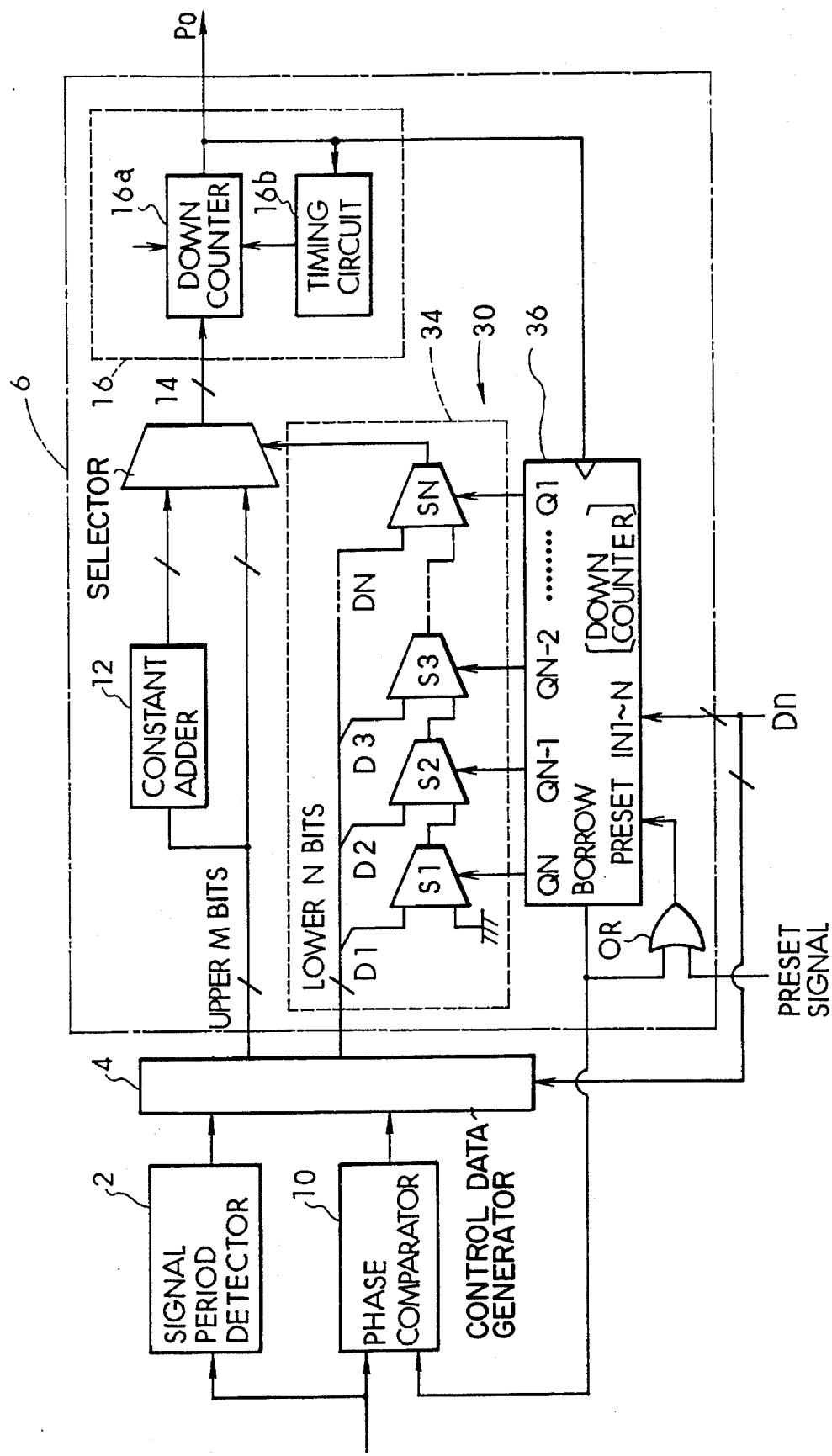
FIG. 3 is a block diagram showing the overall structure of the PLL apparatus in a second embodiment.

As can be seen from FIG. 3, the PLL apparatus in this second embodiment is constructed from a signal period detector circuit 2, a control data generator circuit 4, a variable frequency oscillator apparatus 6 and a phase comparator circuit 10. The period divider circuit 8 for dividing the output pulse Po into 1/n items which was present in the first embodiment is no longer present.

The variable frequency oscillator apparatus 6 is constructed from a constant adder 12, selector 16 and pulse generator apparatus 30, in the same way as for the first embodiment. However, rather than the structure in the first embodiment, the pulse generator apparatus 30 is now constructed from a selector row 34 made up of N selectors S1 to SN to which each bit of data for the lower N bit data is directly inputted and an N bit downcounter 36 for outputting the respective select signals for each of the selectors S1 to SN in the selector row 34.

N bit binary digital data (multiplying data) Dn which expresses the multiplier n for the input pulse Pi is inputted to the data input terminals IN1 to INN for the downcounter 36. An externally inputted preset signal and a borrow signal generated when the count value for the downcounter 36 becomes "0" are inputted to the PRESET terminal via an OR gate. The multiplier data Dn is then preset at the downcounter 36 when a preset signal is externally inputted or when the count value becomes "0". The borrow signal is taken as the signal to be used for phase comparison with the input pulse Pi and as such is also outputted to the phase comparator circuit 10.

Also, the output pulse Po from the oscillator circuit 16 is inputted at the downcounter 36 as the clock signal for counting. The N output terminals Q1 to QN for the downcounter 36 are connected in the order of the terminal for the least significant bit Q1 to the output terminal for the most significant bit QN to the selector SN in the selector row 34 which receives the most significant bit of data down to the selector S1 which receives the least significant bit of data.

With the embodiment for the PLL apparatus having this kind of structure, multiplier data which expresses the multiplier n is preset and the downcounter 36 carries out the counting operation using the output pulse Po. As the selectors amongst each of the selectors S1 to SN which make up the selector row 34 which receive the higher order bits then have shorter periods, the data values for the corresponding bits are selected. Select signals are then outputted from the selector row 34 at frequencies corresponding to the lower N bit data values.

Also, the borrow signal for the downcounter 36 is outputted at the phase comparator circuit 10. This borrow signal is outputted from the downcounter 36 when it becomes a value which corresponds to the multiplier data Dn for the number of times the output pulse Po is outputted. As this is the same as an item which divides the output pulse into 1/n items the phase difference can be detected at the phase comparator circuit 10 in the same way as for the first embodiment which includes the period divider circuit 8.

It follows that an output pulse Po can be outputted from the PLL apparatus for this embodiment in synchronization with the input pulse Pi and at a period corresponding to binary data generated at the control data generator circuit 4 in the same way as for the first embodiment. According to this embodiment, it is therefore possible to simplify the structure of the apparatus by using the downcounter 36 and removing the period divider circuit 8.

The oscillator circuit 16 in the second embodiment is constructed from a downcounter 16a and a timing circuit 16b. Data outputted from the selector 14 is preset to the downcounter 16a and downcounting is carried out taking this data as a reference clock. By then generating an output pulse Po when this count value becomes zero, the output pulse Po can be generated at a period which corresponds to the data from the selector 14. In this case, the time resolution which controls the variation of the period of the output pulse Po is decided by the period of the externally inputted reference clock. However, the output pulse Po which is period divided from the input pulse Pi is prevented from deviating greatly from the ideal characteristic by the constant adder 12, the selector 14 and the pulse generator apparatus 20, etc. This limits the extent to which the frequency of the output pulse Po can be raised. This reference clock may be generated using a fixed oscillator such as a crystal oscillator, etc., but as the highest frequencies these items can produce are only about a few hundred MHz, the PLL apparatus in each of the embodiments are only capable of output pulses Po which have frequencies of about 10 MHz.

Further, in the second embodiment, the period of the output pulse Po is controlled by a data value preset in the downcounter 16a. However, one bit of this data corresponds to one period of the reference clock. It is therefore necessary that the time resolution for the data for the phase difference between the period data for the input pulse Pi and the input pulse Pi used while the control data is generated at the control data generator circuit 4 and the signal for the period divided output pulse Po corresponds with the time resolution (in this case, one cycle of the reference clock) for the output pulse Po which the oscillator circuit 16 variably controls. It would therefore be preferable if the signal period detector circuit 2 and the phase comparator circuit 10 were capable of coding the phase difference between the period for the input pulse Pi and the input pulse Pi and the signal after the output pulse Po has been period divided at the same time resolution as the oscillator circuit 16.

(Third Embodiment)

A third embodiment of this invention is capable of carrying out coding of the phase difference between the input pulse period and input pulse and the signal after the output pulse has been period divided at the same time resolution as for the oscillator. A description will therefore be given of a period dividing type of PLL apparatus with a higher time resolution capable of generating a higher frequency output pulse by using a multi-phase clock which has a prescribed phase difference, rather than a reference clock.

Figure 6:
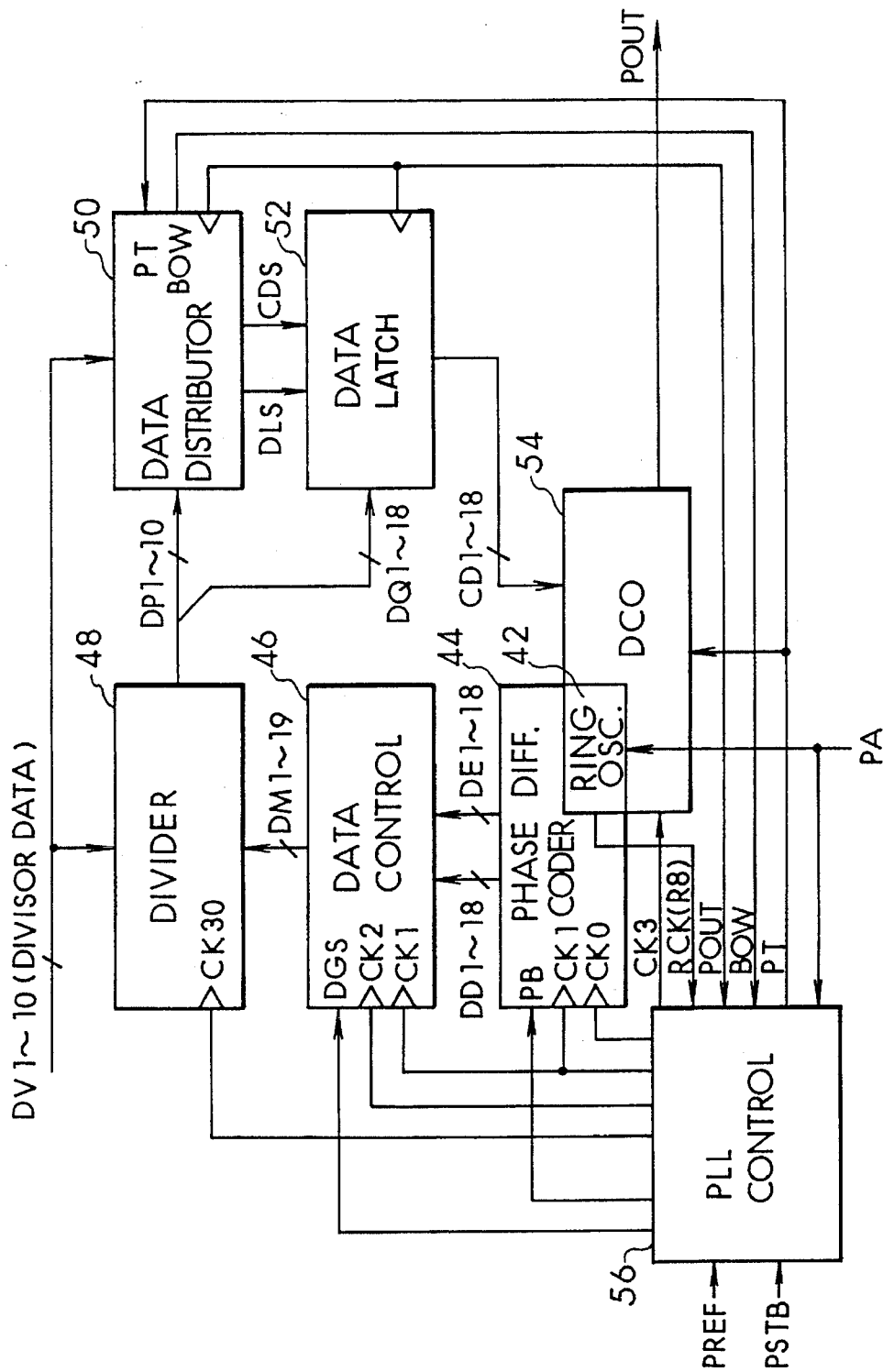
FIG. 6 is a block diagram showing the overall structure of the PLL apparatus in a third embodiment.

FIG. 6 is a block diagram showing the overall structure of the PLL apparatus for the third embodiment of this invention. In the PLL apparatus in this embodiment, the externally inputted reference signal PREF (this corresponds to the input pulse in the previous embodiment) is for generating a period divided output signal (this corresponds to the output pulse in the previous embodiment) in response to the 10 bit divisor data DV (DV1 to DV 10) which expresses the divisor. The outputting of the output signal POUT then starts when the operation start signal PSTB is received from outside.

As can be seen from FIG. 6, the PLL apparatus for this embodiment is constructed from a ring oscillator 42 (FIG. 7), a pulse phase difference coder circuit 44 (FIG. 9), a data control area 46, a divider unit 48, a data distributor circuit 50

(FIG. 6), a data latch circuit 52, a DCO (digitally controlled oscillator) 54 and a PLL operation controller circuit 56. The ring oscillator 42 is a multi-phase clock generating source for outputting 16 multi-phase clocks R1 to R16 having a prescribed phase difference Tg when a high level control signal PA is inputted externally. The pulse phase difference coder circuit 44 uses the multi-phase clocks R1 to R16 outputted by the ring oscillator 42 to code the period of the internal clock PB derived from the OR signal for the frequency divided signal BOW divided via the divisor from the output signal POUT. In this way, the pulse phase difference coder circuit 44 generates the sixteen bit binary digital data DD (DD1 to DD18) and DE (DE1 to DE18) corresponding to the phase difference between the period of the reference signal PREF and the reference signal PREF, and the frequency divided signal BOW. The data control area 46 generates 19 bit control data DM (DM1 to DM19) for controlling the phase difference between the reference signal PREF and the output signal POUT to be half of the period (i.e., $\pi$ radians) of the reference signal PREF based on the binary digital data (hereinafter referred to as period data) DD and DE outputted from the pulse phase difference coder circuit 44 (the pulse phase difference coder circuit 44 and the data control area 46 correspond to the phase comparator circuit 10 in the aforementioned embodiments). The divisor unit 48 divides the control data DM generated by the data control area 46 by the ten bit divisor data DV (DV1 to DV10) which expresses the externally inputted divider. The results of this division are then split up into 18 bit upper bit data DQ (DQ1 to DQ18) which expresses the division value rounded up to the nearest decimal point and ten bit lower bit data DP (DP1 to DP10) which expresses the division value rounded down to the nearest decimal point and this data is then outputted (the divisor unit 48 corresponds to the control data generator circuit 4 in the previous embodiments). The data distributor circuit 50 outputs a select signal CDS, the level of which varies at a frequency which corresponds to the ten bit lower bit data DP outputted from the divisor unit 48, outputs a frequency divided signal BOW at a timing derived by frequency dividing the output signal POUT by the divisor data VD and outputs a timing signal DLS which expresses the latch timing for the data with respect to the following data latch circuit 52 (the data distributor circuit 50 corresponds to the pulse generator apparatus 20 in the previous embodiments). The data latch circuit 52 receives the select signal CDS and the timing signal DLS from the data distributor circuit 50 and then latches the upper bit data DQ outputted from the divisor unit 48 when the timing signal DLS goes high. The data latch circuit 52 then outputs this latched data DQ or the data DQ+1, which is the data DQ with "1" added, in response to the select signal CDS as 18 bit frequency control data CD (CD1 to CD 18) which expresses the output signal POUT (the data latch circuit 52 corresponds to the selector 14 and the constant adder 12 in the previous embodiments). The DCO circuit 54 uses the multi-phase clocks R1 to R16 outputted from the ring oscillator 42 to generate an output signal POUT having a period corresponding to the frequency control data CD from the data latch circuit 52 (the DCO circuit 54 corresponds to the oscillator circuit 16 in the previous embodiments). The PLL operation controller circuit 56 controls the timing of the operation of each of the aforementioned parts.

Figure 7:
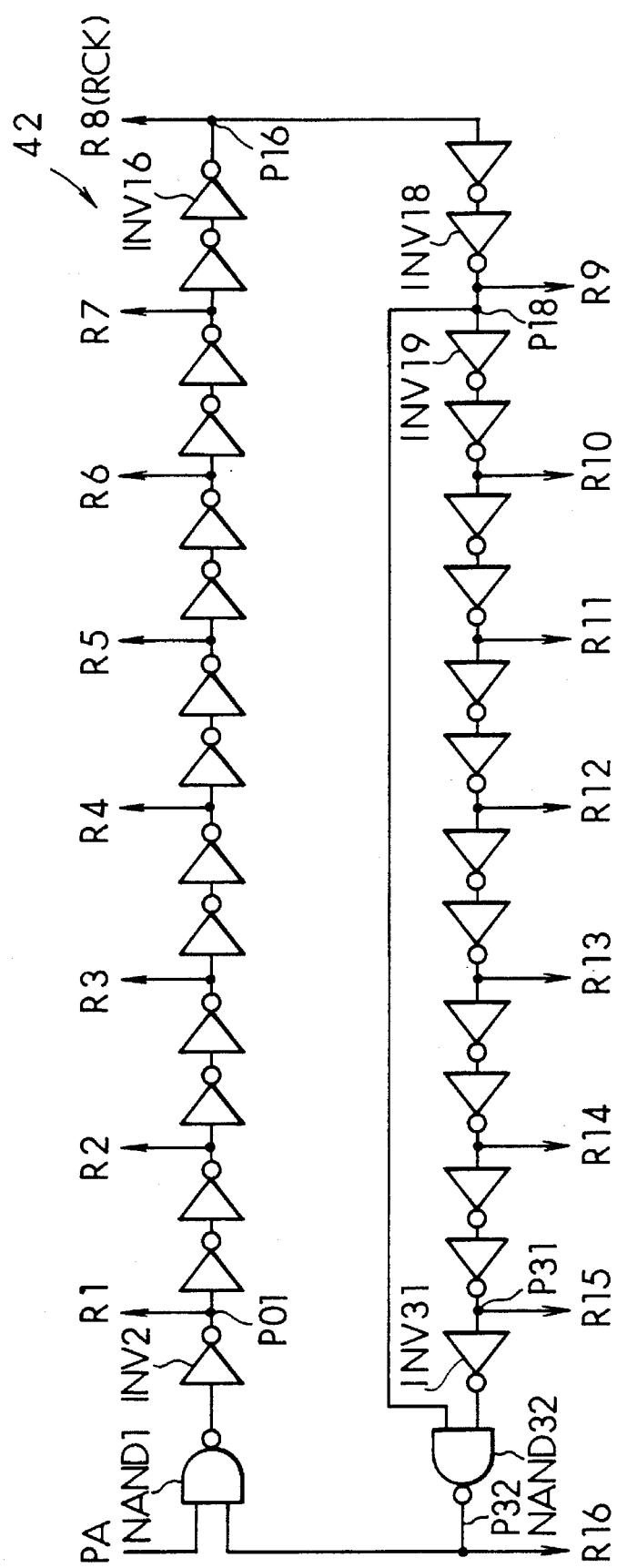
FIG. 7 is a circuit diagram showing the structure of a ring oscillator for the third embodiment.

As can be seen from FIG. 7, the ring oscillator 42 is an inverting circuit made from delay elements and is equipped with two two-input nand gates (hereinafter referred to simply as nand gates) NAND 1 and NAND 32, along with thirty inverters INV 2 to INV31. These circuits are connected in the form of a ring, with the output of each previous stage being connected into the input of the following stage. An external control signal PA is inputted to the input terminal of NAND 1 which is not connected to NAND 32 (hereinafter, this input terminal will be referred to as the activation terminal). Also, the output signal for the inverter INV 18 is inputted to the input terminal of the nand gate NAND 32 which is not connected to the inverter INV 31 (hereinafter, this input terminal will be referred to as the control terminal). Also, output terminals for outputting the multi-phase clocks R1 to R16 are set up to be connected successively to the output terminals of each of the even numbered inverting amplifiers coming from the nand gate NAND 1. These output terminals are then connected to the pulse phase difference coder circuit 44 and the DCO circuit 54.

In the following, a description is given with reference to FIG. 8 of the operation of the ring oscillator 42 which is constructed in the above way.

When the control signal PA is low, the outputs for the even numbered inverters outputted from the nand gate NAND 1 are stable at low levels and the outputs for the odd numbered inverters are stable at high levels because the output P01 for the nand gate NAND 1 is high. Under these conditions, only the nand gate NAND 32 outputs a high level regardless of connections with even numbered stages as a result of the output P18 for the inverter INV 18 inputted to the control terminal of the nand gate NAND 32 being low. By having this kind of structure, if the input signal and output signal for the nand gate NAND 1 are both put high, the NAND gate NAND 1 then commences an inverting operation when the control signal PA changes from a low level to a high level.

If the control signal PA is then changed from a low to a high level, as a result of the output P01 for the nand gate NAND 1 inverting from high to low, the output of the following inverter inverts in sequence, the outputs for the odd numbered converters change from high to low, and the outputs for the even numbered inverters change from low to high. In the following description, when this kind of control signal PA is high, the edge of the periodic pulse signal which acts as the rising output for the even numbered inverters and which acts as the falling output for the odd numbered inverters is known as the main edge and is indicated by the round points in FIG. 8.

When this main edge reaches the inverter INV 18, the output P18 for the inverter INV 18 inverts from low to high. As the output level of the inverter INV 31 is already high, both of the input signals for the NAND gate NAND 32 are high. The nand gate NAND 32 therefore commences its inverting operation, and its output goes from high to low. In the following description, this main edge is inputted to the NAND gate NAND 32 from the control terminal and is then inverted by this NAND gate 32. The edge of the sequential pulse signal which acts as the rising output for the odd numbered converters and acts as the falling output for the even numbered inverters is known as the reset edge. This reset edge is indicated by the cross marks in FIG. 8. This reset edge then goes around the ring oscillator 42 together with the main edge generated by the nand gate NAND 1.

The following main edge is then sequentially inverted by each of the inverters which follow from the inverter INV 18 and is then inputted to the nand gate NAND 32 as a result of the output of inverter INV 31 inverting from a high level to a low level. However, the input signal for the control terminal of the nand gate NAND 32 i.e., the output of the inverter INV 18 is high. The main edge is then sequentially inverted by each of the inverters which follow nand gate NAND 32 and NAND gate NAND 31 without modification and so as to be transported around the ring oscillator 42.

When this kind of main edge passes through the inverters INV 19 to INV 31 to reach the nand gate NAND 32, the output signal for the inverter INV 18 is still high. This is because although the number of inverters INV between inverters 19 and INV 31 is 13, the number of inverters, inclusive, from the nand gate NAND 32 to the inverter INV 18 is 19. As a result of this, the main edge is inputted to the nand gate NAND 32 more quickly than the reset edge is transferred from the nand gate NAND 32 to the inverter INV 18.

On the other hand, the reset edge generated by the nand gate NAND 1 reaches the inverter INV 18 again by passing through each of the inverters including the nand gate NAND 1 and the signal for the control terminal for the nand gate NAND 32 is inverted from a high level to a low level. However, at this time, the input signal from the inverter INV 31 for the nand gate NAND 32 is already low because of the main edge, so the output for the nand gate NAND 32 does not change. The reset edge is therefore transferred sequentially from the inverter INV 18 to the nand gate NAND 32 by the normalized route via the inverters INV 19 to 31.

When the reset edge then reaches the inverter INV 31, the input signal from the inverter INV 31 for the nand gate NAND 32 is inverted from a low level to a high level. At almost the same time as this, the main edge reaches the inverter INV 18 and the input signal for the control terminal of the nand gate NAND 32 is also inverted from low to high. Here, the main edge starts from the nand gate NAND 1, passes through the nand gate NAND 1 again after having gone once around the ring oscillator 42 via the normal route, and then reaches the inverter 18. Also, generation of the reset edge commences upon the start of the inverting operation of the nand gate NAND 32 which occurs when the main edge reaches the inverter INV 18 from the nand gate 1. The reset edge then goes once around the ring oscillator 42 via the normal route. Both edges therefore pass through exactly the same total of fifty inverting circuits upon reaching the nand gate NAND 32.

With the oscillator in this invention, the inversion response time for the even numbered inverters is faster for the falling output than for the rising output. On the other hand, the inversion response time for the odd numbered inverters is set up beforehand to be faster for the rising output than for the falling output. The reset edge therefore reaches the nand gate NAND 32 slightly more quickly than the main edge.

It follows that even if the output for the inverter INV 31 is inverted from a low to a high by the reset edge, the input signal for the control terminal of the nand gate NAND 32 is still low. As a result, the output of the nand gate NAND 32 is not inverted and the main edge is delayed slightly before reaching the inverter INV 18. When the level of the input signal to the control terminal of the nand gate 32 then goes from low to high, the output of the nand gate NAND 32 is inverted from high to low. The reset edge is then reduced once and then regenerated by the main edge.

From then on, this operation is repeated so that the reset edge is regenerated every cycle by the main edge and therefore goes around the ring oscillator 42 together with the main edge. If the control signal PA then goes low, this sequential operation is halted and the initial conditions are returned to.

As two pulse edges generated on the same cycle at differing times go around the ring oscillator 42 in this embodiment, the output of the nand gate NAND 1 is inverted before the main edge which this nand gate NAND 1 generated returns. As the output of the nand gate NAND 32 is also inverted by the main edge before the self-generated reset edge returns, the pulse signal simply oscillates. Multi-phase clocks R1 to R16 having a period which is thirty-two times that of the inversion operation time Td at each of the inversion circuits are therefore outputted from each of the output terminals for the ring oscillator 42. The phase difference between the clocks outputted from neighboring terminals is then a time Tg which is two times the inverting operation time Td.

The pulse phase difference coder circuit 44 for generating the period data DD and DE using the clocks R1 to R16 outputted from the ring oscillator 42 to correspond to the phase difference between the period of the standard reference signal PREF and the period of the reference signal PREF, and the frequency divided signal BOW will now be described using FIG. 9 to FIG. 11.

With the pulse phase difference coder circuit 44 in this embodiment, the period data DD and DE is generated based on the internal clock PB present in the OR signal for the reference signal PREF and the frequency dividing signal BOW. This internal clock PB is, however, generated by the PLL operation controller circuit 56. Also, as shown an FIG. 11, a clock signal CK0, which is the internal clock PB delayed by a prescribed period of time, and a clock signal CK1, which is the reference signal PREF delayed by a period of time which is longer than the delay period for the clock signal CK0, are inputted to the pulse phase difference coder circuit 44 from the PLL operation controller circuit 56 in order to control the timing of the operation of the pulse phase difference coder circuit 44.

Figure 9:
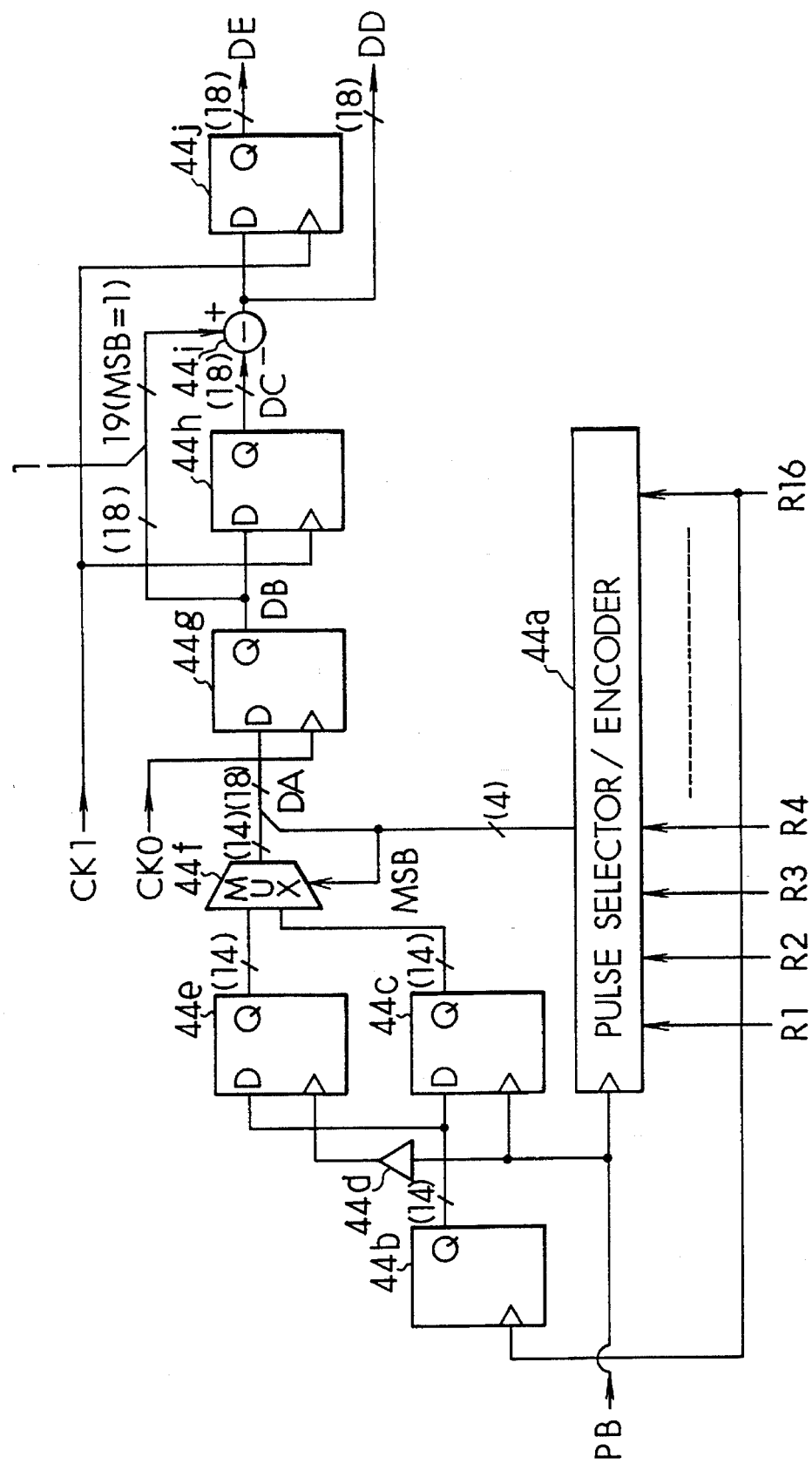
FIG. 9 is a circuit diagram showing the structure of a pulse phase coder circuit for the third embodiment.

As can be seen from FIG. 9, the multi-phase clocks R1 to R16 outputted from the ring oscillator 42 are received by the pulse phase difference coder circuit 44. When the internal clock PB then changes from a low level to a high level (i.e., at the time the internal clock PB rises), it is determined which of the inverting circuits within the ring oscillator 42 the main edge has reached and a pulse selector/encoder circuit 44a for encoding four bit binary data is supplied with this value.

Figure 10:
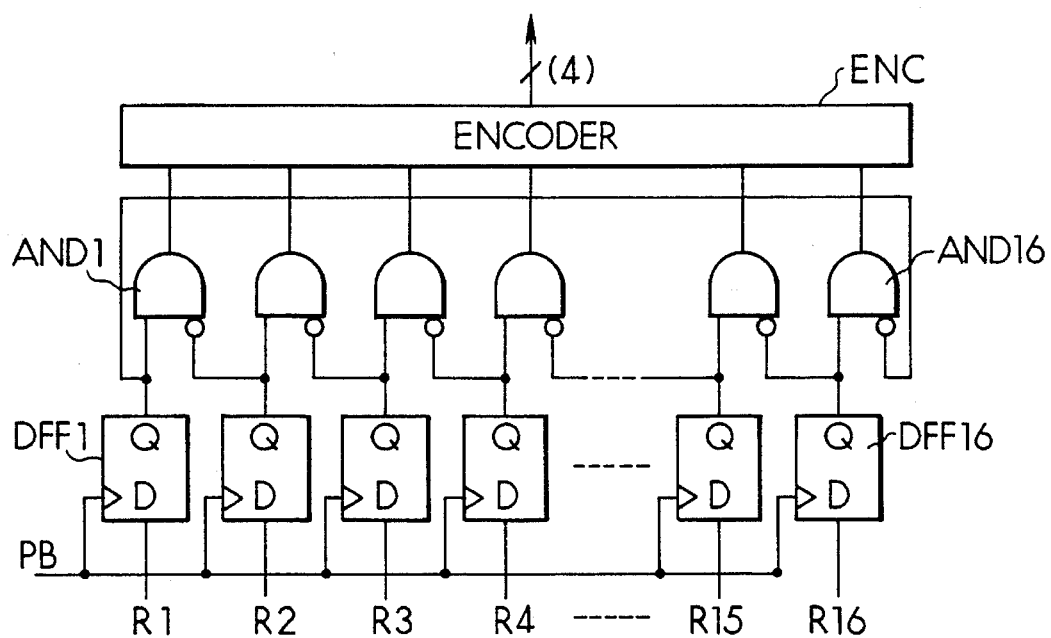
FIG. 10 is a circuit diagram showing the structure of the pulse selector/encoder circuit in FIG. 9.

As shown in FIG. 10, the pulse selector/encoder circuit 44a is constructed from latches DFF1 to DFF16, and gates AND 1 to AND 16 and an encoder ENC. The latches DFF1 to DFF16 are made from D-type flip-flops and are for receiving the multi-phase clocks R1 to R16 from the ring oscillator 42 and latching each of the signals R1 to R16 on the rise of the internal clock PB. The first inputs of each of the and gates AND 1 to AND 16 are connected directly to the outputs of each of the latches DFF1 to DFF16 and the second inputs for the and gates AND1 to AND 15 are connected to the first inputs of the following gates. The second input for AND 16 is, however, connected back around to the first input of the gate AND 1. The encoder ENC is for encoding the outputs of the and gates AND 1 to AND 16 into four-bit binary digital data if any of the outputs of the and gates AND 1 to AND 16 go high.

Within the pulse selector/encoder circuit 44a, when the internal clock PB rises, the signal level of the multi-phase clocks being outputted from the ring oscillator 42 at this time are latched by the latches DFF1 to DFF16. The outputs of the and gates AND 1 to AND 16 which receive the output signals from each of the latches DFF1 to DFF16 which are then high will correspond to the position within the ring oscillator 42 which the main edge has reached. The encoder ENC can then generate binary digital data which expresses this position.

The output pulses from the even numbered inverters in the ring oscillator 42 are taken as input by each of the latches DFF1 to DFF16 of the pulse selector/encoder circuit 44a, with this signal rising on the main edge and falling on the reset edge. Within the latches DFF1 to DFF16, the level of the output for the latches DFFn which latch the outputs from the inverters within the ring oscillator 42 which the main edge has reached is high and the output for the latches DFF(n+1) which follow these latches is low.

The construction of this embodiment is such that, within the latches DFF1 to DFF16, the outputs of consecutive second stage latch circuits are inputted to the and gates AND 1 to AND 16. The output of the corresponding latch circuit DFFn is high and the level of the next stage latch circuit DFF(n+1) is low, so that only the outputs of the and gates ANDn are high. By then outputting this signal to the encoder ENC, binary digital data can be generated which shows the position of the inverters within the ring oscillator 42 which the reset edge has reached.

For example, in the case where the internal clock PB rises when the main edge reaches the thirty-second nand gate NAND 32 so that the output of the and gate AND 16 becomes high, the binary encoded digital data (1111) corresponding to this position will be outputted from the encoder ENC.

The pulse phase difference coder circuit 44 is constructed from a fourteen bit counter 44b (hereinafter referred to simply as a counter), a first latch circuit 44c, a delay circuit 44d, a second latch circuit 44e, and a MUX (multiplexer) 44f. The counter 44b uses the clock signal R16 outputted from the final nand gate in the ring oscillator 42 NAND 32 to count the number of times that the main edge has gone around the ring oscillator 42. The first latch circuit 44c latches the (fourteen bit) output from the counter 44b on the rises of the internal clock PB. The delay circuit 44d delays and inputs the internal clock PB by at least the duration of the count operation of the counter 44b. The second latch circuit 44e latches the output (fourteen bit) from the counter 44b on the rise of the internal clock PB inputted via the delay circuit 44d. The MUX 44f receives the data latched at the first latch circuit 44c and the second latch circuit 44e. Then, if the MSB (most significant bit) of the four bit binary digital data outputted from the pulse selector/encoder circuit 44a is "1", the data latched at the first latch circuit 44c is selected. If, on the other hand, this data bit is "0", the data latched at the second latch circuit 44e is selected. This is then outputted as the upper bit data for the four-bit binary digital data outputted from the pulse selector/encoder circuit 44a.

With the pulse phase difference coder circuit 44 in this embodiment, the position of the main edge within the ring oscillator 42 is encoded into four-bit binary digital data by the pulse selector/encoder circuit 44a. The number of times the main edge goes around within the ring oscillator 42 is counted by the counter 44b. This (fourteen bit) count data is then outputted via the first latch circuit 44c, the second latch circuit 44e and the MUX 44f. In this way, the rise timing of the internal clock PB is encoded as eighteen bit binary digital data DA as units of the phase difference Tg for the multi-phase clocks R1 to R16 outputted from the ring oscillator 42.

When the MSB of the binary digital data outputted from the pulse selector/encoder circuit 44a is "0", the MUX 44f selects the latch data from the second latch circuit 44e which latches the count data from the counter 44b on the clock which is the delayed version of the internal clock PB. When the MSB of the binary digital data outputted from the pulse selector/encoder circuit 44a is "1", the latch data from the first latch circuit 44c which latches the count data from the counter 44b on the internal clock PB is selected. This is because a certain amount of time is required from when the clock signal R16 is outputted from the ring oscillator 42 until the counter 44b counts this clock signal R16 and the output from the counter 44b stabilizes.

This is to say that in this embodiment, when the MSB of the binary digital data encoded at the pulse selector/encoder circuit 44a on the rise of the internal clock PB is "0", i.e., when the position of the main edge within the ring oscillator 42 is between the initial inverter and an intermediate inverter, there is the danger of the latch data from the first latch circuit 44c latched on the internal clock PB actually being one less than it should be due to delays in the count operation at the counter 44b. For this reason, in this case, accurately encoded binary digital data DA can be obtained for the rise timing of the internal clock PB by using the latch data from the second latch circuit 44e which latches the count data for the counter 44b using the delayed version of the internal clock PB.

The pulse phase difference coder circuit 44 is also equipped with a third latch circuit 44g, a fourth latch circuit 44h, a subtractor 44i and a fifth latch circuit 44j. As shown in FIG. 11, the third latch circuit 44g latches the 18-bit binary digital data DA, encoded in the above way, on the rise of the clock signal CK0 outputted from the PLL operation controller circuit 56 and then outputs this as the latch data DB. The latch 44h latches the latch data DB from the third latch circuit 44g on the rise of the clock signal CK1 outputted from the PLL operation controller circuit 56 and then outputs this as the latch data DC. The subtractor 44i subtracts the latch data DC outputted from the fourth latch circuit 44h from the nineteen-bit binary digital data which is the latch data DB outputted from the third latch circuit 44g with the value 1 added as the most significant bit (the MSB will be the nineteenth bit). The result of this subtraction is then outputted as the period data DD. The fifth latch circuit 44j latches the period data DD on the rise of the clock pulse outputted from the PLL operation controller circuit 56 and then outputs this as the aforementioned period data DE.

With the pulse phase difference coder circuit 44 for this embodiment having this kind of construction, binary digital data DA is generated which describes the timing at which the internal clock PB present in the OR signal for the reference signal PREF and the frequency dividing signal BOW rises. This binary digital data DA is then latched at the third latch circuit 44g on the clock signal CK0 inputted marginally after the internal clock PB. Also, the data amongst the latch data DB which is outputted from the third latch circuit 44g which is generated on the rise of the reference signal PREF (D4, D6 and D8 in the diagrams) is latched by the fourth latch circuit 44h, which operates in response to the clock signal CK1.

The latch data DC outputted from the fourth latch circuit 44h is subtracted from the latch data DB from the third latch circuit 44g at the subtractor 44i. During the time between the inputting of the clock signal CK0 after the rise of the reference signal PREF until the clock signal CK1 is inputted, the period data DD outputted from the subtractor 44i expresses the period between the previous rise of the reference signal PREF until the present rise of the reference signal PREF (i.e., the period of the reference signal PREF). After this, during the period between the clock signal CK0 being inputted until the following clock signal CK0 is inputted, the period data DD expresses the period of time from when the reference signal PREF rises until the frequency divided signal BOW rises (i.e., the phase difference between the reference signal PREF and the frequency divided signal BOW).

The period data DD outputted from the subtractor 44i is latched at the fifth latch circuit 44j on the rise of the clock signal CK1. The period data DE outputted from the fifth latch circuit 44j is then simply data which expresses the period of the reference signal PREF.

In this embodiment, by inputting the latch data DB from the third latch circuit 44g to the subtractor 44i the value "1" is added as an MSB for the latch data DB. However, as this is so as the counter 44b can sequentially count the number of times the main edge goes around within the ring oscillator 42, if the value for this output reaches the maximum value, the minimum value is returned to.

If the output for the counter 44b changes from maximum to minimum between the previous rise of the internal clock PB and the following rise, the newest latch data DB outputted from the following third latch circuit 44g becomes smaller than the latch data DC latched at the fourth latch circuit 44h. If this is then subtracted without modification, the subtraction result becomes negative. Nineteen bit binary digital data is therefore generated by adding an MSB having the value "1" to the newest latch data DB (18 bit) latched at the third latch circuit 44g. The latch data DC for the fourth latch circuit 44h is then subtracted from this value. More accurate period data DD and DE can then be obtained simply by outputting the lower eighteen bits of this subtraction result.

Next, the data control area 46 for generating the control data DM for controlling the phase difference between the reference signal PREF and the output signal POUT to within half a period (i.e. $\pi$ radians) of the reference signal PREF based on the period data DD and DE outputted from the pulse phase difference coder circuit 44 will be described using FIG. 12 and FIG. 13.

Figure 13:
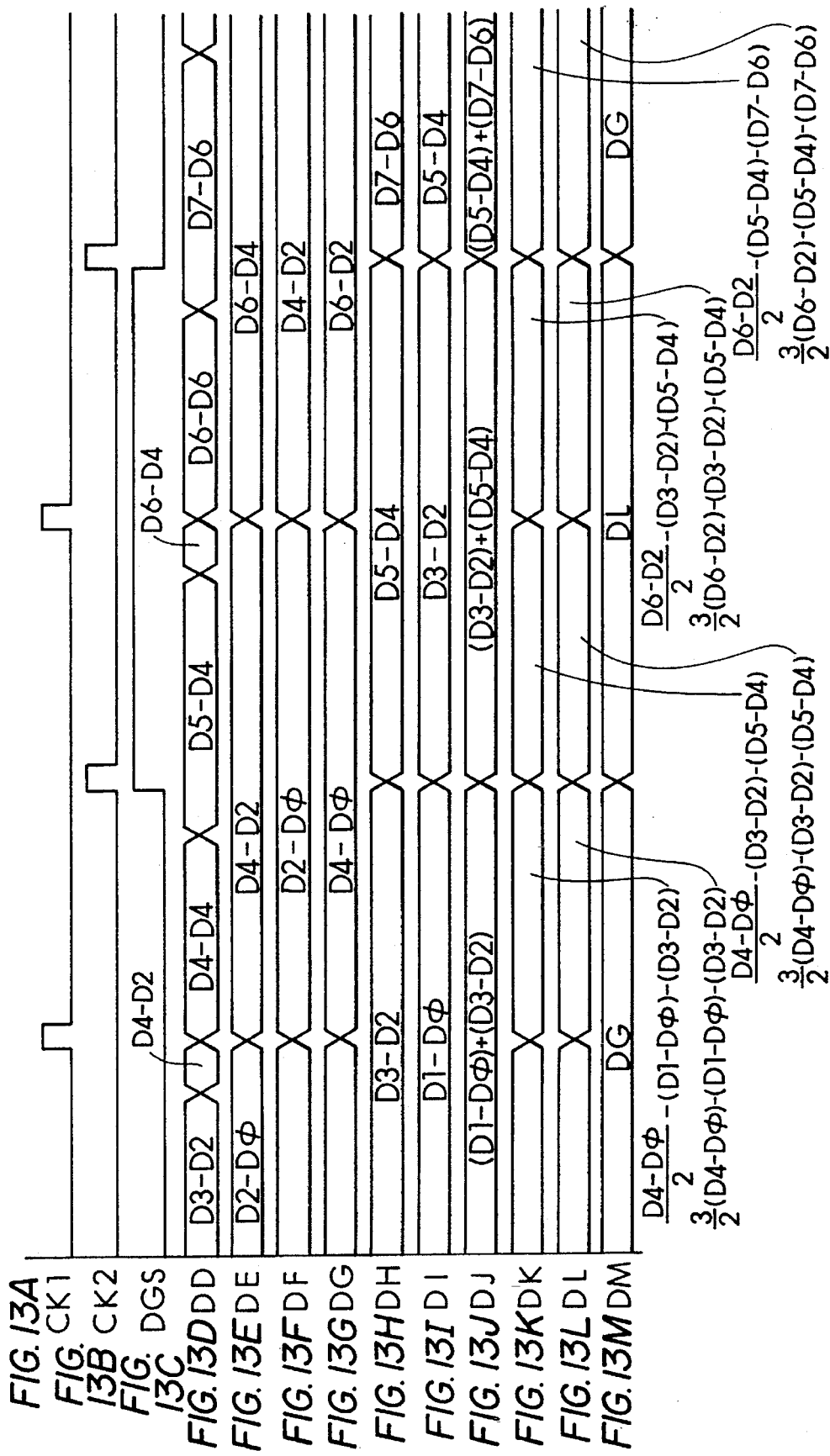
FIG. 13 is a timing diagram showing the operation of the data controller in FIG. 12.
Figure 14:
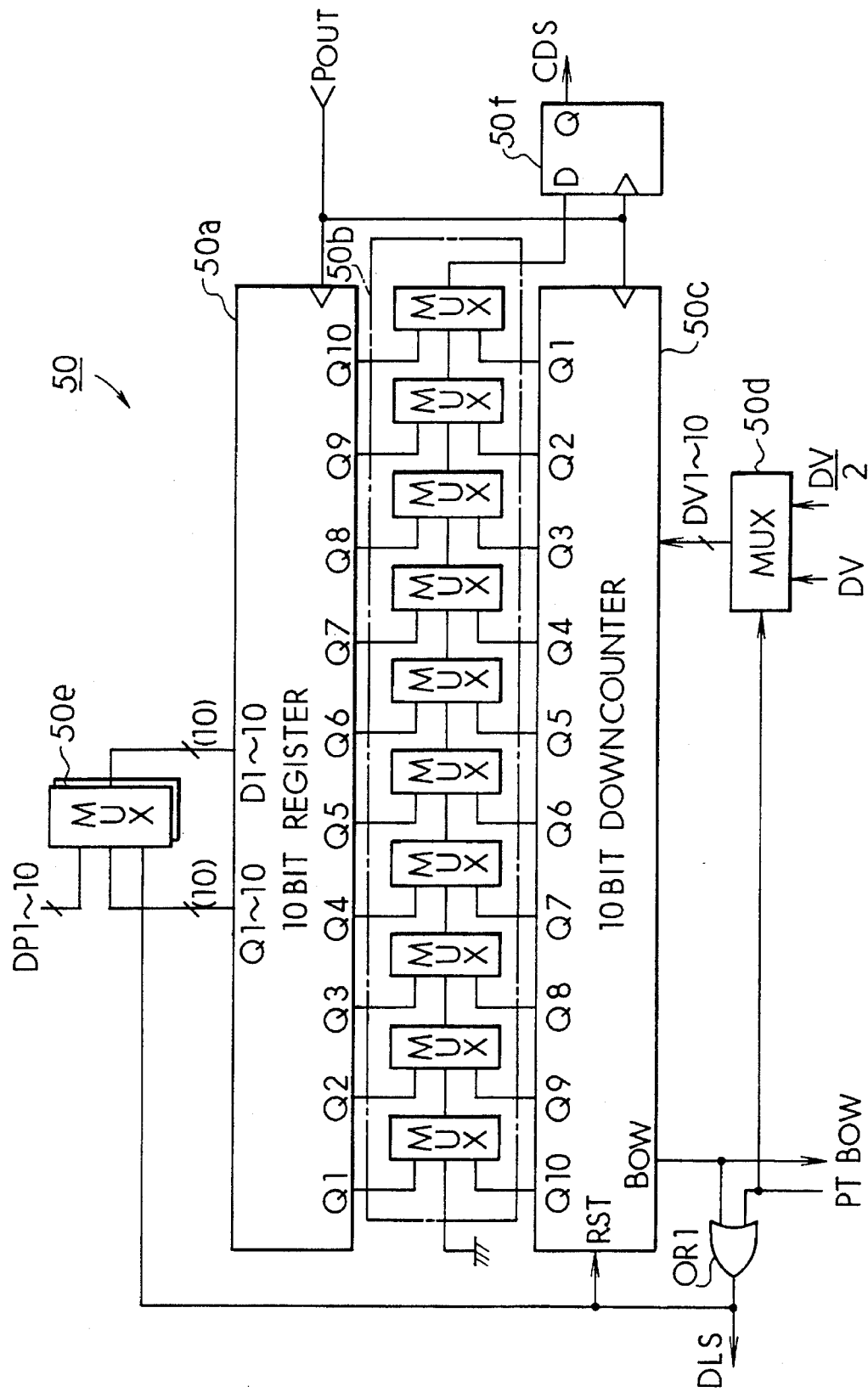
FIG. 14 is a circuit diagram showing the structure of the data distributor circuit for the third embodiment.

As can be seen from FIG. 13, three operation control signals are inputted at the data control area 46. These include the aforementioned clock signal CK1 from the PLL operation controller circuit 56, which is the reference signal PREF delayed by a prescribed delay period which is longer than the delay period for the clock signal CK0, the clock signal CK2, which is the frequency divided signal BOW delayed by a prescribed delay period which is longer than the delay period for the clock signal CK0, and the control signal DGS, which changes over between either being high or being low in synchronization with the clock signal CK2.

Figure 12:
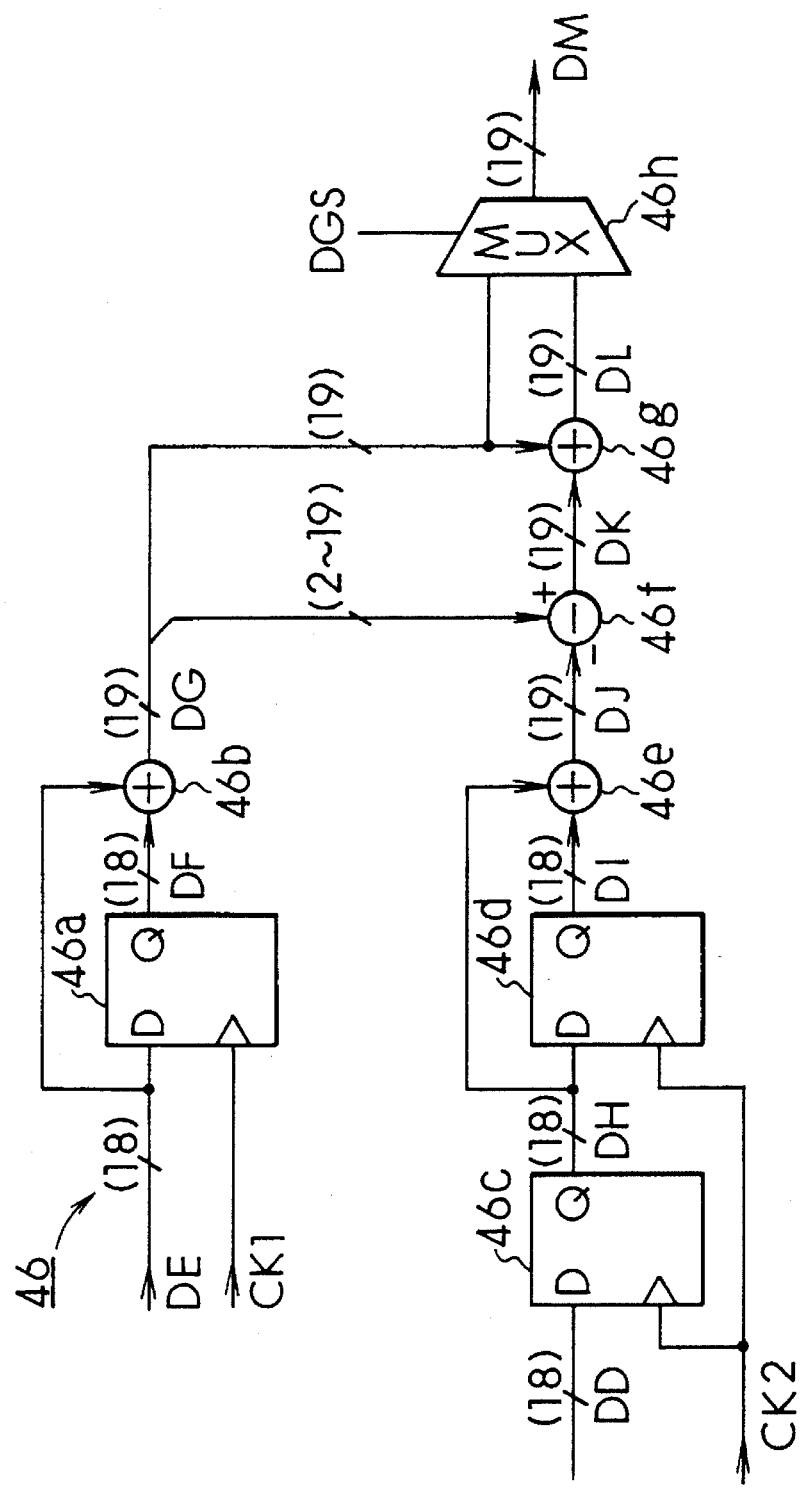
FIG. 12 is a circuit diagram showing the structure of the data controller in the third embodiment.

As can be seen from FIG. 12, the data control area 46 in this embodiment is constructed from a first latch circuit 46a, a first adder 46b, a second latch circuit 46c, a third latch circuit 46d, a second adder 46e, a subtractor 46f, a third adder 46g and a MUX 46h. The first latch circuit 46a latches the (18 bit) period data DE on the rise of the clock signal CK1 and outputs this as the (18 bit) latch data DF. The first adder 46b adds this latch data DF and the period data DE and then outputs the result as the addition data DG (19 bit). The second latch circuit 46c latches the period data DD (18 bit) on the rise of the clock signal CK2 and then outputs this as the latch data DH (18 bit). The third latch circuit 46d latches this latch data DH on the rise of the clock signal CK2 and outputs this as the latch data DI (18 bit). The second adder 46e adds the latch data DH and the latch data DI and outputs the result as the addition data DJ (19 bit). The subtractor 46f subtracts the addition data DJ from the addition data from the first adder 46b with the lowest first bit removed (18 bit) and then outputs the subtraction data DK (19 bit). The third adder 46g adds this subtraction data DK and the addition data DG and outputs the result as the addition data DL (19 bit). The MUX 46h selects the addition data DG if the control signal DGS from the PLL operation controller circuit 56 is low and selects the addition data DL if the control signal DGS is high. The selected data is then outputted as the control data DM (19 bit).

With regards to the data controller 46 for this embodiment, as shown in FIG. 13, the first latch circuit 46a latches the period data DE on the clock CK1. This latch data DF then represents the period of the reference signal PREF encoded every time (i.e., every period of the reference signal PREF) at the pulse phase difference coder circuit 44. This data DF and the period data DE currently being outputted from the pulse phase difference coder circuit 44 are added together at the first adder 46b. The addition data DG outputted from the first adder 46b therefore corresponds to two times the period of the reference signal PREF so that if the control signal DGS is low, this data is outputted without modification as the control data DM.

On the other hand, the second latch circuit 46c latches the period data DD on the clock signal CK2 which is the frequency divided signal BOW delayed by a prescribed time period. The latch data DH is then simply the most recent data which expresses the period of time from the rise of the reference signal PREF until the rise of the frequency divided signal BOW (i.e., the phase difference). As this data DH is latched by the third latch circuit 46d on the clock signal CK2, the latch data DI from this third latch circuit 46d expresses the phase difference between the reference signal PREF encoded every time at the pulse phase difference coder circuit 44 and the frequency divided signal BOW. It follows that the addition data DJ outputted from the second adder 46e as a result of adding together the latch data DH and the latch data DI is therefore data which expresses the phase difference between the reference signal PREF and the frequency divided signal BOW added together for the previous two times.

This addition data DJ is subtracted at the subtractor 46f from the addition data DG corresponding to two times the period of the reference signal PREF outputted from the first adder 46b with its lowest bit removed, i.e., data which expresses the period ($2\pi$ radians) of one cycle of the reference signal obtained by dividing the addition data DG by half. The data DK for after this addition has been carried out is then added to the addition data DG at the third adder 46g.

The addition data DK outputted from the third adder 46g is a value resulting from subtracting the phase difference between the reference signal PREF occurring every two periods of the reference signal PB and the frequency divided signal BOW from three periods ($6\pi$ radians) of the reference signal. If the phase difference between the reference signal PREF and the frequency divided signal BOW is controlled to be a target value of $\pi$, the addition data DK outputted from the third adder 46g expresses a duration of two periods ($4\pi$ radians: $6\pi - \pi - \pi$) of the reference signal. If the phase difference is just $\Delta T$ greater than $\pi$, the addition data DK is an amount subtracting the extent of the shift in the phase ($2\Delta T$) for the past two times from the time of two periods ($4\pi$) of the reference signal. Alternatively, if the phase difference is just $\Delta T$ smaller than $\pi$, the addition data DK is an amount adding the extent of the shift in the phase ($2\Delta T$) for the past two times to the time of two periods ($4\pi$ radians) of the reference signal.

If the control signal DGS outputted from the PLL operation controller circuit 56 is low, data expressing two periods of the reference signal PREF is outputted from the data control area 46 as the control data DM. If the control signal DGS is high, data for expressing the time for compensating the extent to which the time for two periods of the reference signal PREF shifts from the target value of π for the value for the phase difference between the reference signal PREF and the frequency divided signal BOW for the past two times is outputted.

The control data DM outputted from the data control area 46 is divided by the externally inputted divisor data DV at the divisor unit 48. Values below the radix point are inputted to the data distributor circuit 50 as the lower bit data DP and values above the radix point are outputted to the data latch circuit 52 as the upper bit data DQ.

The control data DM outputted from the data control area 46 is data which corresponds to two periods of the reference signal PREF. The upper bit data DQ (18 bit) obtained by the divisor unit 48 is data which expresses the period of the output signal POUT as the time resolution of the time Td which is half of the phase difference Tg between the multi-phase clocks R1 to R16 outputted from the ring oscillator 42. The upper seventeen bits express the phase difference Tg between the multi-phase clocks R1 to R16 as a time resolution.

The data distributor circuit 50 which receives the lower bit data DP from the divisor unit 48 corresponds to the pulse generator apparatus in this invention. Substantially the same way as in the pulse generator apparatus 20 and 30 in the above embodiments, this data distributor circuit 50 is equipped with a ten bit register 50a for latching the lower bit data DP (10 bit) inputted from the divisor unit 48, a selector row 50b made up from ten multiplexors (MUXS) corresponding to each bit of the lower bit data DP latched at the register 50a and a ten bit downcounter 50c for outputting selection signals for each of the multiplexors in the selector row 50b.

Each of the multiplexors (MUX) in the selector row 50b have two input terminals, a first input terminal and a second input terminal. Each bit of data for the lower bit data latched at the register 50a is inputted to the first input terminals of these input terminals.

At each of the multiplexors, if the selection signal outputted from the downcounter 50c is high, each bit of data for the lower bit data DP inputted at the aforementioned first input terminal is selected and outputted. If the selection signal is low, the data inputted at the second input terminal is selected and outputted.

The second input terminal of the multiplexer for which the first input terminal receives the LSB (DP1) of the lower bit data DP (10 bit) is connected to ground so as to always register the level zero. The second input terminals of the remaining nine multiplexors which receive the data from the second bit data (DP2 to DP10) onwards of the lower bit data at their first terminals then take the output signals from multiplexors which receive data which is one bit lower as input without modification. The output signal from the multiplexor which receives the MSB (DP10) of the lower bit data DP is then inputted to a latch circuit 50f which latches this signal and then outputs it to the data latch circuit 52 as the select signal CDS.

The multiplexor from amongst the ten multiplexors which receives the LSB (DP1) of the lower bit data DP takes as input the count value for the MSB (Q10) of the downcounter 50c as its selection signal. On the other hand, the count value for the LSB (Q1) from the downcounter 50c is inputted to the multiplexor which receives the MSB data (DP10) of the lower bit data DP. This is to say that the multiplexors which receive bit positions for the lower bit data DP have selection signals inputted for higher order count values from the downcounter 50c.

The output signal POUT, which is the multiplied version of the reference signal PREF outputted from the aforementioned PLL apparatus (or the DCO circuit 54) is inputted to the register 50a, the downcounter 50c and the latch circuit 50f as the operation clock signal.

The downcounter 50c can generate the frequency divided signal BOW, which is the output signal POUT frequency divided by the divisor, without requiring a specialized frequency dividing circuit. The divisor data DV, which expresses the divisor for the reference signal PREF is then inputted to the data input terminals of the downcounter 50c via the MUX 50d.

After the data distributor circuit 50 has been activated, the MUX 50d sets the value (DV/2) which is half of the divisor data DV in the downcounter 50c for the first time only. The output signal POUT then outputs the frequency divided signal BOW on the outputting of each half period of the reference signal PREF. Control is then carried out so that the phase difference between the reference signal PREF and the frequency divided signal BOW is half of the period of the reference signal PREF (π). Then, when the control signal PT outputted from the PLL operation controller circuit 56 is high, a value equal to half of the divisor data DV (specifically, the divisor data DV is shifted by one bit in the lower order direction and the LSB is removed to give 9 bit divisor data) is inputted to the data input terminal of the downcounter 50c. When the control signal PT is low, the divisor data DV (10 bit) is inputted to the data input terminal of the downcounter 50c without modification.

At the PLL operation controller circuit 56, the control signal PT is controlled to be a high level after the activation value for the aforementioned apparatus. An operation start signal PSTB is then externally inputted and the control signal PT then falls to be a low signal when the reference signal PREF rises and is inputted to the data distributor circuit 50 and the DCO circuit 54.

The frequency divided signal BOW is generated when the count value for the downcounter 50c becomes "1", as shown in FIG. 15. This frequency divided signal BOW is then inputted to the reset terminal RST of the downcounter 50c via the or gate OR1. The control signal PT is also inputted at this or gate OR1.

The downcounter 50c takes in the divisor data DV as input via the MUX 50d until the control signal PT falls after the activation of the aforementioned apparatus and from resetting when the count value becomes "1" until the rise of the next output signal POUT.

Also, the output from the or gate OR1 which performs an OR operation on the frequency divided signal BOW and the control signal PT is outputted to the data latch circuit 52 as the timing signal DLS and is also outputted as the selection signal for the MUX 50e set up in the input path for the lower bit data inputted to the register 50a.

The MUX 50e selects the lower bit data DP and inputs it to the register 50a when the output from the or gate OR1 is high, i.e., only until the control signal PT falls after activation and when the frequency divided signal BOW is being outputted. When the output from the OR gate OR1 is low, i.e., when the downcounter 50c is counting, the MUX 50e selects the lower bit data DP already latched by the register 50a and inputs it to the register 50a.

The MUX 50e is set up so that the select signal CDS is not changed accordingly even if the lower bit data DP changes between one frequency divided signal BOW being outputted and the outputting of the next frequency divided signal.

With the data distributor circuit 50 for this embodiment constructed in this way, as shown in FIG. 15, when the binary data [0000001010] which expresses a value of 10 for the divisor data DV is inputted, a value which is half, i.e., 5, of the value for the divisor data DV is set up at the downcounter 50c at the operation initialization where the control signal PT falls. The frequency divided signal BOW is then outputted from the downcounter 50c when the count value follows the downcounting of the output signal POUT so as to become 1.

The value 10 for the divisor data DV is then set to the downcounter 50c on the following rise of the frequency divided signal BOW. The downcounting operation for the output signal POUT is then repeated in the order of downcounting the output signal POUT, ouptutting the frequency divided signal BOW and taking in the divisor data DV.

On the other hand, the multiplexors which make up the selector row 50b select data from the register 50a at periods which are slightly shorter than those for the selectors which receive the upper bit data in the same way as for the aforementioned first and second embodiments to correspond with the count value for the downcounter 50c.

To achieve this, signals which are to become high levels are outputted from the selector row 50b at a frequency which corresponds with the lower bit data values. In FIG. 15, the lower bit data DP is [1001000011]. When the value 10 is expressed as the divisor data which expresses the divisor, a signal in which the level varies in accordance with [L-H-H-H-L-H-L-H-L-H] is outputted to correspond to the lower bit data DP (in this case, the upper four bit portion [1001]) for every ten output pulses POUT.

This signal is then latched by the latch circuit 50f on the rise of the next output signal POUT before being outputted to the data latch circuit 52 as the select signal CDS. The output from the or gate OR1 which ORs together the frequency divided signal BOW and the control signal PT is also outputted to the data latch circuit 52 as the timing signal DLS.

Figure 16:
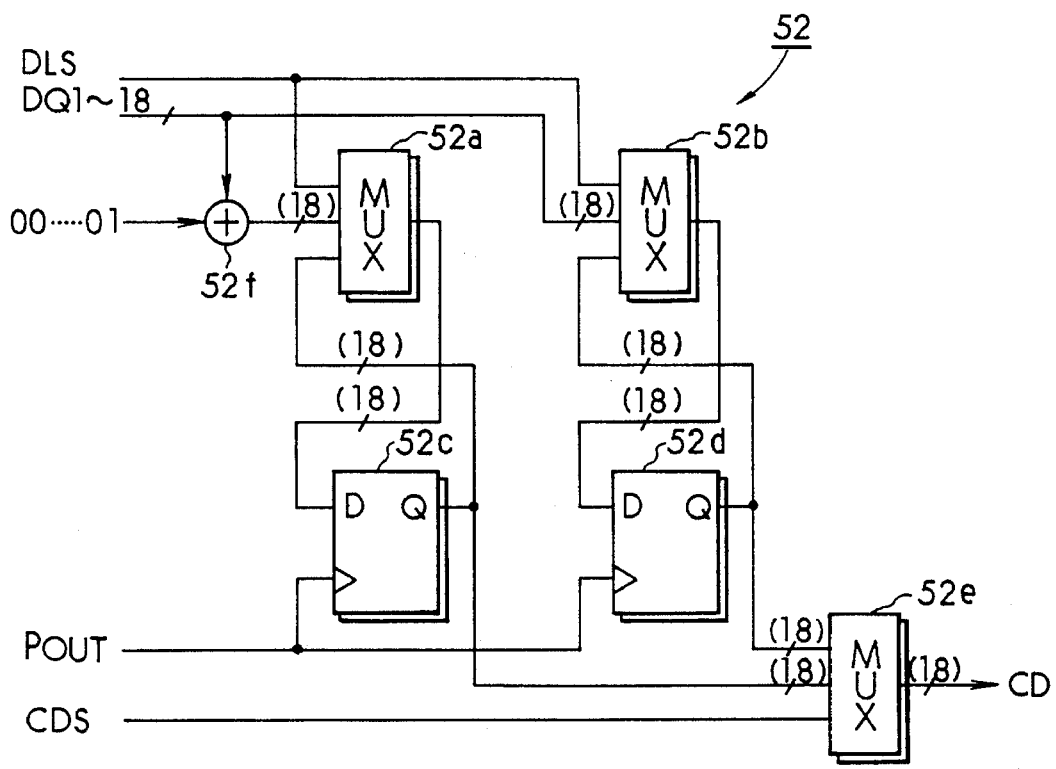
FIG. 16 is a circuit diagram showing the structure of a data latch circuit in the third embodiment.

Next, the data latch circuit 52 will be described using FIG. 16. The data latch circuit 52 is constructed from an adder 52f, a first MUX 52a, a second MUX 52b, a first latch circuit 52c, a second latch circuit 52d and a third MUX 52e. The adder 52f adds one to the upper bit data DQ outputted from the divisor unit 48. The first MUX 52a selects and outputs the data DQ+1 outputted from the adder 52f when the timing signal DLS outputted from the data distributor circuit 50 is high. The second MUX 52b selects and outputs the upper bit data DQ from the divisor unit 48 when the same timing signal DLS is high. The first latch circuit 52c latches the output from the first MUX 52a on the rise of the output signal POUT and selects this data as the data selected by the first MUX 52a when the timing signal DLS is low and outputs this data to the first MUX 52a. The second latch circuit 52d latches the output from the second MUX 52b on the rise of the same output signal POUT, takes this latched data as the data selected by the second MUX 52b when the timing signal DLS is low and outputs this data to the second MUX 52b. The third MUX 52e receives the data outputted from the first latch circuit 52c and the second latch circuit 52d. The third MUX 52e then selects the output data from the first latch circuit 52c when the select signal CDS outputted from the data distributor circuit 50 is high and selects the data outputted from the second latch circuit 52d when the select signal CDS is low. The data selected by the third MUX 52e is then taken as the aforementioned frequency control data CD and outputted to the DCO circuit 54.

The data latch circuit 52 in this embodiment corresponds to the constant adder 12 and the selector 14 in the first and second embodiments. Referring to FIG. 17, the upper bit data DQ and the upper bit data with one added, DQ+1, are latched into the second MUX 52b and the first MUX 52a in synchronization with the taking in of the lower bit data at the register 50a in the data distributor circuit 50. This is achieved by inputting on the timing signal DLS used for taking the lower bit data in at the register 50a of the data distributor circuit 50. This data is then latched again at the second latch circuit 52d and the first latch circuit 52c so that the data outputted from the second latch circuit 52d and the first latch circuit 52c is in synchronization with the select signal CDS outputted from the latch circuit 50f of the data distributor circuit 50. Frequency control data CD for changing from the data DQ to the data DQ+1 is then generated at a frequency corresponding to the lower bit data DP by selecting the upper bit data DQ or this data with one added, DQ+1, outputted from the second latch circuit 52d and the first latch circuit 52c in synchronization with the select signal CDS at the third MUX 52e.

Next, the DCO circuit 54 which generates the output signal POUT at a period corresponding to the frequency control data CD outputted from the data latch circuit 52 using the multi-phase clocks R1 to R16 outputted from the ring oscillator 42 will be described.

Figure 18:
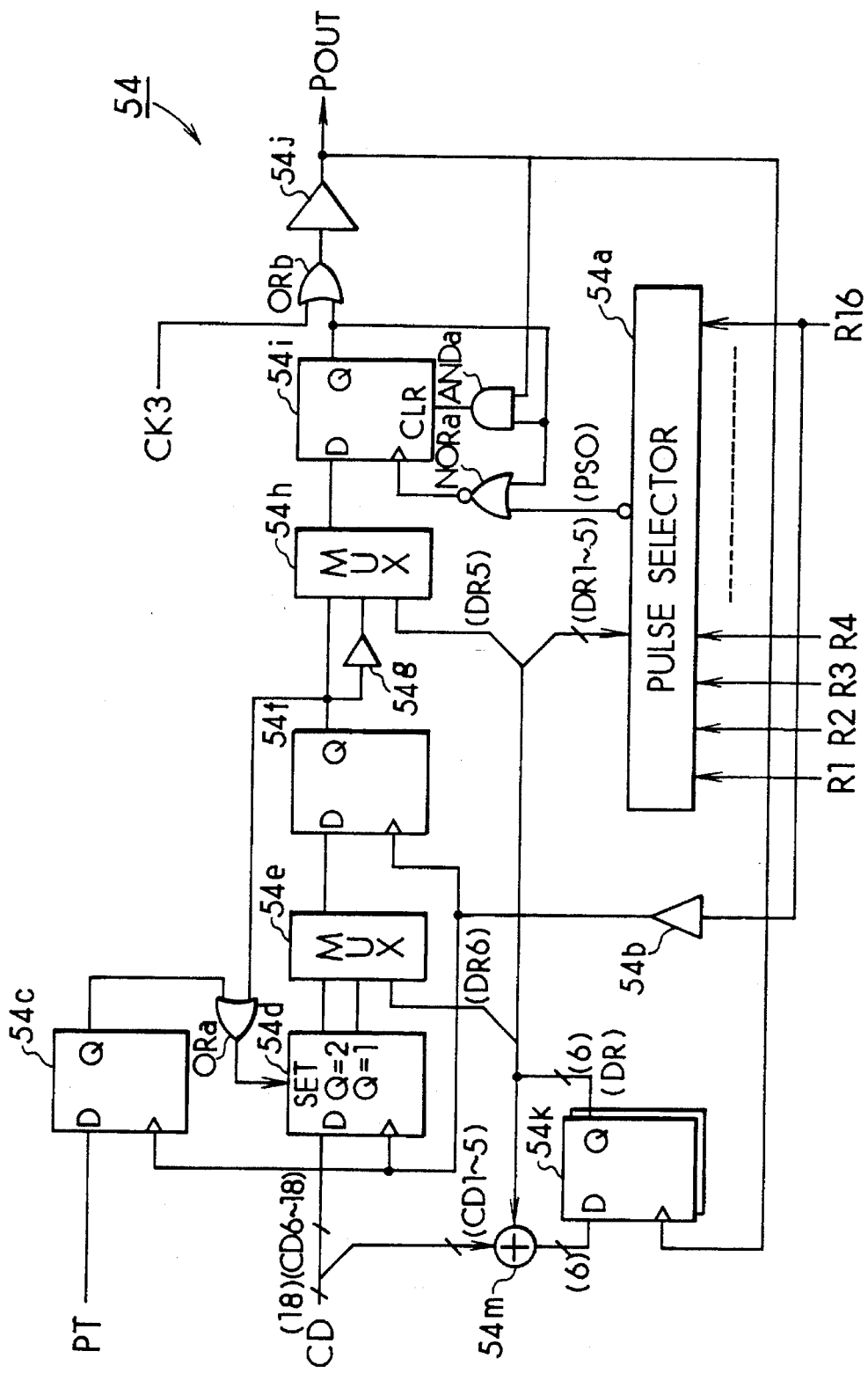
FIG. 18 is a circuit diagram showing the structure of the digitally controlled oscillating circuit in the third embodiment.

Referring to FIG. 18, the DCO circuit 54 in this embodiment is equipped with a pulse selector 54a which receives the multi-phase clocks R1 to R16 from the ring oscillator 42 and then selects clock signals corresponding to the upper four bits (DR2 to DR5) of the selector data DR (5 bit). If the LSB (DR1) of the select data DR is low, a signal which is an inverted version of this selected clock signal is outputted as the select signal PSO. Alternatively, if the LSB (DR1) of the select data DR is high, the selected clock signal is delayed by a period of time corresponding to the delay time of the circuits which make up the ring oscillator 42 with this inverted signal then being outputted as the select signal PSO.

The DCO circuit 54 is equipped with a thirteen bit downcounter 54d, a first latch circuit 54k, an adder 54m, a first MUX 54e, a second latch circuit 54f, a third latch circuit 54c, an or gate ORa, a first delayer 54b, a second delayer 54g, a second MUX 54h, a clear terminal latch circuit 54i, an and gate ANDa, a NOR gate NORa, an or gate ORb and an amplifier 54j. The downcounter 54d presets the upper thirteen bits (CD6 to CD18) of the 18-bit frequency control data CD inputted from the data latch circuit 52 as data for counting and carries out downcounting on the rise of the clock signal R16 outputted from the ring oscillator 42. The first latch circuit 54k latches input data on the rise of the output signal POUT and outputs this latched data as the whole six bits of selector data DR (DR1 to DR6). The adder 54m adds the latched data from the first latch circuit 54k and the lower five bits (CD1 to CD5) of the 18-bit frequency control data CD inputted from the data latch circuit 52 and inputs the result to the first latch circuit 54k. The first MUX 54e selects the signal outputted from the downcounter 54d when the count value has become "1" when the MSB (DR6) of the 6-bit select data DR outputted from the first latch circuit 54k is "1", and selects the signal outputted from the downcounter 54d when the count value has become "2" if the MSB (DR6) of the is "0". The second latch circuit 54f latches the output signal from the first MUX 54e on the rise of the output signal POUT. The third latch circuit 54c latches the control signal PT on the rise of the output signal POUT.

The or gate ORa performs an OR operation on the signals outputted from the second latch circuit 54f and the third latch circuit 54c and then outputs the resulting signal as the set signal for the downcounter 54d. The first delayer 54b delays the multi-phase clock R16 inputted from the ring oscillator 42 by a delay at least equal to the operating time of the first latch circuit 54k and then outputs this delayed signal to the downcounter 54d, the third latch circuit 54c and the second latch circuit 54f.

The second delayer 54g delays the output signal from the second latch circuit 54f by just the amount of time that it takes the pulse signal to go half-way round the ring oscillator 42. The second MUX 54h selects the output from the second delayer 54g when the MSB of the lower 5-bit portion of data DR1 to DR5 inputted at the pulse selector 54a from the six-bit select data DR outputted from the first latch circuit 54k is low, and selects the output from the second latch circuit 54f when the MSB DR5 is high. The clear terminal latch circuit 54i latches the output from the second MUX 54h. The and gate ANDa performs an and operation on the output from the clear terminal latch circuit 54i and the output signal POUT and inputs the result to the clear terminal of the clear terminal latch circuit 54i. The nor gate NORa performs a nor operation on the output from the clear terminal latch circuit 54i and the select signal PSO from the pulse selector 54a and inputs the result to the clear terminal latch circuit 54i as a clock signal for latching. The or gate ORb then performs an or operation on the output signal from the clear terminal latch circuit 54i and the clock signal CK3 outputted from the PLL operation controller circuit 56, with the output resulting from this operation then being amplified and externally outputted as the output signal POUT by the amplifier 54j.

The clock signal CK3 inputted to the or gate ORb is outputted from the PLL operation controller circuit 56 in synchronization with the reference signal PREF when the control signal PT is high.

Next, the operation of the DCO circuit 54 constructed in the above way will be described.

First, the control signal PA inputted to the ring oscillator 42 goes high and the pulse signal starts to go around the ring oscillator 42. The multi-phase clocks R1 to R16 from the ring oscillator 42 are inputted to the DCO circuit 54 and the delayed version of the clock signal R16 is inputted to the third latch circuit 54c, the downcounter 54d and the second latch circuit 54f as an operating clock. On the other hand, directly after the aforementioned apparatus has been activated, the control signal PT is high. The third latch circuit 54c then uses this clock signal to latch the high level control signal PT and the outputs of the downcounter 54d, the first MUX 54e, the second latch circuit 54f, the second MUX 54h and the clear terminal latch circuit 54i are all kept low so that the set terminal of the downcounter 54d may be kept high. It follows that if the control signal PT is then high, then just the clock 3 from the PLL operation controller circuit 56 inputted at the OR gate ORb is outputted from the DCO circuit 54 as the output signal POUT.

If, after this, the control signal PT falls, the output from the third latch circuit 54c goes low in synchronization with the next clock signal R16. The downcounter 54d then counts down while the clock signal R16 is inputted, taking the value (Q0 in the figures) for the upper thirteen-bit portion (CD6 to CD18) of the frequency control data CD as initialization data.

On the other hand, the first latch circuit 54k latches the data from the adder 54m on the rise of the output signal POUT. Then, after activation of the aforementioned apparatus, the output of the clear terminal latch circuit 54i is maintained at a low level until the control signal PT falls. During this time, the clock signal CK3 inputted from the PLL operation controller circuit 56 in synchronization with the reference signal PREF is outputted without modification from the DCO circuit 54 as the output signal POUT. It therefore follows that until the control signal falls, the first latch circuit 54k latches the output of the adder 54m on the rises of the clock signal CK. After activation, the first latch circuit 54k does not latch any data at all when the initial clock signal CK is inputted. The output from the adder 54m then becomes the lower five bits (CD1 to CD5) of the frequency control data CD so that the output of the first latch circuit 54k is then the 6-bit select data DR, which is the five bit data (CD1 to CD5) with the value "0" added on as the MSB (i.e. "0" will become the sixth bit).

Figure 19:
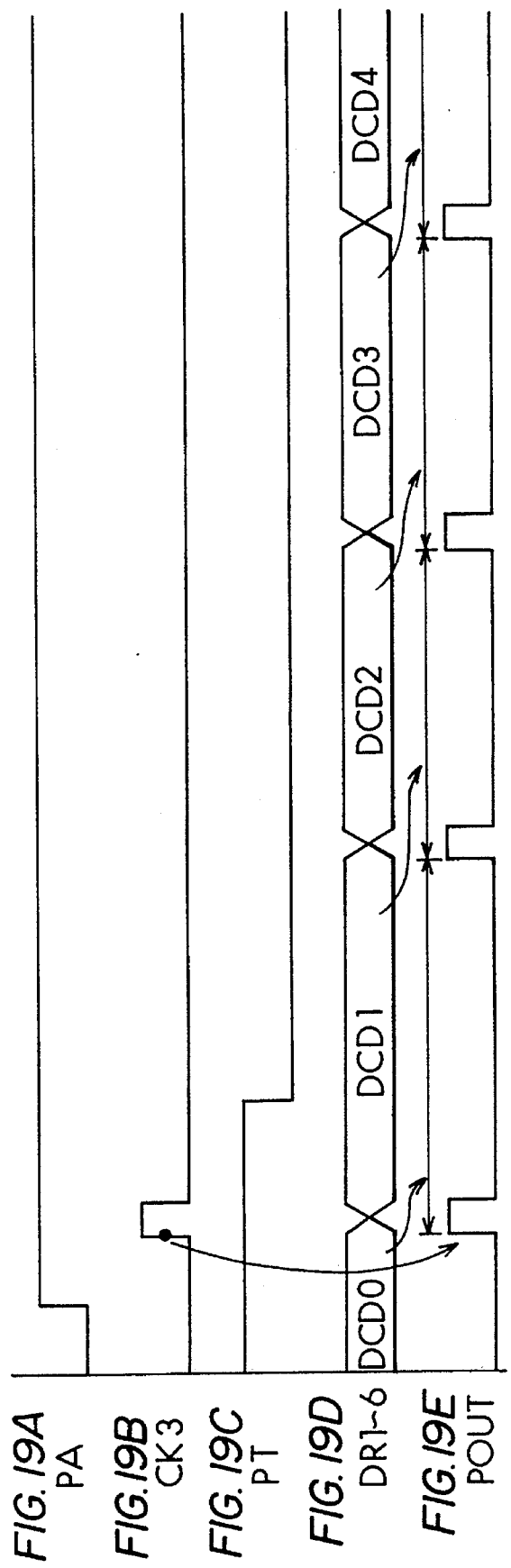
FIG. 19 is a timing diagram showing the operation of the digitally controlled oscillating circuit in FIG. 18.

Referring to FIG. 19, after activation of the aforementioned apparatus, the lower 5-bit portion (CD1 to CD5) of the frequency control data CD which expresses the period of the output signal POUT, which up until the point where the clock signal CK3 is inputted in synchronization with the reference signal PREF has been being encoded at the data control area 46 and been being divided by the divisor at the divisor unit 48, is latched at the first latch circuit 54k as the select data DR. Then, on the fall of the control signal PT, the downcounter 54d starts downcounting in accordance with the clock signal R16 from the ring oscillator 42 taking the upper 13 bits (CD6 to 18) of the frequency control data CD as its initial value.

Next, if the value for the MSB (DR6) of the select data DR outputted from the first latch circuit 54k is "1", the first MUX 54e outputs a high level signal when the count value for the downcounter 54d is "1". If the value for the MSB (DR6) of the select data DR is 0, the first MUX 54e outputs a high level signal when the count value for the downcounter 54d is "2". Also, the signal outputted from the first MUX 54e in this way is latched by the second latch circuit 54f on the rises in the clock signal R16 outputted by the ring oscillator 42. Therefore, the signal outputted from the second latch circuit 54f is simply the signal outputted from the first MUX 54e delayed by the period of one revolution (16×Tg=32×Td) of the pulse signal within the ring oscillator 42.

When the apparatus activates, the clock signal CK3 is inputted in synchronization with the reference signal PREF and the downcounter 54d starts downcounting on the falling edge of the control signal PT, and the output from the third MUX 52e goes high when the count value for the downcounter 54d becomes "2". After this, the output from the second latch circuit 54f goes high on one revolution of the ring oscillator 42 (i.e., the time when the count value for the downcounter 54d becomes 1). The upper thirteen bits of the frequency control data CD are then set anew in the downcounter 54d when the output for the second latch circuit 54f goes high.

When a high level signal is then outputted from the second latch circuit 54f, the second delayer 54g delays this signal by the time necessary for the pulse signal to go half way around the ring oscillator 42. The second MUX 54h then selects the output signal from the second delayer 54g when the MSB DR5 of the lower five-bit portion of data DR1 to DR5 inputted at the pulse selector 54a from the select data DR is low, and selects the output from second latch circuit 54f when the MSB DR5 is high.

On the other hand, the pulse selector 54a selects clock signals to correspond with the value expressed by the data (DR5 to DR2), i.e., if the data for the second upper bit down to the second lower bit (DR2 to DR5) of the select data DR outputted from the first latch circuit 54k expresses the value 1 [0001], the clock signal R1 from the ring oscillator 42 is selected, and if the data (DR2 to DR5) expresses the value 15 [1111], the clock signal R15 is selected. Also, if the LSB R1 of the select data DR is "1", the clock signal delayed by the period Td, which is the time taken for the inverting operation of each of the inverting circuits in the ring oscillator 42 to perform the inverting operation, is taken as the clock signal, inverted, and outputted as the select signal PSO. If the LSB R1 is "0", however, the selected clock signal is inverted and outputted as the select signal PSO.

After the control signal PT falls, the clock signal R16 is only counted at the downcounter 54d by a number corresponding to the upper 13 bits (CD6 to CD18) of the frequency control data CD. A high level signal is then outputted from the second MUX 54h and the output from the clear terminal latch circuit 54i then goes high when the select signal PSO is outputted from the pulse selector 54a. This signal is then outputted via the or gate ORb and the amplifier 54j as the output signal POUT.

In this embodiment, when the fifth upper bit (DR5) of the select data DR (6-bit) is a high level, which means that the pulse selector 54a selects the output signals R1 to R8, the output signal for the second latch circuit 54f is selected at the second MUX 54h. Conversely, when the fifth upper bit (DR5) of the select data DR (6-bit) is a low level, which means that the pulse selector 54a selects the output signals R9 to R16, the output signal from the second delayer 54g, which is a delayed version of the output signal from the second latch circuit 54f is selected at the second MUX 54h. This is because the output from the clear terminal latch circuit 54i is unstable if the input data changes in the region of the latch timing of the clear terminal latch circuit 54i. So, when the pulse selector 54a selects the clock signals R1 to R8, a signal for which the input data is always stable in the region of the latch timing for the clear terminal latch circuit 54i is selected as the output of the second latch circuit 54f for the second MUX 54h. On the other hand, when the output signals R9 to R16 are selected at the pulse selector 54a, input data which is always fixed in the region of the latch timing of the clear terminal latch circuit 54i is selected by the second MUX 54h selecting the output from the second delayer 54g.

In this embodiment, the pulse selector 54a selects a clock signal from the clock signals R1 to R16 outputted from the ring oscillator 42 in accordance with the upper second bit to the lower second bit of data (DR5 to DR2) from within the select data DR outputted from the first latch circuit 54k. If the LSB (DR1) of the select data DR is "0", the selected clock signal is inverted without modification. Alternatively, if the LSB (DR1) of the select data DR is "1", the selected signal is delayed by the period of time (Td) which it takes an inverting circuit within the ring oscillator 42 to perform the inverting operation, inverted, and then outputted as the select signal PSO. This is so that the upper seventeen bits (DQ2 to DQ18) of the upper bit data DQ(18 bit) generated at the divisor unit 48 become a value representing the time resolution of the phase difference Pg for the multi-phase clocks R1 to R16. The LSB (DQ1) is then a value which corresponds to half of this time resolution (i.e., Tg/2=Td).

The frequency control data CD (18 bit) is set up based on this upper bit data DQ. The time resolution for the LSB (CD1) of this frequency control data CD corresponds to the inversion operation time Td for the inversion circuits within the ring oscillator 42. In this embodiment, the controllable time resolution for the output signal POUT is set up by the time period Td which represents half of the phase difference Tg between the multi-phase clocks R1 to R16. Then, when the LSB (CD1) is "1", a clock signal corresponding to the second upper bit to the second lower bit of data (DR5 to DR2) of the select data DR is delayed by the inversion operation time (Td) for the inverting circuits within the ring oscillator 42.

Next, when the output from the clear terminal latch circuit 54i goes high and the output signal POUT from the or gate ORb and the amplifier 54j is outputted, a high level signal is inputted to the clear terminal of the clear terminal latch circuit 54i via the and gate ANDa so that the clear terminal latch circuit 54i is cleared and its output is inverted to a low level signal. The pulse width of the output signal POUT is then decided by the time it takes from the output of the clear terminal latch circuit 54i becoming high to the high level signal being inputted to the clear terminal of the clear terminal latch circuit 54i via the or gate ORb, amplifier 54j and the and gate ANDa, and the output of the clear terminal latch circuit 54i being inverted to a low level, i.e., the operating time for each part.

When the output signal POUT is outputted from the DCO circuit 54 after the control signal PT falls, the first latch circuit 54k latches the output from the adder 54m, which is the select data DR currently being outputted with the lower five bits (CD1 to CD5) of the frequency control data CD added on. The select data DR is then updated after this with the values DCD1, DCD2, ... which have the lower five bits of the frequency control data CD added, while the pulse signal POUT is being outputted.

As a result of this updating, the MSB (DR6) of the select data DR becomes "1" and the first MUX 54e outputs a high level signal when the count value for the downcounter 54d becomes "1". Then, after a period of time equal to one revolution of the ring oscillator 42 (i.e., when the count value for the downcounter 54d becomes "0"), the ring oscillator 42 outputs a high level signal.

The reason for this is that the downcounter 54d always carries out downcounting at a fixed period (16×Tg) by using the clock signal R16 outputted from the ring oscillator 42. When the clock signal selected by the first MUX 52a on the current occasion gets ahead of the clock signal selected on the previous occasion (i.e., when the value for the select data DR inputted at the pulse selector 54a (DR1 to DR5) becomes smaller than that for the previous time), the period of the output signal POUT is prevented from becoming shorter than the period of time taken for the pulse signal to go around the ring oscillator 42 once.

With the DCO circuit 54 for this embodiment, the upper 13 bits (CD6 to CD18) of the frequency control data CD (18 bit) count the number of times that the pulse signal goes around the ring oscillator 42. The clock signal R1 to R16 from the ring oscillator 42 are selected with the four bit data (DR2 to DR5), which is the select data DR (6 bit) with the lower five bits of the frequency control data CD sequentially added, with the MSB and LSB then being removed to give four bit data. When the LSB of the select data DR (DR1) is then "1", the clock signal is delayed by the inverting operation time Td for the inverting circuits. By then increasing or decreasing the count for the number of times the clock signal R16 has gone around using the MSB DR6 of the select data DR, the output signal POUT can be repeatedly outputted at a fixed period (CD×Td) decided by the frequency control data CD and the inversion operation time Td for the inverting circuits within the ring oscillator 42.

Next, the PLL operation controller circuit 56 for generating the clock signals CLK0 to CLK3, the internal clock PB and the control signals DGS and PT, etc., for controlling the operation timing of each of the circuits will be described.

Figure 20:
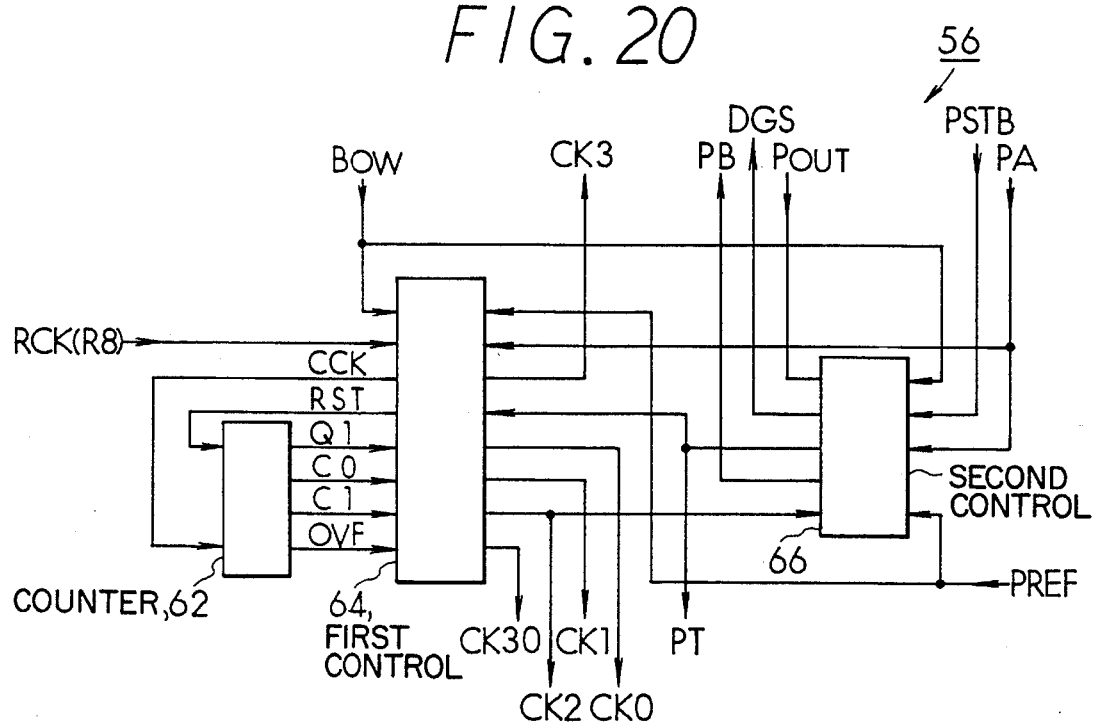
FIG. 20 is a circuit diagram showing the structure of the PLL operation controller circuit for the third embodiment.

As can be seen from FIG. 20, the PLL operation controller circuit 56 is constructed from a counter 62, a first controller 64 and a second controller 66.

The counter 62 is reset by a reset signal RST outputted from the first controller 64 and the construction of the counter 62 is centered around a seven bit counter 62a for carrying out a count operation using a reference clock CCK outputted from the first controller 64. It is also constructed from four nor gates, NOR1, NOR2, NOR3 and NOR4 and three nand gates NANDa, NANDb and NANDc. The nor gate NOR4 takes the sixth bit of data (Q6) and the fifth bit (Q5) from the seven bit counter 62a as its input. The nand gate NANDc takes the output from the nor gate NOR4 and the inversion of the fourth bit (Q4) for the seven bit counter 62a as its input. The nor gate NOR3 takes the output from the nand gate NANDc and the third bit of data (Q3) for the seven bit counter 62a as input. The nand gate NANDa takes the output from the nor gate NOR3 and the inversion of the two bit data (Q2) for the seven bit counter 62a as input. The nand gate NANDb takes the output from the nor gate NOR3 and the second bit of data (Q2) for the seven bit counter 62a as input. The nor gate NOR1 takes the output from the nand gate NANDa and the inversion of the LSB for the seven bit counter 62a as input and the nor gate NOR2 takes the output from the nand gate NANDb and the inversion of the LSB (Q1) o the seven bit counter 62a as input.

Figure 21:
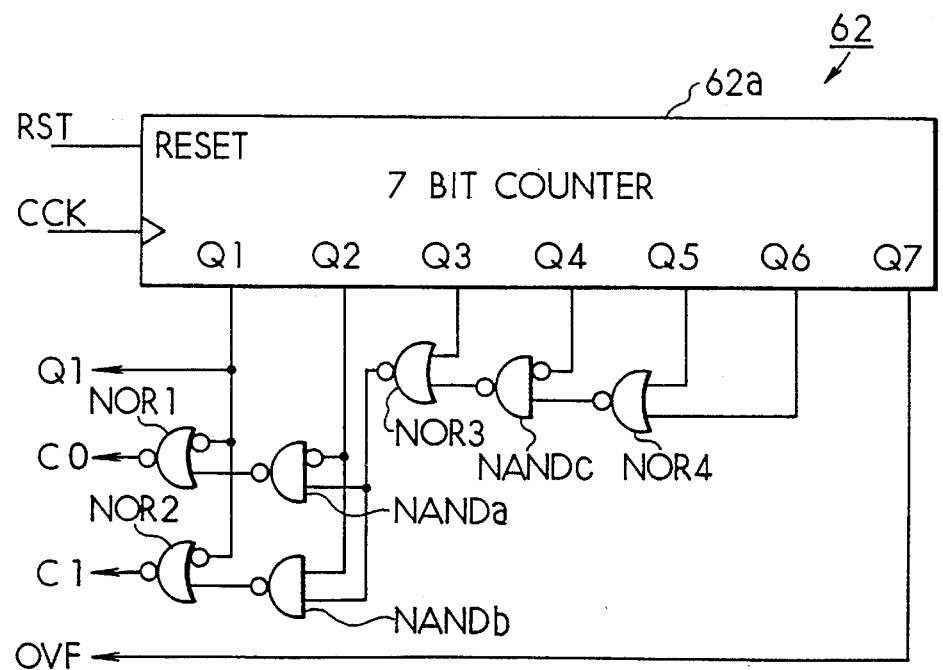
FIG. 21 is a circuit diagram showing the structure of the counter which makes up the PLL operation controller circuit.

With reference to FIG. 21, at the counter 62, the count operation of the seven bit counter 62a which uses the reference clock CCK starts when the reset signal RST inputted to the seven bit counter 62a falls.

Let the outputs of the nor gate NOR1 and the nor gate NOR2, into the inverting inputs of which the LSB (Q1) of the seven bit counter 62a is inputted, be considered. With the nor gate NOR1, the seven bit counter 62a starts counting, one pulse of the reference clock CCK is inputted, and the output of the nor gate NOR1 goes high when the count value for the seven bit counter 62a goes high. This signal is then outputted to the first controller 64 as the clock signal CO. With the nor gate NOR2, the count operation of the seven bit counter 62a starts, three pulses of the reference clock CCK are taken as input and the output of the nor gate NOR2 goes high when the count value for the seven bit counter 62a becomes "3". This signal is then outputted to the first controller 64 as the clock signal C1.

This is also inverted upon every inputting of the reference clock CCK by the counting operation of the seven bit counter 62a. The LSB (Q1), which is high when the number of pulses of the reference clock CCK which have been inputted is odd, is outputted without modification to the first controller 64 as the clock signal Q1. If 65 pulses of the reference clock CCK are inputted, the MSB (Q7) for the seven bit counter 62a is inverted to a high level and outputted to the first controller 64 as the overflow signal OVF.

At the counter 62, the clock signals C0 and C1 and the overflow signal OVF, which are timing signals which correspond to the amount of time which has passed since the reset signal outputted from the first controller 64 fell, are generated as a result of the counting of the reference clock CCK along with a clock signal Q1 which inverts in synchronization with the reference clock CCK.

Figure 23:
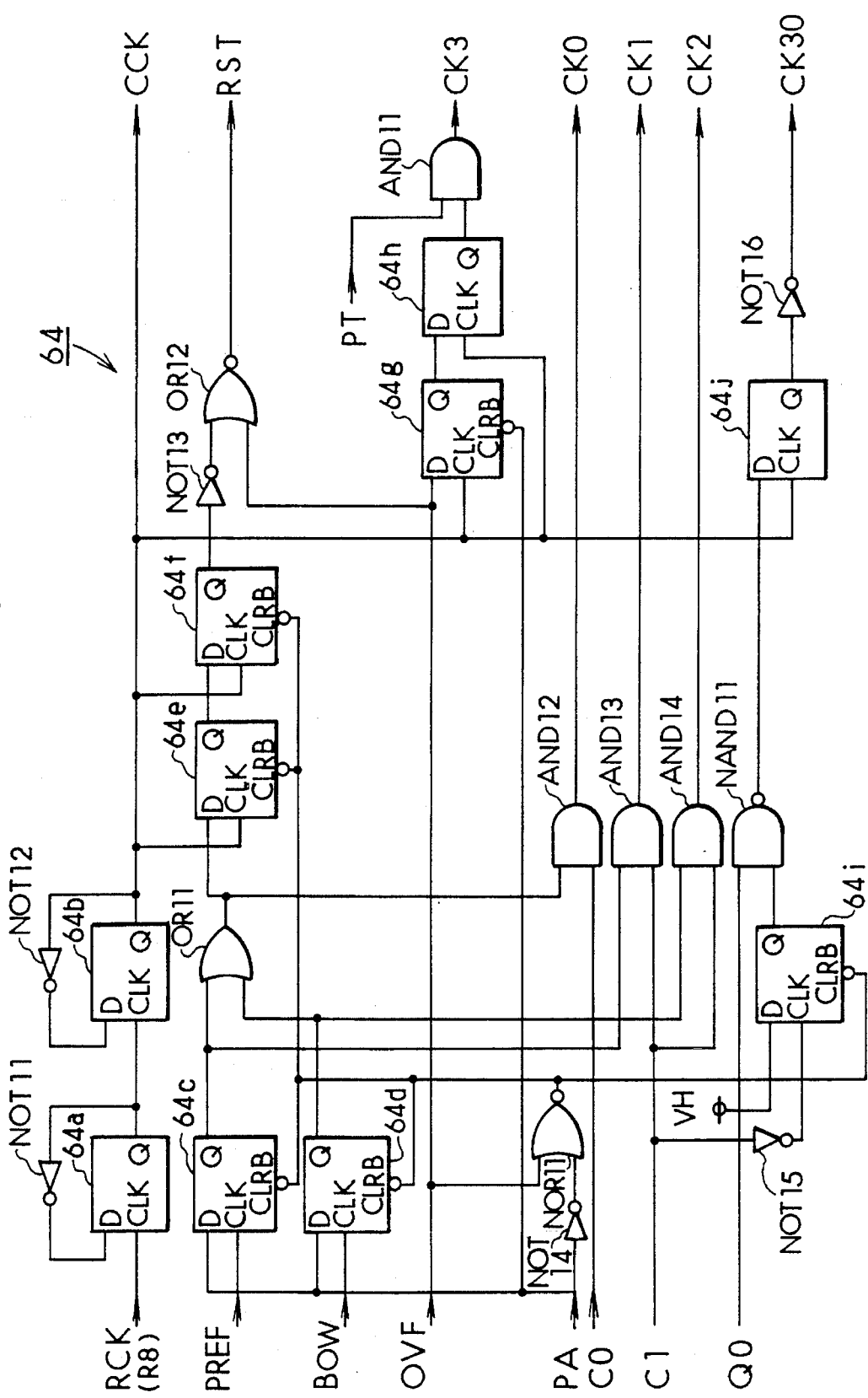
FIG. 23 is a circuit diagram showing the structure of the first controller which makes up the PLL operation control circuit.

As can be seen in FIG. 23, the first controller 64 receives an arbitrary clock signal RCK from within the multi-phase clock signals R1 to R16 outputted from the ring oscillator 42. The first controller 64 is equipped with latch circuit 64a which latches it's own output at its inverting input using an inverter NOT11 and a latch circuit 64b which latches its own output at it's inverting input using an inverter NOT12. The output from the latch circuit 64b is then outputted to the counter 62 as the reference signal CCK., i.e., a reference signal CCK which is a quartered version of the clock signal RCK (R8 from the ring oscillator) is generated at the first controller 64 using these latches 64a and 64b.

The first controller 64 is also equipped with a latch circuit 64c for latching the control signal PA using the reference signal PREF as an operating clock signal; a latch circuit 64d for latching the control signal PA using the frequency divided signal BOW as an operating clock signal; an or gate OR11 which takes the outputs from each of the latches 64c and 64d as input signals; a latch circuit 64e which receives the reference clock CCK outputted from the latch circuit 64b at its clock terminal and latches the output from the or gate OR11; a latch circuit 64f which latches the output from the latch circuit 64e using the same reference clock CCK; an inverter NOT13 which inverts the output of the latch circuit 64f and an or gate OR12 which takes the output from the inverter NOT13 and the overflow signal OVF from the counter 62 as input. The output from this or gate OR12 is then taken as the reset signal RST for the seven bit counter 62a and outputted to the counter 62.

There is also a latch circuit 64g which receives the reference clock CCK outputted from the latch circuit 64b and latches the overflow signal OVF from the counter 62; a latch circuit 64h which latches the output from the latch circuit 64g using the reference clock CCK; an and gate AND1 which takes the output from the latch circuit 64h and the control signal PT generated at the second controller 66 as input signals; an and gate AND12 which takes the clock signal C0 outputted from the counter 62 and the output from the or gate OR1 as input signals; an and gate AND13 which takes the clock signal C1 outputted from the counter 62 and the output from the latch circuit 64d as input signals and an and gate AND14 which takes the clock signal C1 outputted from the counter 62 and the output from the latch circuit 64d as input signals. The output from the and gate AND11 is then outputted as the clock signal CK3, the output from the and gate AND12 is outputted as the clock signal CK0 and the output from the and gate AND14 is outputted as the clock signal CK2. The latch circuit 64g is also equipped with a clear terminal CLRB, at which an inverted version of the control signal PA is taken as input. If the control signal PA is low and the pulse signal has not started to go around the ring oscillator 42, the latch circuit 64g is cleared. If, however, operation of the ring oscillator commences, the latch circuit 64g is operable.

There is also an inverter NOT14 which takes the control signal PA as input and a nor gate NOR11 which takes the overflow signal OVF outputted from the counter 62 and the output signal from the inverter NOT14 as input signals. The output from the nor gate NOR11 is inverted at the clear terminals CLRB of each of the latches 64c, 64d, 64e and 64f and then taken as the clear signal for each of these latches. A low level for the control signal PA when the pulse signal has not started to go around the ring oscillator 42 or when the count operation for the seven bit counter 62a has started and this count value has reached 65 means that each of the latches 64c, 64d, 64e and 64f are cleared.

The first controller 64 is also equipped with an inverter NOT15 for inverting the clock signal C1 outputted from the counter 62; a latch circuit 64i for latching a high level reference voltage VH taking the output from the inverter NOT15 as an operation clock signal, a nand gate NAND11 which takes the output from the latch circuit 64i and the clock signal Q1 outputted from the counter 62 as input signals; a latch circuit 64j which latches the output from the nand gate NAND11 using the reference clock CCK and an inverter NOT16 which inverts the output from the latch circuit 64j. The output from the inverter NOT16 is outputted to the divisor unit 48 as the operation clock CK30.

Figure 24:
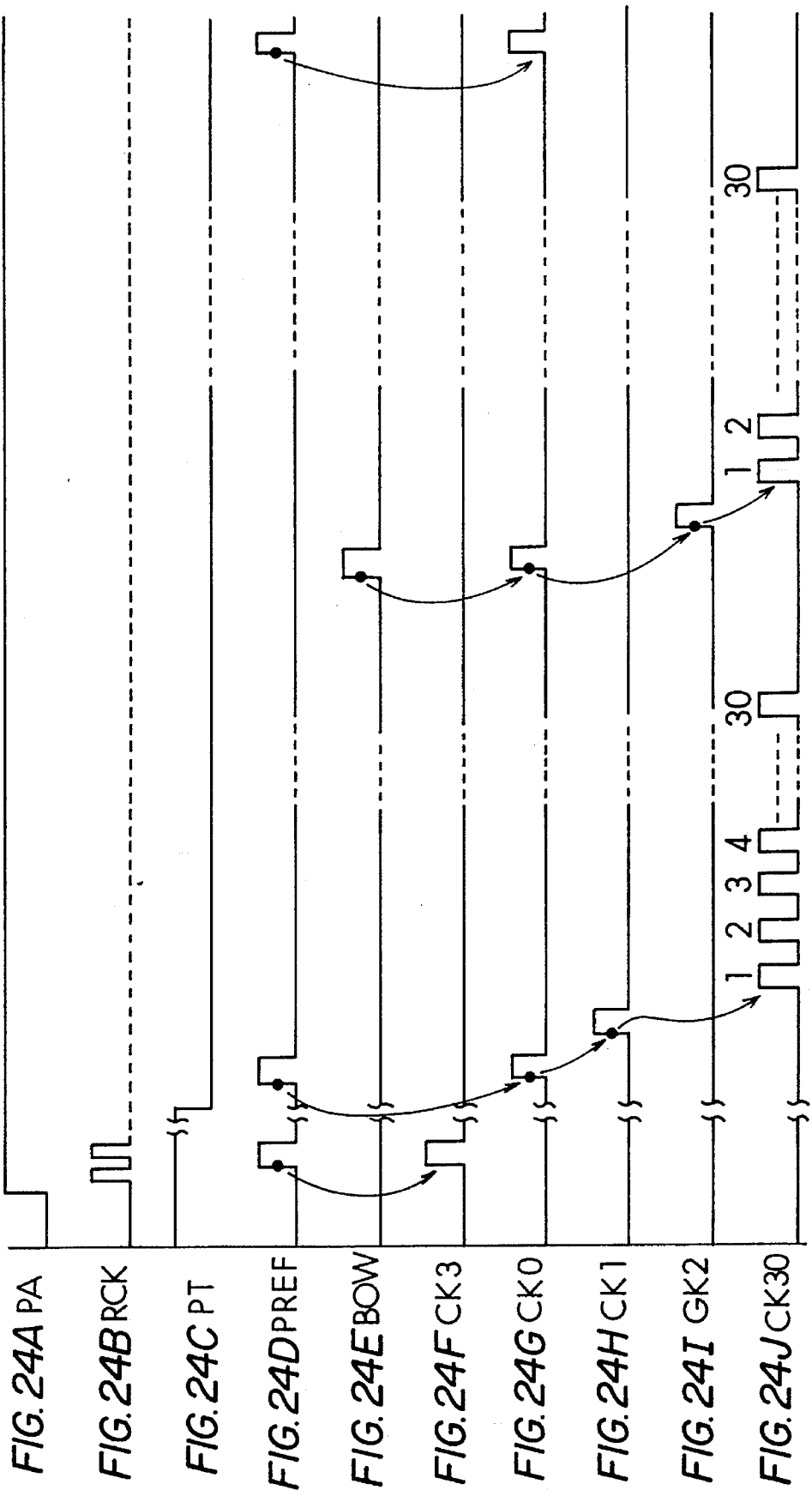
FIG. 24 is a timing diagram showing the operation of the first controller in FIG. 23.

As shown in FIG. 24, with the first controller 64 having this kind of construction, the control signal PA goes high and the pulse signal starts to go around the ring oscillator 42. The reference clock CCK which is the clock signal RCK divided by four is then generated when the clock signal RCK is inputted from the ring oscillator 42. Then, until the control signal PT generated by the second controller 66 to be described later falls, the clock signal CK3 is outputted from the and gate AND11 in synchronization with the reference signal PREF as a result of this reference clock CCK and if the control signal PT then falls, the outputting of the clock CK3 will be prohibited.

Figure 22:
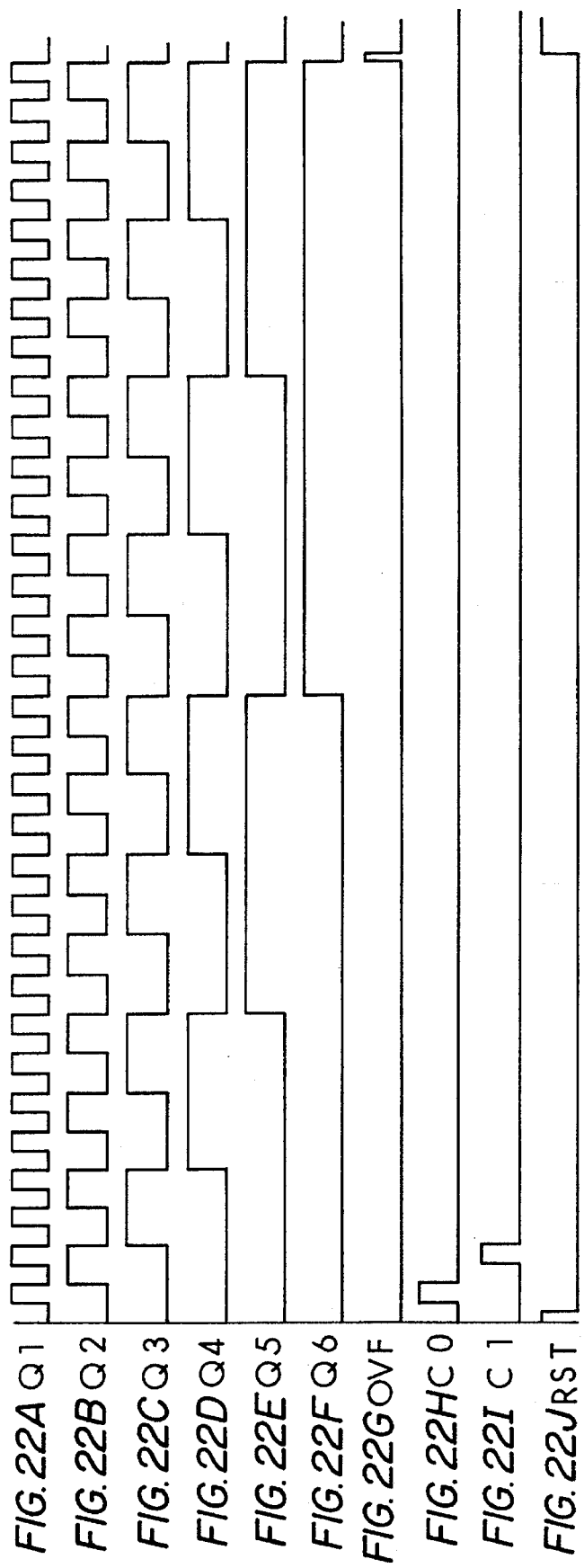
FIG. 22 is a timing diagram showing the operation of the counter in FIG. 21.

If, in the initial conditions, the control signal PA is low, the output of the inverter NOT13 is high and the reset signal RST is also high. If, after this, the reference signal PREF becomes high, the output of the latch circuit 64c goes high, the outputs of the latches 64e and 64f also become high in sequence due to the reference clock CCK and the reset signal RST goes low. On the other hand, as shown in FIG. 22, if the reset signal RST goes low, the overflow signal OVF outputted from the counter 62 will go high for a period of time. The outputs of the latches 64g and 64h will therefore go high sequentially due to the reference clock CCK and if the control signal PT is high, the output from the and gate AND11, i.e., the clock signal CK3, will go high. Also, if the overflow signal OVF goes high, the reset signal RST goes low and the overflow signal OVF will again go low due to the reference clock CCK. After this, the latches 64g and 64h will go low sequentially due to the reference clock CCK and the clock signal CK3 will also go low.

The clock signal CK3 is therefore outputted from the and gate AND11 while the reference signal PREF is being inputted until the falling edge of the control signal PT.

Then, after the control signal PA goes high and the pulse signal starts to go around the ring oscillator 42, the reference signal PREF is inputted and the output of the latch circuit 64c goes high. The output of the latch circuit 64d then goes high when the reference signal PREF is inputted. The output of the or gate OR11 then goes high in synchronization with the reference signal PREF and the frequency divided signal BOW. After this, the output of the or gate OR11 is outputted to the seven bit counter 62a of the counter 62 via the latch circuits 64e and 64f, the inverter NOT13 and the or gate OR12. The seven bit counter 62a therefore starts the count operation after the rising edges of the reference signal PREF and the frequency divided signal BOW and the clock signals C0 and C1 are sequentially outputted.

If the clock signal C0 is outputted from the counter 62, the output of the and gate AND12 goes high in synchronization and this signal is then outputted to the pulse phase difference coder circuit 44 as the clock signal CK0.

The clock signal C1 is outputted from the counter 62 after the clock signal C0 is outputted. This clock signal C1 is inputted into one of the terminals of each of the and gates AND13 and AND14 which take the outputs from the latches 64c and 64d as input. After the inputting of the reference signal PREF, the clock signal CK1, which is delayed with respect to the clock C0, is outputted from the and gate AND13 and a clock signal CK2, which is also delayed with respect to the clock signal C0, is outputted from the and gate AND14 after the frequency divided signal BOW is inputted. Then, as mentioned previously, the clock signal CK1 is outputted to the pulse phase difference coder circuit 44 and data control area 46 and the clock signal CK2 is outputted to the data controller 46.

The output from the inverter NOT16 is outputted to the divisor unit 48 as the operating clock CK30. However, in order to generate this operating clock CK30, the output from the latch circuit 64i which latches the reference voltage VH using the inverted form of the clock C1 outputted from the counter 62 and the clock signal Q1 outputted from the counter 62 are supplied to the nand gate NAND11 as input signals. The output from the nand gate NAND11 is then generated with the latch circuit 64j latching the reference clock CCK. This clock signal CK30 is outputted thirty times in synchronization with the clock signal Q1 after the outputting of the clock signals CK1 and CK2 while the seven bit counter 62a for the counter 62 is operating. The generation of the clock signal CK30 thirty times after the outputting of the clock signals CK1 or CK2 is necessary so that the divisor unit 48 can carry out one dividing operation.

Next, the structure of the second controller 66 will be described using FIG. 25.

Figure 25:
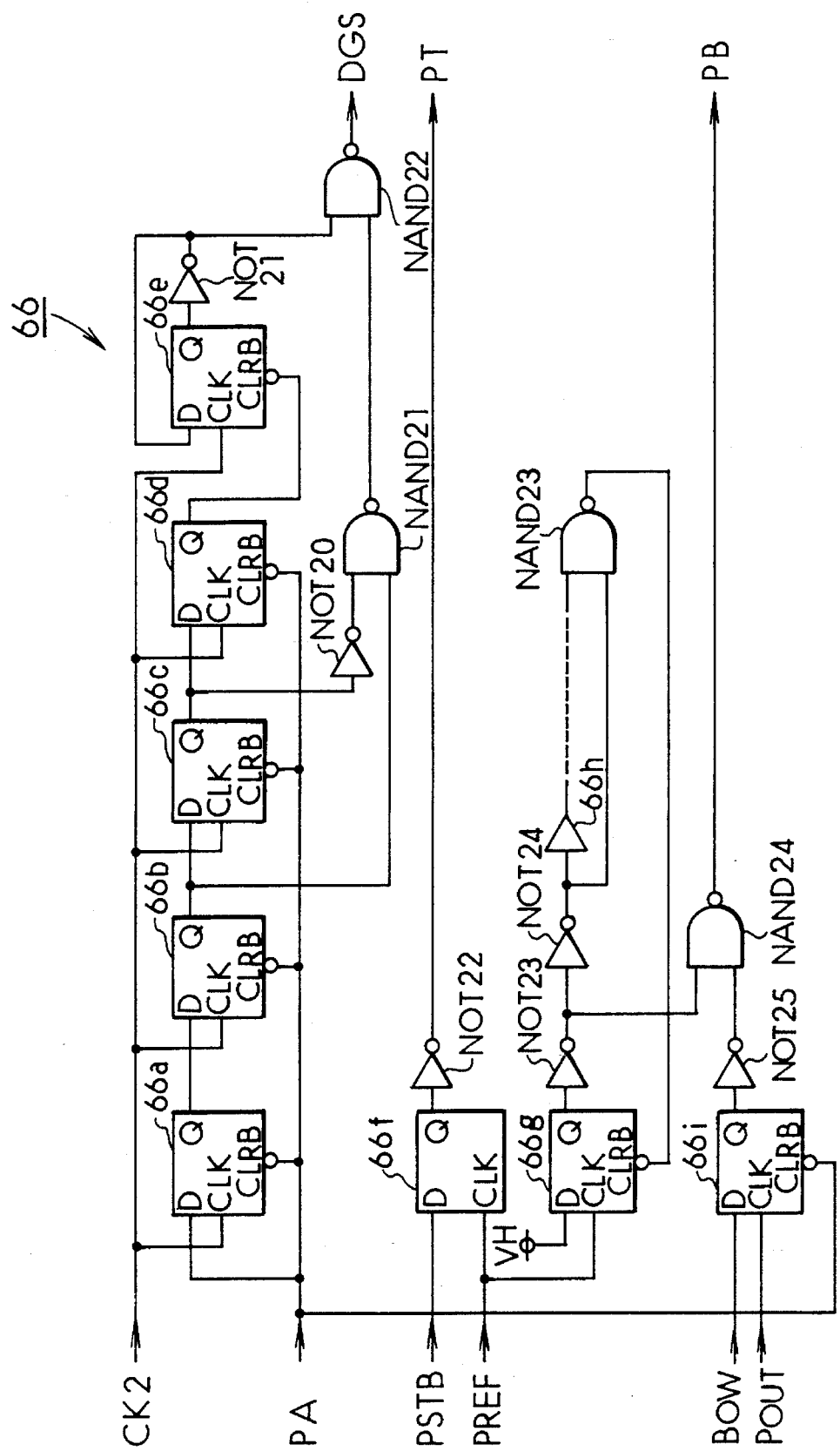
FIG. 25 is a circuit diagram showing the structure of the second controller which makes up the PLL operation controller circuit.

As can be seen in FIG. 25, the second controller 66 is equipped with five latches 66a to 66e which take the clock signal CK2 generated by the first controller 64 as input. The first of these five latches 66a takes the control data PA as latch data input. The second to the fourth of these latches 66b to 66d take the output from the preceding latches, i.e., the output from the latches 66a to 66c as latch data input. The final latch circuit 66e then takes its own output inverted by the inverter NOT21 as latch data input.

Each of these latch circuits 66a to 66e are also equipped with clear terminals CLRB. The control signal PA is inverted and then inputted to the clear terminals CLRB of the first four latches 66a to 66d. The output of the fourth latch circuit 66d is inverted and inputted to the clear terminal CLRB of the final latch circuit 66e.

Also, the output of the second latch circuit 66b of the latches 66a to 66e is connected to one of the input terminals of a nand gate NAND21 and the output of the third latch circuit 66c is connected to the other input terminal of the nand gate NAND21 via an inverter NOT20. The output of this nand gate NAND21 is then inputted to a nand gate NAND22 together with the output from the inverter NOT21 which inverts the output from the final latch circuit 66e.

At the second controller 66, the output from the nand gate NAND22 is outputted to the data control area 46 as the control signal DGS.

The second controller 66 is also equipped with a latch circuit 66f which latches the externally inputted operation start signal PSTB while using the reference signal PREF as an operating clock signal and an inverter NOT22 which inverts the output from the latch circuit 66f. The output from the inverter NOT22 is then outputted as the control signal PT.

In addition, the second controller 66 is equipped with a latch circuit 66g for latching a high level reference voltage while taking the reference signal PREF as a clock signal; an inverter NOT23 for inverting the output from the latch circuit 66g; an inverter NOT24 for inverting the output from the inverter NOT23; a delay line 66h for delaying the output from the inverter NOT24 by a prescribed period of time and a nand gate NAND22 which takes the output from the inverter NOT24 and the signal which is the output from the inverter NOT24 delayed by the delay line 66h as input. The output from the nand gate NAND22 is then inverted and taken as input at the clear terminal CLRB of the latch circuit 66g.

The second controller 66 is also equipped with a latch circuit 66i which latches the frequency divided signal BOW while taking the oscillating signal (i.e., the output signal POUT) from the DCO circuit 54 as an operating clock; an inverter NOT25 which inverts the output from the latch circuit 66i and a nand gate NAND 23 which takes the output from the inverter NOT25 and the output from the inverter NOT 23 which inverts the output from the latch circuit 66g as input. The output from the nand gate NAND23 is then outputted to the pulse phase difference coder circuit 44 as the internal clock PB. The latch circuit 66i is also equipped with a clear terminal CLRB, to which an inverted version of the control signal PA is inputted, in the same way as for the latches 66a to 66d.

The latches 66a to 66d are cleared if the control signal PA is low when the pulse signal has not started to go around the ring oscillator 42 and are also operable once the ring oscillator 42 has started to operate.

Figure 26:
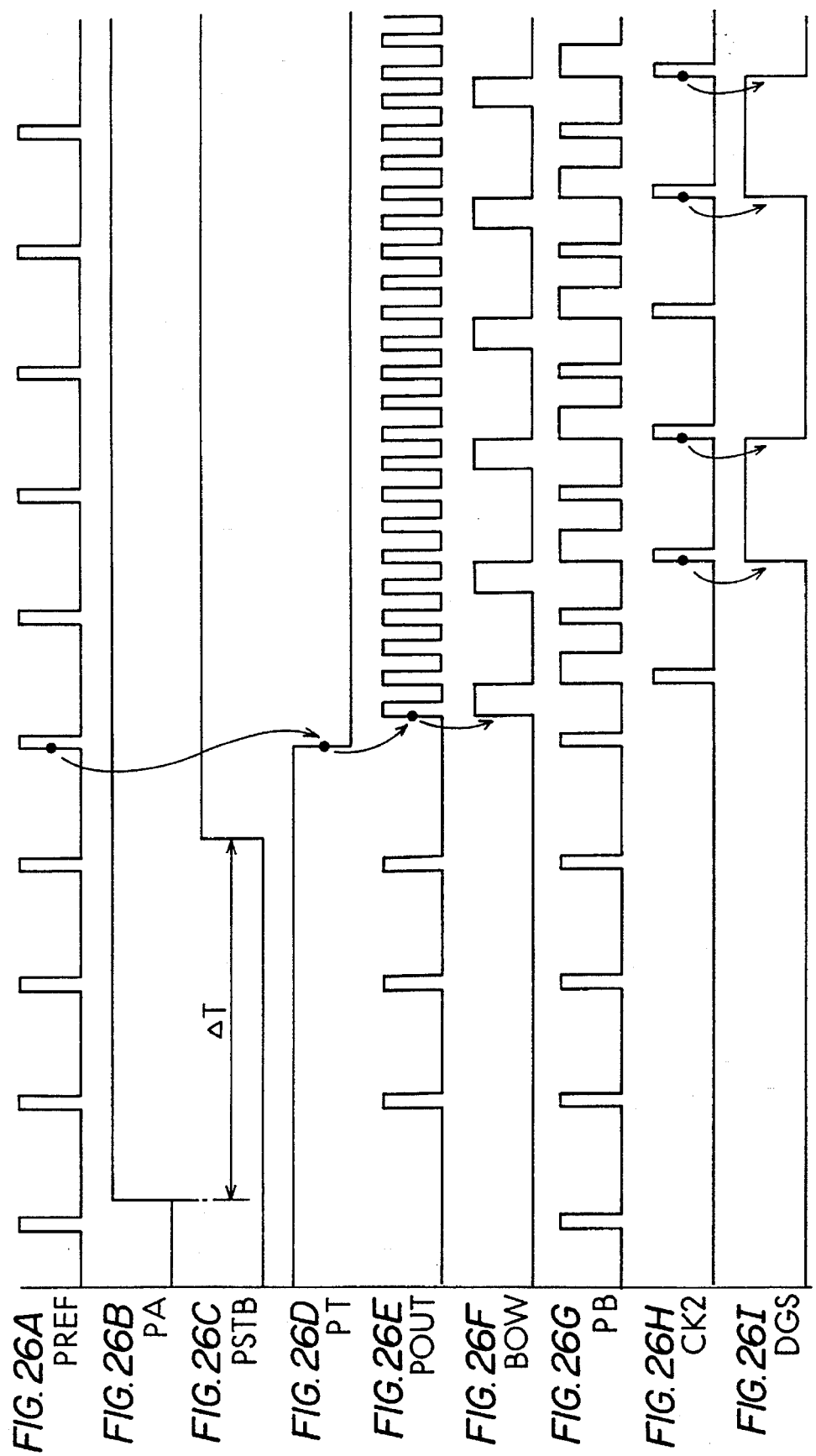
FIG. 26 is a timing diagram showing the operation of the second controller in FIG. 25.

As shown in FIG. 26, with the second controller 66 having this kind of construction, the operation start signal PSTB-(high level) is inputted after the control signal PA goes high and the pulse signal starts to go around the ring oscillator 42. The output of the latch circuit 66f then goes high when the reference signal PREF is inputted. The output signal from the inverter NOT22 which inverts this signal, i.e. the control signal PT then falls in synchronization with the initially inputted reference signal PREF after the operation start signal PSTB has been inputted.

Then, on the falling edge of the control signal PT, the data distributor circuit 50 and the DCO circuit 54 start to operate and the frequency divided signal BOW is outputted from the data distributor circuit 50. The clock signal CK2 the outputted from the first controller 64 after a delay of a prescribed period of time from the inputting of the frequency divided signal BOW. The operation of the latches 66a to 66e is therefore halted until the apparatus starts to generate the output signal POUT. The control signal DGS is then generated in the following way in synchronization with the clock CK2 after the apparatus starts to output the output signal POUT.

The output from the latch circuit 66a is low until the clock signal CK2 is inputted. The output for the nand gate NAND21 is therefore high and the control signal DGS outputted from the nand gate NAND22 is low. When the first clock pulse of the clock signal CLK2 is then inputted, the output of the first latch circuit 66a is changed to a high level. However, as the output from the second stage latch remains low, the control signal DGS also remains low. On the other hand, when the second clock pulse of the clock signal CK2 is inputted, the output of the second stage latch circuit 66b goes high. The output of the nand gate NAND21 therefore goes low because both of its inputs have gone high and the control signal DGS outputted from the nand gate NAND22 goes high. When three pulses of the clock signal CK2 are then inputted, the output of the third latch circuit 66c goes high. The output of the nand gate NAND21 therefore goes high and the control signal DGS goes low again. When the fourth pulse of the clock signal CK2 is then inputted, the output of the fourth latch circuit 66d goes high but this signal is inverted and inputted to the clear terminal CLRB of the latch circuit 66e. The control signal DGS is then kept low by the latch circuit 66e simply being latchable. When the fifth clock pulse of the clock signal CK2 is then inputted, the output of the latch circuit 66e goes high, the output of the inverter NOT21 goes low and the control signal DGS outputted from the nand gate NAND22 is inverted. After this, as the output from the latch circuit 66e is inverted which the clock signal CK2 is being inputted, the control signal DGS outputted from the nand gate NAND22 is also inverted in synchronization with the clock signal CK2.

The second controller 66 controls the level of the control signal DGS to go [L, H, L, L, H] in synchronization with the clock signal CK2 from when the PLL apparatus starts to operate until five pulses of the clock signal CK2 have been inputted. After this, the level of the control signal DGS follows the sequence [L, H, L, . . . ] in synchronization with the clock signal CK2.

Next, the internal clock to be outputted to the pulse phase difference coder circuit 44 is generated at the second controller 66. However, as this internal clock PB is the output from the nand gate NAND23 which takes the signal outputted from the latch circuit 66g which is inverted at the inverter NOT23 and the signal outputted from the latch circuit 66i which is inverted by the inverter NOT25 as its input, this internal clock PB becomes the or signal for the reference signal PREF and the frequency divided signal BOW.

The latch circuit 66g is a latch which latches the high level reference voltage VH while taking the reference signal PREF as an operating clock. The output of the latch circuit 66g therefore becomes high due to the inputting of the reference signal PREF. However, the latch circuit 66g inverts the output from the nand gate NAND23 which performs a nand operation on the signal outputted from the latch circuit 66g which passed through the inverters NOT23 and NOT24 and the version of this signal which is delayed by the delay line 66h and takes this as input at the clear terminal CLR of this latch circuit 66g. The output of the latch circuit 66g then changes to a low level after a prescribed period of time determined by the delay time of the delay line 66h after having gone high once due to the inputting of the reference signal PREF. On the other hand, the output of the latch circuit 66i becomes almost the same as the frequency divided signal BOW because this latch circuit 66i latches the frequency divided signal BOW while taking the output signal POUT as an operating clock. The internal clock will therefore be outputted from the nand gate 23 at a high level for a fixed period of time if a reference signal PREF is inputted and will be outputted at a high level for a period of time equal to the duration of the frequency divided signal BOW if the frequency divided signal BOW is inputted.

With the PLL apparatus in this embodiment having the structure described above, if the control signal PA is externally inputted, the pulse signal starts to go around the ring oscillator 42 and multi-phase clocks R1 to R16 are outputted from the pulse phase difference coder circuit 44 and the DCO circuit 54. If the reference signal PREF is then inputted, period data DE which corresponds to the period of the reference signal PREF is generated at the pulse phase difference coder circuit 44 in units equal to the phase difference Tg between each of the multi-phase clocks R1 to R16.

If the operation start signal PSTB is not being inputted, the control signal DGS outputted from the PLL operation controller circuit 56 to the data control area 46 is kept low.

The sum of the period data DE obtained for the past two times at the pulse phase difference coder circuit 44 is then outputted from the data control area 46 to the divisor unit 48 as control data corresponding to the duration of three pulses of the reference signal PREF3.

As a result of this, the control signal PA will go high, and if more than three pulses of the reference signal PREF are inputted, the upper bit data DQ and the lower bit data DP for generating the output signal POUT, which is the divided version of the reference signal PREF, will be generated at the divisor unit 48. The frequency control data CD which it is intended to input to the DCO circuit 54 is then generated by the data distributor circuit 50 and the data latch circuit 52.

Figure 27:
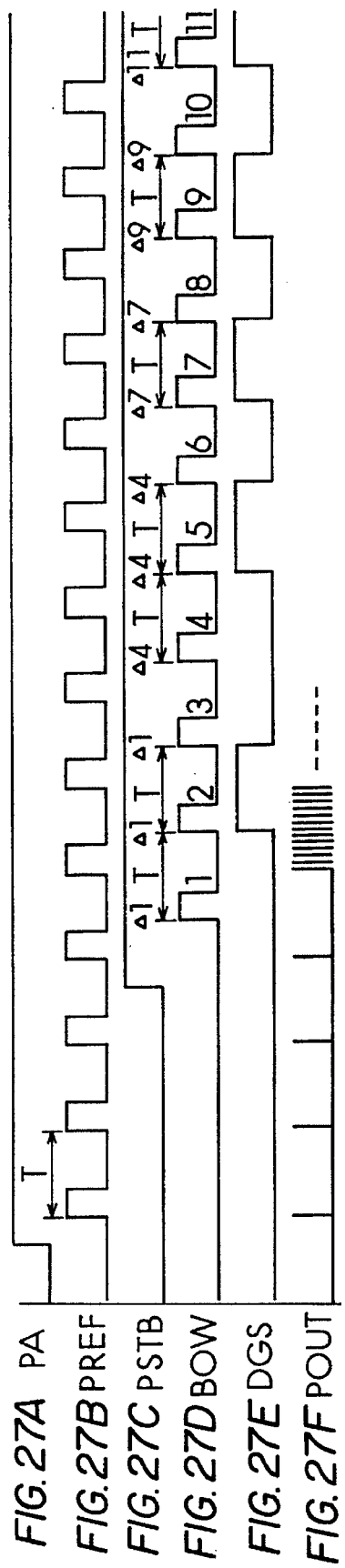
FIG. 27 is a timing diagram describing the essential parts of the control operation for the PLL apparatus in the third embodiment.

When this kind of apparatus is operating, it is preferable if the operation start signal PSTB goes high after three clock pulses of the reference signal PREF, as shown in FIG. 27.

On the other hand, when the operation start signal PSTB goes high, the control signal PT falls in synchronization with the next reference signal PREF and the DCO circuit 54 starts oscillating. However, before the control signal PT falls, the clock signal CK3 is outputted from the DCO circuit 54 as the output signal POUT. The upper bit data DQ obtained at the divisor unit 48 has therefore already been latched at the data latch circuit 52 when the DCO circuit 54 starts oscillating due to the output signal POUT. This data is then inputted as the frequency control data CD at the DCO circuit 54.

If the operation start signal PSTB goes high after three clock pulses of the reference signal PREF have been inputted, the output signal POUT, which is the reference signal PREF frequency divided by the divider expressed by the multiplier data DV, is outputted in synchronization with the next reference signal PREF.

If the control signal PT falls, the data distributor circuit 50 counts the output signal POUT. However, after the activation value, the frequency divided signal BOW is generated from when the value for this count signal becomes half the value for the divisor data DV which expresses the divider. After this, when the count value for the number of times the output signal POUT is outputted becomes equal to the value for the divisor data DV, the frequency signal BOW is still being generated. The phase difference between the reference signal PREF and the frequency divided signal BOW is then controlled to be half (i.e., π radians) of the period of the reference signal PREF.

If the frequency divided signal BOW is outputted from the data distributor circuit 50 in this way, the phase difference between the reference signal PREF and the frequency divided signal BOW is coded at the pulse phase difference coder circuit 44 and outputted as the period data DD.

If period data DD corresponding to the phase difference between the reference signal PREF and the frequency divided signal BOW is outputted from the pulse phase difference coder circuit 44 in this way, operations can be carried out at the data control area 46 to set up the control data DM for compensating for the phase difference between the reference signal PREF and the frequency divided signal BOW based on the period data DE which expresses the periods of the period data DD and the reference signal PREF. However, in order to compensate at the data control area 46 for the phase difference between the reference signal PREF and the frequency divided signal BOW, it is necessary to obtain the phase difference between the reference signal PREF and the frequency divided signal BOW two times. The control signal DGS for carrying out this operation outputted from the PLL operation controller circuit 56 is low until two pulses of the frequency divided signal BOW have been outputted from the data distributor circuit 50 and is high after two pulses of the frequency divided signal BOW have been outputted from the data distributor circuit 50.

In the PLL apparatus for this embodiment, after oscillation has started, two pulses of the frequency divided signal BOW are generated and control data DM for compensating for the phase difference between each of the signals from the data control area 46 is outputted at the data controller 46 after the phase difference between the reference signal PREF and the frequency divided signal BOW has been obtained for the past two times.

The control data DM is then divided at the divisor unit 48 in synchronization with the next rising edge of the reference signal PREF. This data is then set up at the DCO circuit 54 as the frequency data CD via the data distributor circuit 50 and the data latch circuit 52. Therefore, after the start of oscillation, the phase difference error between the reference signal PREF and the frequency divided signal BOW has an initial value of Δ1 until three pulses of the frequency divided signal BOW have been generated, as shown in FIG. 27. This phase difference error is then compensated for on the fourth pulse of the frequency divided signal BOW and a new phase difference error Δ4 occurs.

When three pulses of the frequency divided signal BOW are generated, the control signal DG is changed to a low level. The output from the data control area 46 is therefore also changed to control data which corresponds to the period of the reference signal PREF. After this, the control signal DGS is then changed back to a high level again when five pulses of the frequency divided signal BOW have been generated. The output from the data control area 46 is also changed over at this time to control data for compensating for the phase difference between the reference signal PREF and the frequency divided signal BOW. The phase difference error Δ4 occurring between the reference signal PREF and the fourth pulse of the frequency divided signal BOW is intermittent until the sixth pulse of the frequency divided signal BOW is inputted. This phase difference error is then compensated for on the seventh pulse of the frequency divided signal BOW.

After the control signal DGS has gone high on the fifth pulse of the frequency divided signal BOW, this control signal DGS sequentially changes state in synchronization with the frequency divided signal BOW (or in synchronization with the delayed version of the frequency divided signal BOW, the clock signal CK2). After this, the control data corresponding to the period of the reference signal PREF and the control data for compensating the phase difference error between the reference signal PREF and the frequency divided signal BOW are outputted alternately from the data controller 46. The phase difference error occurring between the reference signal PREF and the frequency divided signal BOW, is then compensated for as it recurs every one pulse in two of the frequency divided signal BOW.

In the PLL apparatus in this embodiment, multi-phase clock signals R1 to R16 are generated with a phase difference which is the equivalent to the period of time it takes two inverting circuits to perform inverting operations using the ring oscillator 42. The period of the reference signal PREF, reference signal PREF and the period of the output signal POUT are encoded at the pulse phase difference coder circuit 44 using the multi-phase clock signals R1 to R16. These multi-phase clock signals R1 to R16 are then used again at the DCO circuit 54 to generate the output signal POUT.

According to this embodiment, the time resolution of the output signal POUT can be made high and the frequency of the output signal POUT which it is possible to generate at the DCO circuit 54 is also high when compared with the case where an output signal POUT is generated using an oscillating signal from a liquid crystal oscillator, etc., as the oscillating signal. In particular, in this embodiment, frequency control data corresponding to two periods of the reference signal PREF is inputted to the DCO circuit 54. Then, when the value for the lower bit CD data is "1", an output signal generated using the multi-phase clock signals R1 to R16 is delayed by a time equivalent to half of the phase difference Tg between the multi-phase clock signals R1 to R16. An output signal POUT can then be generated at the DCO circuit 54 with a time resolution of half the phase difference between the multi-phase clock signals R1 to R16.

The ring oscillator 42 is shared by the DCO circuit 54 and the pulse phase difference coder circuit 44, so an operating clock generating oscillator is not necessary for each circuit. This both simplifies the structure of the apparatus and means that each circuit operates using the same clock signal. As the frequency control data CD inputted to the DCO circuit 54 and the output signal POUT outputted from the DCO circuit 54 therefore correspond to each other one to one, highly accurate control can be achieved.

In this embodiment, depending on the timing of the inputting of the operation start signal PREF to the PLL operation controller circuit 56, the period of the reference signal is coded at the pulse phase difference coder circuit 44 and the coded period data is preset to the DCO circuit 54. The oscillating operation of the DCO circuit 54 can then be started. An output signal POUT, which is the reference signal PREF multiplied by a prescribed number of times, can then be generated directly after the oscillating operation of the DCO circuit 54 starts.

Also, in this embodiment, the frequency divided signal BOW, which is the output signal POUT after having been frequency divided, is generated at the data distributor circuit 50 so as to have a phase difference of half (π radians) of the period of the reference signal PREF with respect to the reference signal PREF and the or signal for this frequency divided signal BOW and the reference signal BOW is then inputted to the pulse phase difference coder circuit 44. This means that the phase difference of each of these signals and the period of the reference signal PREF can be coded simultaneously at the pulse phase difference coder circuit 44. This means that it is no longer necessary to have a number of pulse phase difference coders in order to code these phase differences and periods and the structure of the apparatus can therefore be simplified accordingly.

Further, in the PLL apparatus in this embodiment, in the same way as for the first and second embodiments, the frequency control data CD which is inputted to the DCO circuit 54 is generated by the data distributor circuit 50 and the data latch circuit 52 by adding "1" to the value for the radix point (i.e. the upper bit data DQ) at a frequency corresponding to a value less than the radix point for the dividing value obtained at the divider unit 48. The output signal POUT can therefore be controlled to have an ideal characteristic even if the division results from the divider unit 48 include values less than the radix point.

Figure 28:
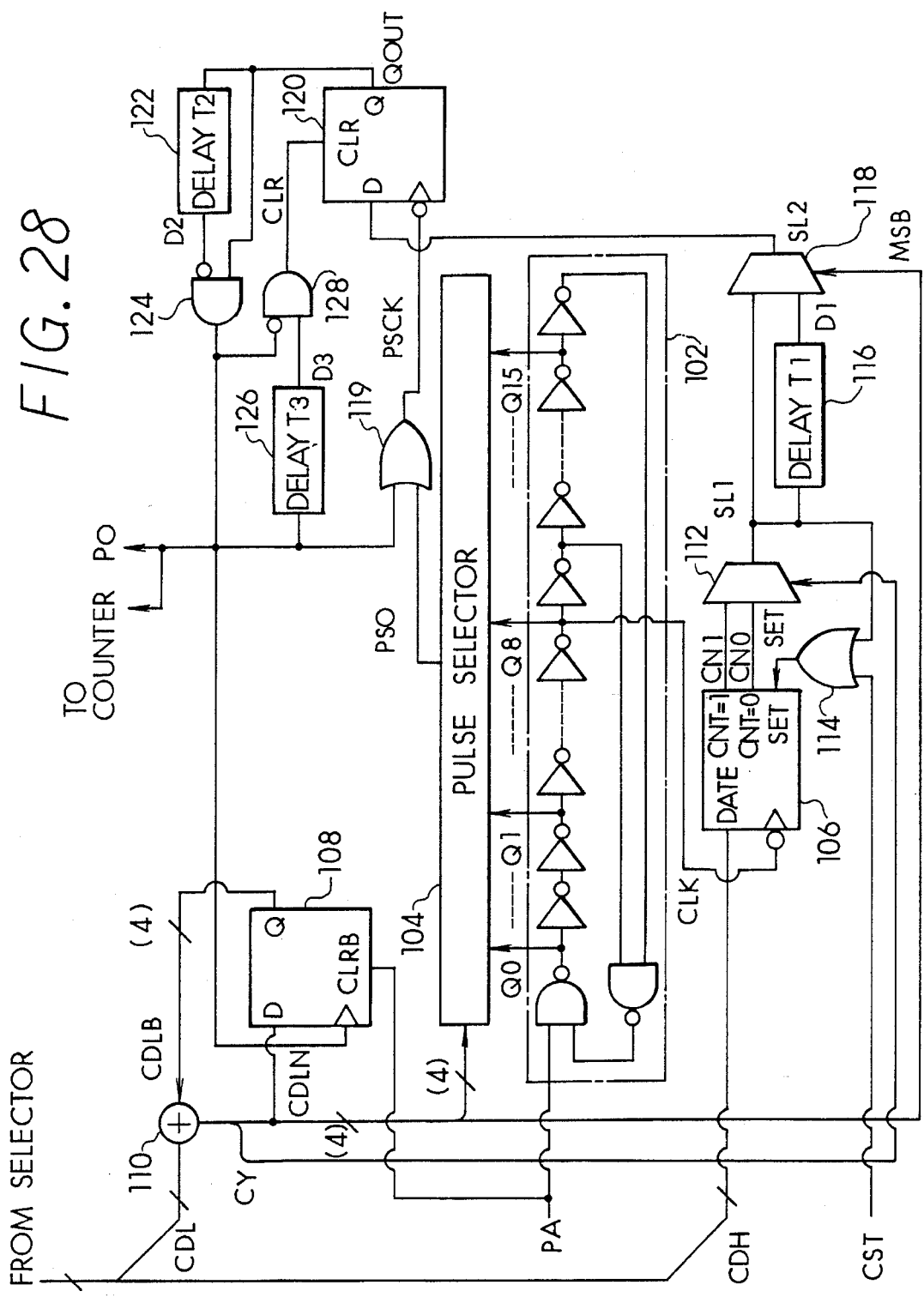
FIG. 28 is a circuit diagram of the digitally controlled oscillating circuit in the modified form.

FIG. 28 is a block diagram showing the construction of the DCO apparatus according to the modified embodiment of this invention.

As can be seen from this diagram, the DCO apparatus in this invention is constructed from: a ring oscillator 102, consisting of thirty-two inverters connected together in a ring around which a pulse signal revolves when an externally inputted control signal PA goes high; a pulse selector 104, taken as the pulse selecting means for taking the pulse signal from a prescribed inverting circuit within the ring oscillator 102 in accordance with the four bit control data CDLN and outputting this pulse signal as the output signal PSO; a downcounter 106 taken as the count means for presetting the upper 10-bits CDH of the 14-bit digital data (hereinafter referred to as the frequency control data) CDH (10-bit) and CDL (4-bit) for expressing the desired output period for the output signal POUT outputted from the aforementioned apparatus, carrying out a downcounting operation on the falling edge of the clock signal CLK outputted from the ring oscillator 102, and making the output signal CN1 high when the count value is 1 and the output signal CN0 high when the count value is zero; a register 108 taken as the storage means for performing a reset when the control signal PA is low, latching the 4-bit control data CDLN inputted to the pulse selector 104 at this time on the rising edge of the output signal POUT and outputting this latched data as the 4-bit data CDLB; an adder 110, taken as the position data updater, for adding the lower 4-bits CDL of the frequency control data CDH and CDL and the 4-bit data CDLB from the register 108, outputting a carry signal CY when this addition result exceeds [1111] and outputting this 4-bit data after addition to the pulse selector 104 as the control data CDLN; a selector 112, taken as the count number alteration means, for selecting the output signal CN1 for the downcounter 106 when the when the carry signal CY outputted from the adder 110 is low and selecting the output signal CN0 of the downcounter 106 when the carry signal CY is high, and then outputting the selected signal as the output signal SL1; an or gate 114 for performing an or operation on an externally inputted input signal CST and the output signal SL1 for the selector 112 and then outputting the resulting signal as the set signal SET, to be described later, for the downcounter 106; a delay line 116, for delaying the output signal SL1 for the selector 112 by the time T1 which it takes the pulse signal to go half way around the ring oscillator 102, and then outputting this signal as the delay signal D1; a selector 118, for selecting the output signal SL1 for the selector 112 when the MSB (most significant bit) of the control data CDLN outputted from the adder 110 is zero and selecting the delay signal D1 from the delay line 116 when the MSB of the control data CDLN is "1" and then outputting this as the output signal SL2; an OR gate 119 for performing an OR operation on the output signal PSO for the pulse selector 104 and the output signal POUT for the aforementioned apparatus; a D-type flip-flop (hereinafter referred to as a DFF) 120 with a clear terminal which takes the output signal SL2 for the selector 118 as input data and takes the output signal PSCK for the or gate 119 as an input clock, latches data on the rising edge of the output signal PSCK for the or gate 119 and outputs this as the latch signal QOUT; a delay line 122 for delaying the latch signal QOUT from the DFF20 by a prescribed time T2 and outputting this as the delay signal D2; art AND gate 123, for performing art AND operation on a signal which is the inversion of the signal level for the delay signal D2 and the latch signal QOUT from DFF20 and outputs the resulting signal as the output signal POUT; a delay line 126 for delaying the output signal POUT from the AND gate 124 by a prescribed time T3 and outputting this as the delay signal D3 and an AND gate 128 for performing an AND operation on the signal which is the inversion of the signal level for the output signal POUT from the AND gate 124 and the delay signal D3 and outputs the resulting signal as the clear signal CLR for DFF20. Also, the OR gate 119 is set up so that a clock signal is not inputted to DFF20 while the output signal for the aforementioned apparatus is high. Further, DFF20, the delay lines 122 and 128 and the AND gates 124 and 128 correspond to the output means for the digitally controlled oscillating apparatus in this embodiment.

The operation of the above modified embodiment of FIG. 28 is described in full detail in the copending U.S. application Ser. No. 08/318,556 of YAMAUCHI et al, filed Oct. 5, 1994 and assigned to the same assignee as the present application.

With the digitally controlled oscillating apparatus having the kind of structure disclosed in FIG. 28, no initial conditions are stored in the storage means as data. Therefore, initially, digital data expressing the connection position for an inverting circuit taking the inversion circuit for activation as a reference point within the pulse dividing circuit is inputted externally. Once this data has been inputted, this digital data is outputted without modification by the position data updater to the pulse selector as input data expressing the connection position within the pulse dividing circuit of an inverting circuit taking the inversion circuit for activation as a reference point.

When the control signal is inputted externally, the inverting circuit for activation for the pulse dividing circuit starts to invert the input signal, the outputs of each of the inverting circuits which make up the pulse rotating or circulating circuit sequentially invert and the pulse signal rotates around the pulse rotating circuit.

In doing so, the pulse selector alternately selects inverting circuits from which the pulse signal is taken from the pulse rotating circuit in accordance with the input data from the position data updater. The counter the counts pulse signals outputted from prescribed inverting circuits within the pulse rotating circuit and detects an indication to the effect that this value has reached the value for digital data expressing the number of times an externally inputted pulse signal has gone around the pulse rotating circuit.

After the counter detects the indication that the count value has reached the value for the digital data expressing the number of rotations, a pulse signal is outputted from the pulse selector and the outputter outputs a prescribed output signal.

Namely, with the digitally controlled oscillating apparatus as illustrated in FIG. 28, the time from the inputting of the control signal to the inversion circuit for activation in the pulse rotating circuit until the output signal is outputted from the outputter becomes the initial one period. This time is the time (y.Td.M+z.Td) obtained by adding the fixed time (y.Td.M) decided by the total number of inverting circuit stages y which make up the pulse rotating circuit, the inverting operation time Td for each inverting circuit and the number of revolutions M for the pulse signal counted by the counter and the fixed time (z.Td) decided by the number of inverting circuits z linked from the inverting circuit for activation in the pulse rotating circuit to the inverting circuit from which the pulse signal is taken and the inverting operation time Td for each of the inverting circuits.

Once the first period is outputted by this kind of outputter, the storage unit stores the input data inputted to the selector at this time. The position data updater then adds the pulse selector input data stored in the storage unit and the externally inputted digital data expressing the connection position of the inverting circuit taking the inverting circuit for activation as a reference point within the pulse rotating circuit. The digital data which results from this addition is then outputted to the pulse selector as input data.

Then, from the next time onwards (the second period), the pulse selector operates in such a manner that the 2.z, 3.z, . . . connected inverting circuits taking the inverting circuit for activation as a reference point, i.e., the z-th connected inverting circuit taking the inverting circuit from which the pulse signal was taken from the previous time is sequentially selected as the inverting circuit from which the inverting signal is to be taken from this time. An output signal is therefore outputted from the outputter after every fixed period of time (y.Td.M+z. Td) which is the same period of time as for the first period.

When the connection position of the inverting circuit expressed by the digital data added by the position data updater then exceeds the position for the inverting circuit connected directly before the inverting circuit for activation, the count number modifier increases the count number for the pulse signal it is intended to count until the aforementioned detection operation is carried out by the counter by one so that the time until the next output signal is outputted becomes shorter than the time (y.Td) for the pulse signal to go once around the pulse rotating circuit.

In the digitally controlled oscillating apparatus of FIG. 28, externally inputted digital data expressing the connection position of an inverting circuit taking the inverting circuit for activation as a reference point within the pulse rotating circuit is accumulated sequentially every time the output signal is outputted by the outputter, i.e., every one period. This accumulated data is then used as the input data for the pulse selector. The count number which counts the number of revolutions of the pulse signal is then increased by one when the position of the inverting circuit selected by the pulse selector exceeds that of the inverting circuit connected directly before the inverting circuit for activation so that there is a carry. As a result of this, the connection positions for the inverting circuits for taking the pulse signal from the pulse rotating circuit are therefore accumulated and updated. Output signals are therefore outputted at completely the same period so that halting of the pulse rotating circuit is prevented.

Therefore, according to the digitally controlled oscillating apparatus of FIG. 28, the connection position of the inverting circuit from which the pulse signal is outputted and the number of revolutions of the pulse signal counted by the counter can be adjusted. This means that the output period of the output signal, i.e., the oscillating period of the aforementioned apparatus, can be adjusted to an arbitrary value.

If the connection position of the inverting circuit from which the pulse signal is then fixed, the oscillating period will be decided by the number of times the pulse signal goes around the pulse rotating circuit. If the number of revolutions is therefore made high, the output frequency of the output signal will be lowered. Alternatively, if the number of rotations is made small, the output frequency of the output signal will be made high in accordance with the rotation period of the pulse signal within the pulse rotation circuit. The output frequency of the output signal is therefore approximately decided by the number of rotations of the pulse signal. This can then be finely adjusted by adjusting the inverting circuit connection position from which the pulse signal is taken from the pulse rotating circuit. Digital control of a high resolution with pulse signal output frequencies from a few Hz up to a few MHz is therefore possible.

In particular, according to the digitally controlled oscillating apparatus of FIG. 28, oscillation can be achieved without the kind of halting of the pulse rotating circuit that was present in apparatus according to the prior art. The oscillating period can therefore be set up in proportion to the digital data value, which provides an extremely high degree of control. Also, as it is no longer necessary to temporarily pause the pulse rotating circuit, the oscillating period can be set up to be shorter.

The present invention has been described with reference to the presently preferred exemplary embodiments. However, it should not be construed to be limited to the disclosed embodiments but may be modified in many ways without departing from the spirit of the invention.

What is claimed is:

1. A pulse generating apparatus taking binary digital data consisting of a data signal having a predetermined number of bits (N) including a least significant bit (LSB) and a most significant bit (MSB) as input and outputting a pulse signal at a frequency which can be varied in response to the binary digital data, said apparatus comprising:

a selector row constructed from N selectors with each selector in the selector row being equipped with a select signal input terminal which takes a select signal as input and two data signal input terminals which take two data signals as input, with one of the two data signals inputted via the two data signal input terminals being selected to be outputted as a select output signal in accordance with the select signal inputted at the select signal input terminal, with the data signal for each bit of the binary digital data being inputted to one data signal input terminal of a respective selector, with the data signal for the value "0" being inputted at the other data signal input terminal of the selector which receives the data signal for the least significant bit of the binary digital data and with the other data signal input terminal of any particular one of selectors exclusive of the selector which receives the data signal for the lowest significant bit of data taking as input the selector output signal from the selector which receives the data signal for a bit which is one bit lower in order than the data signal received by the particular selector; and a select signal generator connected to the select signal input terminal for each selector, for generating select signals for said selectors, with the select signal for each selector being periodically outputted from the select signal in such a manner that the period for selecting a data signal for a corresponding bit is shorter for selectors which receive higher order data signals, wherein the selector output signal outputted from the selector which receives the data signal for the most significant bit of the binary digital data is taken as the pulse signal and outputted.

2. A pulse generating apparatus according to claim 1, wherein the select signal generator comprises:

a counter which takes as input and counts the pulses of an external clock signal and outputs a count value as an N-bit digital value having a most significant bit and a least significant bit, wherein the counter provides the most significant bit, down to the least significant bit, of the data occurring in the count value to the select signal input terminals of the selectors, in the order of the select signal input terminal of the selector which receives the data signal for the most significant bit, to the select signal input terminal for the selector which receives the data signal for the least significant bit.

3. A frequency variable oscillator apparatus taking binary digital data consisting of upper data, consisting of a predetermined number of bits (M), as integer data, and lower data, consisting of a predetermined number of bits (N), as data after the radix point as input and outputting an oscillating signal made from a pulse row at a frequency corresponding to the binary digital data, said apparatus comprising:

a selector row constructed from N selectors with each selector in the selector row being equipped with a select signal input terminal which takes a select signal as input and two data signal input terminals which take two data signals as input, with one of the two data signals inputted via the two data signal input terminals being selected to be outputted as a select output signal in accordance with the select signal inputted at the select signal input terminal, with the data signal for each bit of the lower N-bits of the binary digital data being inputted to one data signal input terminal of the respective selectors, with the data signal for the value "0" being inputted at the other data signal input terminal of the selector which receives the data signal for the least significant bit of the binary digital data and with the other data signal input terminal of any particular one of selectors exclusive of the selector which receives the data signal for the lowest significant bit of data taking as input the selector output signal from the selector which receives the data signal for a bit which is one bit lower in order than the data signal received by the particular selector;

a counter, connected to each of the select signal input terminals for the selectors, for taking as input and counting the pulses of an external clock signal and outputting a count value as an N-bit digital value having a most significant bit and a least significant bit, with the counter providing the most significant bit, down to the least significant bit, of the data occurring in the count value to the select signal input terminals of the selectors in the order of the select signal input terminal of the selector which receives the data signal for the most significant bit, to the select signal input terminal for the selector which receives the data signal for the least significant bit, and with the select signal for each selector being periodically outputted in such a manner that the period for selecting a data signal for a corresponding bit is shorter for selectors which receive higher order data signals;

a constant adder taking the upper M-bits of the binary digital data as input, adding 1 to the value expressing the upper M-bits and outputting the added upper M-bit data;

a data selector taking as input the selector output signal from the selector output signals for the selectors in the selector row outputted from the row selector receiving the data signal for the most significant bit of the lower N-bits and selecting and outputting as selected data one of either the upper M-bit data inputted to the constant adder or the added upper M-bit data outputted from the constant adder in response to the inputted row selector output signal; and an oscillator for receiving the selected data outputted from the data selector, generating an oscillating signal (PO) at a period corresponding to the selected data and inputting part of the oscillating signal (PO) as the clock signal inputted to the counter.

4. A pulse generating apparatus according to claim 3, wherein said oscillator apparatus comprises:

a pulse rotator constructed from a plurality of inverters, which invert and then output input signals, linked together to form a ring shape, with one of the inverters being taken as an inverter for activation for controlling the inversion operation of the input signal using an external activation control signal PA so that when the activation control signal PA is inputted to the inverter for activation the pulse signal composed from the output signals for the inverter circuits goes around the inverter circuits linked together in a ring shape; and a controller for controlling the pulse rotator, said controller including:

pulse selecting means taking first link position input data CDLN expressing the specific link position of an inverter within the pulse rotator taking the inverter for activation as a base point as input and taking and outputting as an output pulse signal the output signal for inverters alternately selected within the pulse rotator in accordance with the first link position input data CDLN;

counting means for counting output signals outputted from an inverter existing at a preset link position within the pulse rotator and detecting when the count value reaches the value for the digital data CDH expressing the number of rotations of the pulse signal from within second binary digital data outputted from the data selector;

outputting means for outputting a second pulse signal, when the pulse selecting means takes and outputs the output pulse signal corresponding to the first link position input data CDLN after the counting means detects that the count value has reached the value for the digital data CDH which expresses the number of revolutions of the pulse signal;

storage means for storing the link position input data CDLN inputted to the pulse selecting means as second link position input data CDLN according to the outputs of said outputting means;

position data updating means for adding the second link position input data CDLN stored in the storage means, and the link position input data CDL expressing the specific link position of an inverter within the pulse rotator taking the inverter for activation as a base point from within the oscillation period control data CDH and CDL inputted afresh, and outputting the digital data obtained after adding as the first link position input data CDLN to be inputted to the pulse selector means; and count number modification means for adding one to the count value for the counting means until the counting means detects that the count value has reached the value for the digital data CDH which expresses the number of revolutions of the pulse signal in the case where the link position for the specific inverter described by the first link position input data CDLN after adding outputted from the position data updating means exceeds the link position for the inverter linked directly before the inverter for activation.

5. A frequency variable oscillator apparatus according to claim 3 taken as a digitally controlled oscillator, wherein the division result resulting from the divisor means has data expressing the value for before the radix point and data expressing the value for after the radix point, the data expressing the value before the radix point being inputted to the constant adder and the data selector and the data expressing the value after the radix point being inputted to each of the selectors in the selector row within the pulse generating apparatus.

6. A PLL apparatus according to claim 5, wherein the data control means generates the frequency control data in such a manner that the phase difference between the reference signal and the output signal is always half a period of the reference signal.

7. A phase locked loop (PLL) apparatus, multiplying an inputted input pulse and outputting the multiplied input pulse as an output pulse in synchronization with the input pulse, said apparatus comprising:

a selector row constructed from a predetermined number of selectors (N) with each selector in the selector row being equipped with a select signal input terminal which takes a select signal as input and two data signal input terminals which take two data signals as input from binary digital data having a plurality of bits including N least significant bits and M most significant bits, with one of the two data signals inputted via the two data signal input terminals being selected to be outputted as a select output signal in accordance with the select signal inputted at the select signal input terminal, with the data signal for each bit of the lower N-bits of the binary digital data being inputted to one data signal input terminal of a respective selector, with the data signal for the value "0" being inputted at the other data signal input terminal of the selector which receives the data signal for the least significant bit of the binary digital data and with the other data signal input terminal of any particular one of selectors exclusive of the selector which receives the data signal for the lowest significant bit of data taking as input the selector output signal from the selector which receives the data signal for a bit which is one bit lower in order than the data signal received by the particular selector;

a counter, connected to each of the select signal input terminals for the selectors, for taking as input and counting the pulses of an external clock signal and outputting a count value as an N-bit digital value having a most significant bit and a least significant bit, with the counter providing the most significant bit, down to the least significant bit, of the data occurring in the count value to the select signal input terminals of the selectors in the order of the select signal input terminal of the selector which receives the data signal for the most significant bit, to the select signal input terminal for the selector which receives the data signal for the least significant bit, and with the select signal for each selector being periodically outputted in such a manner that the period for selecting a data signal for a corresponding bit is shorter for selectors which receive higher order data signals;

a constant adder taking the upper M-bits of the binary digital data as input, adding 1 to the value expressing the upper M-bits and outputting the added upper M-bit data;

a data selector taking as input the selector output signal from the selector output signals for the selectors in the selector row outputted from the row selector receiving the data signal for the most significant bit of the lower N-bits and selecting and outputting as selected data one of either the upper M-bit data inputted to the constant adder or the added upper M-bit data outputted from the constant adder in response to the inputted row selector output signal;

an oscillator for receiving the selected data outputted from the data selector, generating an oscillating signal (PO) at a period corresponding to the selected data and outputting part of the oscillating signal (PO) as the clock signal to be inputted to the counter;

a phase comparator for detecting the phase difference between a frequency divided signal being the oscillator signal outputted from the oscillator multiplied by 1/n and an externally inputted reference signal, n being a predetermined number;

a control data generator for generating said binary digital data consisting of said M-bit data and N-bit data for making the phase difference detected by the phase comparator zero, and outputting the binary digital data as the N-bit data to be inputted to the selector row and the M-bit data inputted to the constant adder and the data selector circuit; and a downcounter for generating a borrow signal when the count value for the counter in the select signal generator becomes zero and capable of presetting data expressing the divider n using the borrow signal and an externally inputted preset signal, wherein the borrow signal outputted from the downcounter is outputted to the phase comparator as said frequency divided signal.

8. A phase locked loop (PLL) apparatus generating an output signal in phase synchronization with an externally inputted reference signal, said apparatus comprising:

a multi-phase clock generating source for generating a plurality of clock signals having a prescribed phase difference as a time reference;

a pulse phase-difference coder for coding the period of the reference signal and the phase difference between the reference signal and the output signal in time units corresponding to the phase difference between the multi-phase clocks outputted from the multi-phase clock generator source;

data control means for generating frequency control data for phase synchronizing the reference signal and the output signal based on the reference signal period data coded at the pulse phase-difference coder and the phase difference data for the reference signal and the output signal;

a digitally controlled oscillator for generating an oscillating signal corresponding to the frequency control data outputted from the data control means in time units corresponding to the phase difference between the multi-phase clocks outputted from the multi-phase clock generator source and outputting the oscillating signal externally as the output signal; and activation time control means for initially operating the pulse phase difference coder, presetting the reference signal period data obtained at the pulse phase encoder to the digitally controlled oscillator and then starting the generation of the digitally controlled oscillator oscillating signal at a timing prescribed by the reference signal at the time of activation of the apparatus.

9. A PLL apparatus according to claim 8, further comprising:

divider means for dividing frequency control data outputted from the data control means by externally inputted divisor data and inputting the result to the digitally controlled oscillator, wherein the output signal is frequency divided by the divisor data and then inputted to the pulse phase difference coder.

10. A PLL apparatus according to claim 8, wherein the multi-phase clock generating source comprisies:

a delayer constructed from a plurality of linked delay elements with an input signal being delayed only by a delay period decided by the number of linked delay elements being outputted from prescribed connection points for the delay elements as the clock signal;

the pulse phase difference coder being equipped with:

digital data generating means for detecting the delay signal most recently outputted from the delay circuit while the reference signal and/or output signal is being inputted and generating digital data expressing the link position within the delay circuit for the delay element outputting the delay signal; and arithmetic means for calculating the deviation between the most recent digital data and the previous digital data generated by the digital data generating means and outputting the calculation result as digital data expressing the period of the reference signal and/or the phase difference between the reference signal and the output signal, and the digitally controlled oscillator being equipped with:

signal selection means for selecting a delay signal outputted from the delay element for the link position corresponding to the input data, from the delay signals outputted sequentially from the delayer;

pulse signal outputting means for outputting a pulse signal as the oscillating signal when the delay signal has been selected by the selection means; and input data updating means for updating input data outputted to the signal selection means by adding the frequency control data to the input data while the signal selection means is selecting a delay signal after prescribed input data has been outputted to the signal selection means when frequency control data has been inputted from the data control means.

11. A PLL apparatus according to claim 10, the delayers constructing the multi-phase clock generating source having a plurality of inverters linked together to form a ring shape in such a manner so as to comprise a pulse rotator with the pulse signal being sequentially inverted at each inverter, the pulse phase difference coder being further equipped with first counting means for counting the number of times the pulse signal rotates within the pulse rotator circuit and outputting the count value to the arithmetic means as the upper bit data of the digital data generated at the digital data generating means, the digitally controlled oscillator being further equipped with: second count means for counting the number of times the pulse signal rotates around the pulse rotator and outputting a detection signal expressing when the count value reaches the value for the upper bit data of the input data; and count control means for initializing the count value for the second count means and re-starting the count operation when a detection signal is outputted from the second count means, wherein, at the digitally controlled oscillator, the input data updating means updates the input data outputted to the signal selection means based on lower bit data and exclusive of the upper bit data of the frequency control data, and the pulse signal output means outputs a pulse signal when a detection signal is outputted from the second count means and when a delay signal is selected by the signal selection means.

* * * * *